(12) United States Patent
Yang et al.

(10) Patent No.: US 10,885,994 B2
(45) Date of Patent: Jan. 5, 2021

(54) INTERLEAVED PROGRAM AND VERIFY IN NON-VOLATILE MEMORY

(71) Applicant: SanDisk Technologies LLC, Addison, TX (US)

(72) Inventors: Xiang Yang, Santa Clara, CA (US); Huai-Yuan Tseng, San Ramon, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/828,477

(22) Filed: Mar. 24, 2020

(65) Prior Publication Data
US 2020/0227124 A1 Jul. 16, 2020

Related U.S. Application Data

(62) Division of application No. 16/014,850, filed on Jun. 21, 2018, now Pat. No. 10,643,721.

(51) Int. Cl.
*G11C 16/34* (2006.01)
*G11C 16/10* (2006.01)
(Continued)

(52) U.S. Cl.
CPC .......... *G11C 16/3459* (2013.01); *G11C 16/10* (2013.01); *G11C 11/5628* (2013.01);
(Continued)

(58) Field of Classification Search
CPC .... G11C 16/10; G11C 16/0483; G11C 7/1042
See application file for complete search history.

(56) References Cited

U.S. PATENT DOCUMENTS 8,130,552 B2 3/2012 Miwa et al.
8,472,280 B2 6/2013 Li
(Continued)

OTHER PUBLICATIONS

Restriction Requirement dated Aug. 9, 2019, U.S. Appl. No. 16/014,850, filed Jun. 21, 2018.
(Continued)

*Primary Examiner* — Han Yang
(74) *Attorney, Agent, or Firm* — Vierra Magen Marcus LLP

(57) ABSTRACT

A circuit includes a program controller configured to perform a program operation with interleaved program-verify loops to program memory cells in a same block. During each program-verify loop, a control gate line voltage supply circuit first supplies a program pulse to a first cell of the block and then, before verifying the first cell, supplies a program pulse to a second cell of the block. After the program pulses are sent, the control gate line supply circuit consecutively supplies verify pulses to the first cell and the second cell such that a delay is introduced between the respective program and verify stages of the first and second cells. Additionally, a constant voltage bias on common control gate lines of the first and second memory cells is applied during the consecutive verify stages. Further, an order of verify pulses may be applied in a reverse order during a verify stage.

13 Claims, 25 Drawing Sheets

(51) Int. Cl.
*G11C 16/04* (2006.01)
*H01L 27/1157* (2017.01)
*G11C 11/56* (2006.01)
*H01L 27/11524* (2017.01)

(52) U.S. Cl.
CPC ...... *G11C 11/5671* (2013.01); *G11C 16/0483* (2013.01); *H01L 27/1157* (2013.01); *H01L 27/11524* (2013.01)

(56) References Cited

U.S. PATENT DOCUMENTS

| | | | |
|---|---|---|---|
| 9,019,745 | B1 | 4/2015 | Cheng et al. |
| 9,208,876 | B1 | 12/2015 | Cheng et al. |
| 9,721,672 | B1 | 8/2017 | Dutta et al. |
| 2012/0250418 | A1* | 10/2012 | Dutta ................. G11C 16/3454 365/185.19 |
| 2016/0372205 | A1 | 12/2016 | Amarnath et al. |
| 2017/0178736 | A1 | 6/2017 | Yang et al. |
| 2017/0309344 | A1 | 10/2017 | Dutta et al. |
| 2018/0068739 | A1 | 3/2018 | Shiino et al. |
| 2018/0090220 | A1 | 3/2018 | Minagawa et al. |
| 2019/0348122 | A1* | 11/2019 | Ko .................... G11C 16/0483 |
| 2019/0392909 | A1 | 12/2019 | Yang et al. |

OTHER PUBLICATIONS

Response to Restriction Requirement dated Oct. 7, 2019, U.S. Appl. No. 16/014,850, filed Jun. 21, 2018.
Non-final Office Action dated Nov. 13, 2019, U.S. Appl. No. 16/014,850, filed Jun. 21, 2018.
Response to Non-final Office Action dated Feb. 10, 2020, U.S. Appl. No. 16/014,850, filed Jun. 21, 2018.
Notice of Allowance dated Feb. 27, 2020, U.S. Appl. No. 16/014,850, filed Jun. 21, 2018.

* cited by examiner

Program Operation with Program-Only Loops

Program Operation with Program-Verify Loops

INTERLEAVED PROGRAM AND VERIFY IN NON-VOLATILE MEMORY

CLAIM OF PRIORITY

This application is a divisional application of U.S. patent application Ser. No. 16/014,850, entitled "INTERLEAVED PROGRAM AND VERIFY IN NON-VOLATILE MEMORY," filed Jun. 21, 2018, which issued as U.S. Pat. No. 10,643,721 on May 5, 2020, and which is incorporated herein by reference in its entirety.

BACKGROUND

Non-volatile memory systems typically store data in memory cells by way of dividing up an available voltage range in a given memory cell into different states that are associated with a particular value. A basic example of dividing the available threshold voltage range of a memory cell is seen with a single level cell (SLC) memory cell designed to store 1 bit of information. The 1 bit of information may be represented as a "0" or a "1" by essentially dividing the cell voltage range in half, with one half of the range representing the "0" state and the other half of the range representing the "1" state. Memory cells may be configured to hold more than one bit of data by more finely dividing the voltage range of the cell into the number of states necessary to store the desired number of bits. These memory cells are often referred to as multi-level cells (MLC). For example, a memory cell designed to hold 3 bits of data would need its voltage range divided into 8 states to represent the 3 bits.

A non-volatile memory cell is typically programmed by injecting small amounts of charge into the cell until the voltage level representative of the information to be stored in that cell is reached. One process used in programming cells is referred to as program-verify loop where, after one or more programming pulses are applied to increase a voltage level in the cell, a verify stage to check on the progress of the programming in the cell is executed. A physical characteristic of some non-volatile memory cells is that the manner in which program-verify loops are executed can affect data retention capabilities of the memory cell.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Figure 1A:
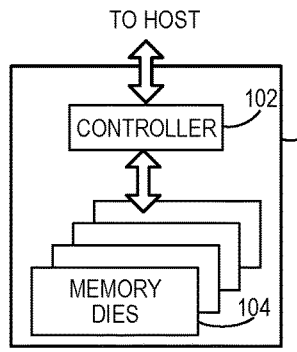
FIG. 1A is a block diagram of an example memory system.

The following embodiments describe apparatuses, devices, systems, circuits, and methods for interleaved programming memory cells in a non-volatile memory. The disclosed embodiments may include introducing a delay between program and verify stages of a program-verify loop of individual memory cells, or sets of memory cells, but using an interleaved programming technique that incorporates interleaving of program and verify stages for programming different sets of multiple memory cells to avoid adding overall delay in program operations. Other aspects of the interleaved programming in interleaved fashion is the ability to combine verify biasing on certain control gates of a memory. Rather than needing to individually ramp up and ramp down a control gate bias for each verify stage, as would be the typical case for verify stages that are part of separate, non-interleaved program-verify loops, the interleaved program-verify loops disclosed permit for consecutive verify stages so that shared control gates can be ramped up and down one time rather than multiple times. Other aspects that may be included in the interleaved program operations disclosed herein include reversing the verify order from the typical procedure of verifying lowest program state to highest program state to take advantage of a biasing level already on the selected word line over which verify pulses are to be applied. In one embodiment, a circuit includes an interleave control circuit, a program control circuit, and a verify control circuit. The interleave control circuit is configured to determine a sequence for interleaving two program-verify loops. The program control circuit is configured to apply a first program pulse to a first memory cell of a block according to the sequence, and apply a second program pulse to a second memory cell of the block after application of the first program pulse and before application of the verify pulse according to the sequence. The verify control circuit is configured to apply a verify pulse to the first memory cell after application of the second program pulse according to the sequence.

In some embodiments, the verify control circuit is configured to apply a second verify pulse after application of the first verify pulse.

In some embodiments, the verify control circuit is configured to apply the first verify pulse during a first verify stage of a plurality of consecutive verify stages, and apply the second verify pulse during a second verify stage of the plurality of consecutive verify stages.

In some embodiments, the verify control circuit is further configured to maintain a drain select gate line voltage on a selected drain select gate line at a constant level over a duration of the first verify stage and the second verify stage.

In some embodiments, the verify control circuit is configured apply a plurality of verify pulse sequences each in a descending verify order during the first verify stage and the second verify stage.

In some embodiments, the verify control circuit is configured to apply a plurality of verify pulse sequences in reverse verify orders during the first verify stage and the second verify stage.

In some embodiments, the verify control circuit is configured to apply a first verify pulse sequence in an ascending verify order during the first verify stage, and to apply a second verify pulse sequence in a descending verify order during the second verify stage.

In some embodiments, the verify control circuit is configured to maintain a bit line voltage of all of a plurality of bit lines of the block at a selected bit line level over a duration of the first verify stage and the second verify stage.

In some embodiments, the first memory cell and the second memory cell are coupled to different word lines of the block.

In some embodiments, the different word lines include a first word line and a second word line, and the program control circuit is configured to apply an unselected word line voltage to the second word line during application of the first program pulse to the first word line, and apply an unselected word line voltage to the first word line during application of the second program pulse to the second word line.

In some embodiments, the first set of memory cells and the second set of memory cells are each coupled to a same word line of the block.

In some embodiments, the first memory cell is part of a first sub-block of the block, the second memory cell is part of a second sub-block of the block, the first sub-block is coupled to a first drain select gate line and the second sub-block is coupled to a second drain select gate line, and the program control circuit configured to apply a selected drain select gate line voltage to the first drain select gate line and an unselected drain select gate line voltage to the second drain select gate line during application of the first program pulse, and apply the selected drain select gate line voltage to the second drain select gate line and the unselected drain select gate line voltage to the first drain select gate line during application of the second program pulse.

In another embodiment, a circuit includes a block of memory cells comprising a first set of memory cells and a second set of memory cells, and a program controller. The program controller is configured to, in order to insert delay periods between program stages and verify stages to program the first set of memory cells and the second set of memory cells: consecutively program the first set of memory cells and the second set of memory cells, and consecutively verify the first set of memory cells and the second set of memory cells.

In some embodiments, the first set of memory cells and the second set of memory cells are coupled to different word lines of the block.

In some embodiments, the program controller is configured to consecutively verify the first set of memory cells and the second set of memory cells both according to descending verify orders.

In some embodiments, the program controller is further configured to control a gate line voltage supply circuit to maintain a constant drain select gate line voltage on a selected drain select gate line during the consecutive verifies.

In some embodiments, the first set of memory cells and the second set of memory cells are coupled to a same word line in the block.

In some embodiments, the program controller is configured to consecutively verify the first set of memory cells and the second set of memory cells according to reverse verify orders.

In some embodiments, the program controller is configured to first verify the first set of memory cells according to an ascending verify order and then verify the second set of memory cells according to a descending verify order.

In another embodiment, a system includes: a block comprising a plurality of word lines configured to bias a plurality of memory cells, and a program controller. To perform an interleaved program-verify loop, the program controller is configured to control a voltage supply circuit to: consecutively supply a first program pulse to program a first set of memory cells of the block and supply a second program pulse to a second set of memory cells of the block, and consecutively supply a first sequence of verify pulses in an ascending verify order or a descending verify order to the first set of memory cells, and a second sequence of verify pulses in a descending verify order to the second set of memory cells.

In some embodiments, the first set of memory cells and the second set of memory cells are each coupled to different word lines of the block, and the program controller is configured to control the voltage supply circuit to supply the first sequence of verify pulses according to the descending verify order.

In some embodiments, the program controller is configured to: separate the block into an upper word line zone and a lower word line zone, and select a next higher word line in the upper word line zone and a next lower word line in the lower word line zone to perform a next set of program operations with interleaved program-verify loops.

In some embodiments, the first set of memory cells and the second set of memory cells are coupled to a same word line of the block, and the program controller is configured to control the voltage supply circuit to supply the first sequence of verify pulses according to the ascending verify order.

In some embodiments, to program the block, the program controller is configured to program all word line cell groups coupled to one word line according to interleaved program-verify loops before programming word line cell groups coupled to another word line according to interleaved program-verify loops.

In another embodiment, a method includes: applying, with a program control circuit, a first program pulse to program a first set of memory cells of a block; determining, with an interleave control circuit, a first delay period in which to delay applying a first sequence of verify pulses to verify the first set of memory cells; during the first delay period, applying, with the program control circuit, a second program pulse to program a second set of memory cells of the block; determining, with the interleave control circuit, a second delay period in which to delay applying a second sequence of verify pulses to verify the second set of memory cells; and during the second delay period, applying, with a verify control circuit, the first sequence of verify pulses to verify the first set of memory cells.

In some embodiments, a method includes: applying, with the verify control circuit, the second sequence of verify pulses to verify the second set of memory cells after applying the first sequence of verify pulses.

In another embodiment, an apparatus includes: a means for determining a sequence for interleaving two program-verify loops; a means for applying a first program pulse to a first memory cell of a block according to the sequence; a means for applying a second program pulse to a second memory cell of the block after application of the first program pulse and before application of the verify pulse; and a means for applying a verify pulse to the first memory cell after application of the second program pulse.

Other embodiments are possible, and each of the embodiments can be used alone or together in combination. Accordingly, various embodiments will now be described with reference to the attached drawings.

FIG. 1A is a block diagram illustrating a memory system 100. The memory system 100 may include a controller 102 and memory that may include or be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure the it is operating properly, map out bad flash memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable interface, such as flash interface, including those configured for Toggle Mode 200, 400, 800, 1000 or higher. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is shown as including a single channel between the controller 102 and the non-volatile memory die(s) 104. However, the subject matter described herein is not limited to memory systems having a single memory channel. For example, in some memory systems, such as those embodying NAND architectures, 2, 4, 8 or more channels may exist between the controller 102 and the memory die(s) 104, depending on controller capabilities. In any of the embodiments described herein, more than a single channel may exist between the controller and the memory die(s)s 104, even if a single channel is shown in the drawings.

Figure 1B:
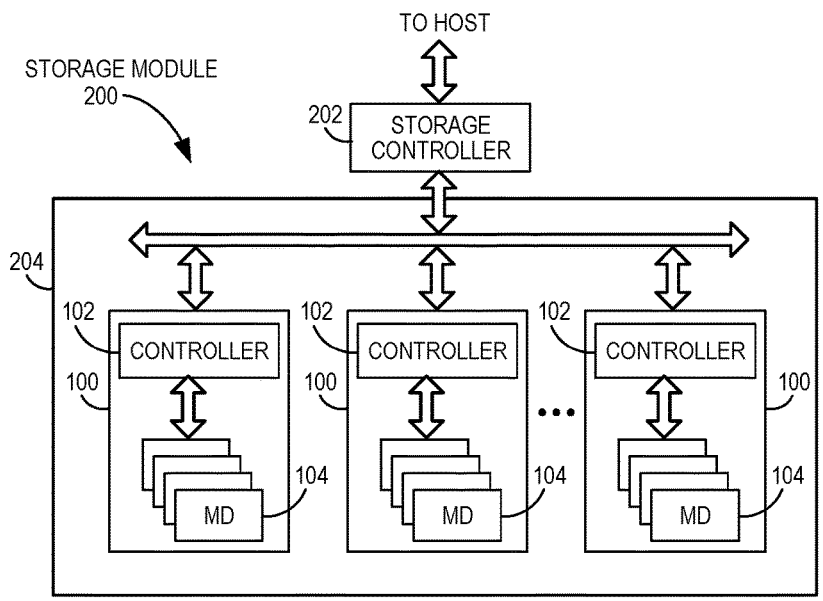
FIG. 1B is a block diagram of an example storage module that includes a plurality of memory systems.

FIG. 1B illustrates a storage module 200 that includes a plurality of non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMedia Card (eMMC) interface, a SD interface, or a Universal Serial Bus (USB) interface, as examples. The storage module 200, in one embodiment, may be a solid state drive (SSD), such as found in portable computing devices, such as laptop computers and tablet computers, and mobile phones.

Figure 1C:
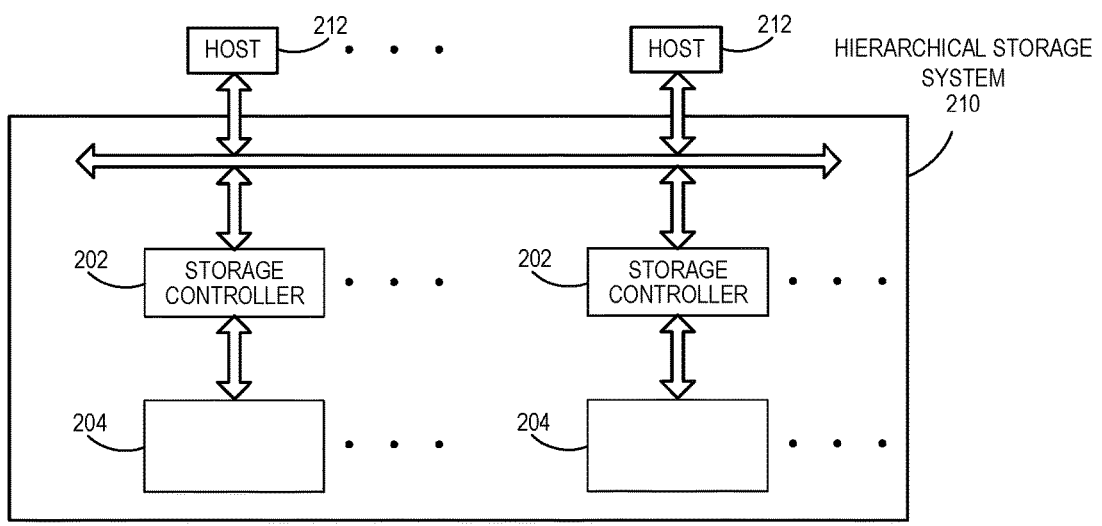
FIG. 1C is a block diagram of an example hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
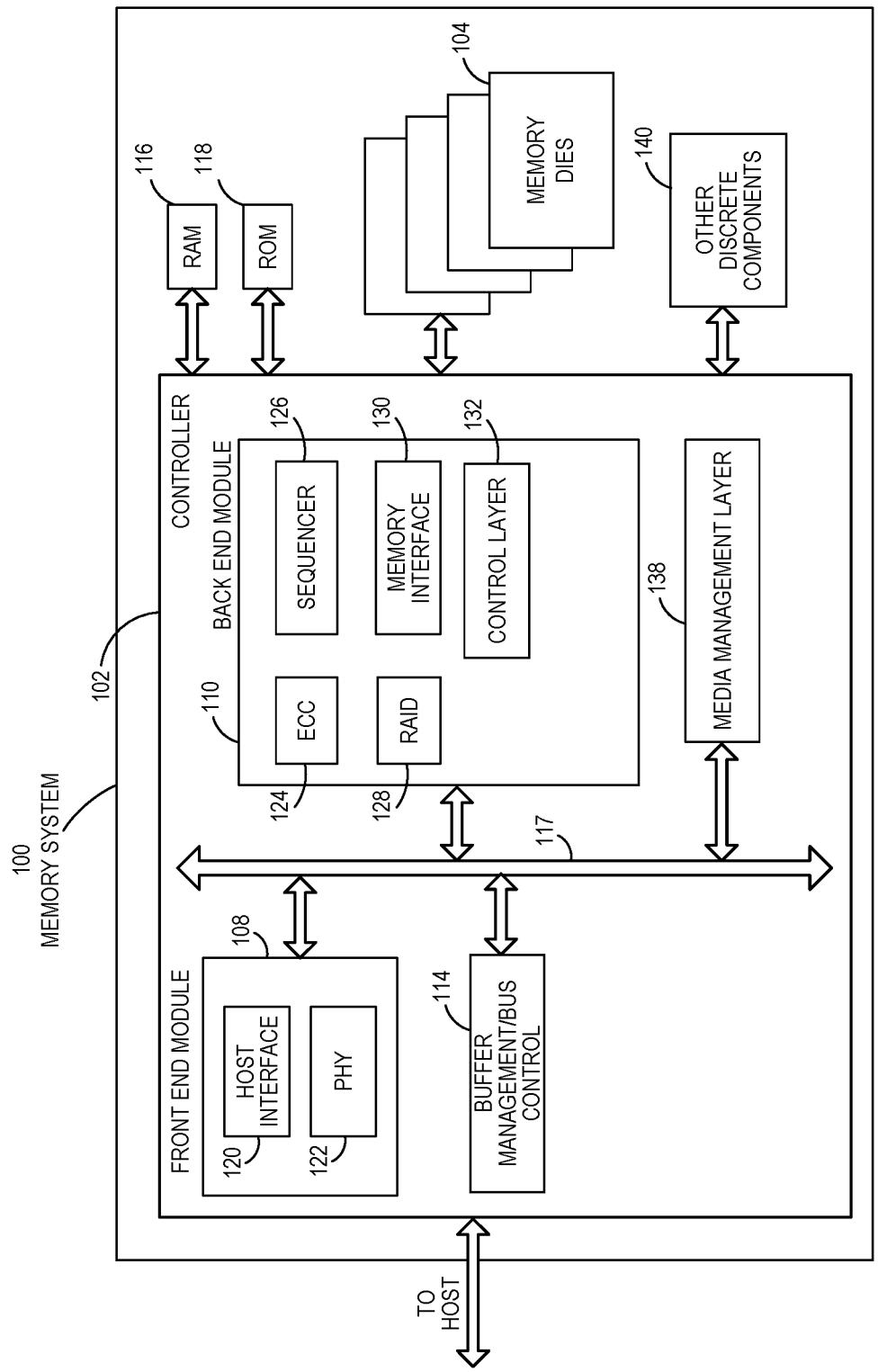
FIG. 2A is a block diagram of an example configuration of components of a controller of the memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory die(s) 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface and/or a Toggle Mode 200, 400, 800, or higher interface. A control layer 132 may control the overall operation of back end module 110.

Additional modules of the non-volatile memory system 100 illustrated in FIG. 2A may include a media management layer 138 that performs certain memory management functions such as wear leveling of memory cells of the memory dies 104, address management, and facilitates folding operations. Other memory management functions may be possible. The non-volatile memory system 100 may also include other discrete components 140, such as external electrical interfaces, external RAM, resistors, capacitors, or other components that may interface with the controller 102. In alternative embodiments, one or more of the RAID module 128, media management layer 138 and buffer management/bus controller 114 are optional components that may not be necessary in the controller 102.

Figure 2B:
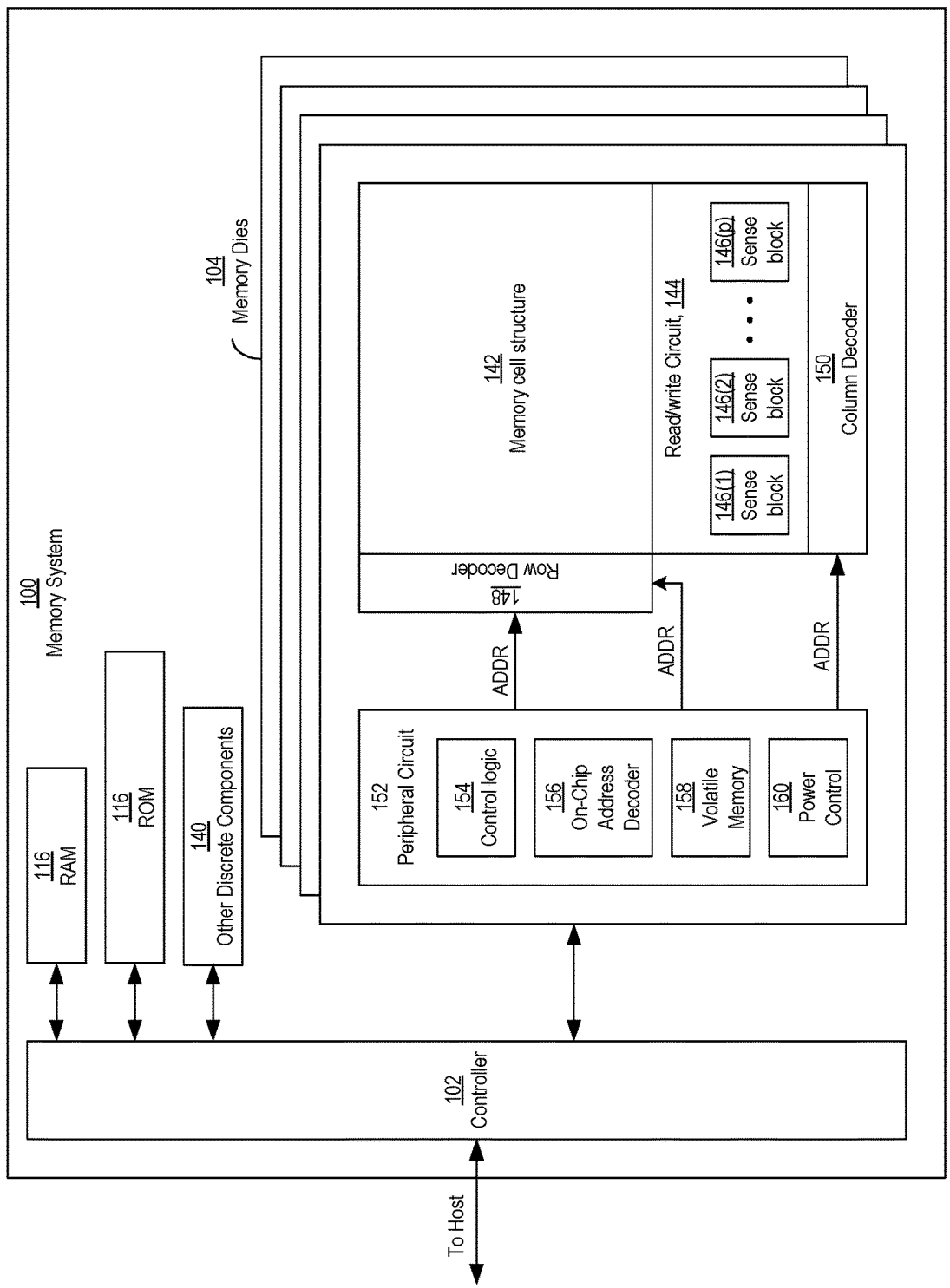
FIG. 2B is a block diagram of an example configuration of components of a memory die of the memory system of FIG. 1A.

FIG. 2B is a block diagram of an example configuration of components of a memory die 104 in more detail. The memory die 104 may include a memory cell structure 142 that includes a plurality of memory cells, otherwise or interchangeably referred to as memory elements. A memory cell is an element or component that stores a unit of data having an n-bit data value, where n is one or more. Any suitable type of memory can be used for the memory cells of the memory cell structure 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group. Alternatively, memory cells may be configured so that each element is individually accessible, e.g., a NOR memory array. NAND and NOR memory configurations are exemplary, and memory cells may be otherwise configured.

A plurality of memory cells that form the memory cell structure 142 of a memory die may be located within and/or over a substrate. The substrate may be a wafer over or in which the layer of the memory cells are formed or it may be a carrier substrate which is attached to the memory cells after they are formed. As a non-limiting example, the substrate may include a semiconductor and/or be made of a semiconductor material, such as silicon.

In addition, a plurality of memory cells that form the entire memory cell structure 142 or at least a portion of the memory cell structure 142, may be arranged in two dimensions or in three dimensions. A plurality of memory cells arranged in two dimensions is referred to as a two-dimensional (2-D) memory cell structure. A plurality of memory cells arranged in three dimensions is referred to as a three-dimensional (3-D) memory cell structure.

In a two-dimensional memory cell structure, the memory cells are arranged in a single plane or a single memory device level. Typically, in a two-dimensional memory cell structure, the memory cells are arranged in a plane (e.g., in an x-y direction plane) that extends substantially parallel to a major surface of a substrate that supports the memory cells.

In a three-dimensional memory cell structure, the memory cells are arranged so that memory cells occupy multiple planes or multiple memory device levels (e.g., multiple x-y direction planes), thereby forming a structure in three dimensions (i.e., in the x, y and z directions, where the z direction is substantially perpendicular to and the x and y directions are substantially parallel to the major surface of the substrate). When configured as a three-dimensional memory cell structure, the memory cells extend up or away from the major surface of the substrate.

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the z direction) with each column having multiple memory cells in each column. The columns may be arranged in a two dimensional configuration, e.g., in an x-y plane, resulting in a three-dimensional arrangement of memory cells, with the memory cells on multiple vertically stacked memory planes. Other configurations of memory cells in three dimensions can also constitute a three dimensional memory array.

In at least some example configurations, a two-dimensional or a three-dimensional memory cell structure may be in the form of or configured as an ordered array (or just array). One type of an array is an orthogonal array, which is a matrix-like structure that includes rows and columns. The memory cells are arranged in the rows and columns. At the intersection of a row and a column is a memory cell. However, in other configurations, the memory cells may be arrayed in non-regular or non-orthogonal configurations.

Figure 3A:
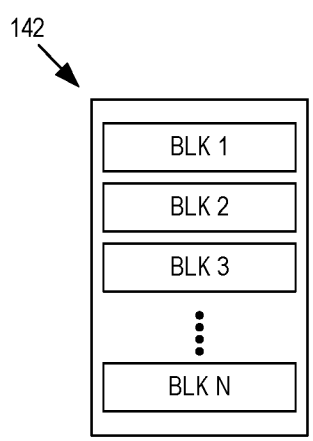
FIG. 3A is a block diagram of a memory cell structure organized into blocks.

Referring to FIG. 3A, the memory cells of a memory cell structure 142 located on a single memory die 104 may be organized into N-number of blocks, extending from a first block BLK 1 to an Nth block BLK N. A block is a minimum unit of erase of a memory die 104. Memory cells that are part of the same block are erased at the same time and/or as part of a same erase operation.

Figure 3B:
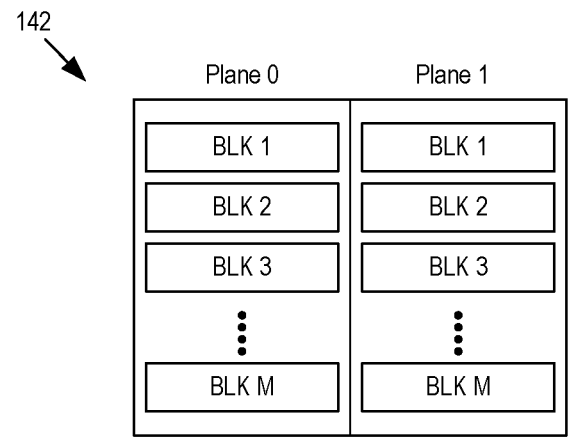
FIG. 3B is a block diagram of a memory cell structure organized into blocks in different memory planes.

Referring to FIG. 3B, for some example configurations, the N-number of blocks located on a single memory die 104 are organized into a plurality of memory planes (or just planes). FIG. 3B shows an example configuration where the blocks are organized into two memory planes, including a first memory plane Plane 0 and a second memory plane Plane 1. Configurations that include more than two memory planes may be possible. In FIG. 3B, each memory plane is shown as including an M-number of blocks, extending from a first block BLK 1 to an Mth block BLK M. In at least some example configurations, blocks that are part of the same plane may be oriented in and/or form a column or a one-dimensional array of blocks, although other configurations of blocks in a single plane may be possible.

The memory cells of a block may be arranged two-dimensionally in a two-dimensional (2-D) memory array or three-dimensionally in a three-dimensional (3-D) memory array. A two-dimensional block is a block that has memory cells arranged two-dimensionally. A three-dimensional block is a block that has memory cells arranged three-dimensionally.

Figure 4A:
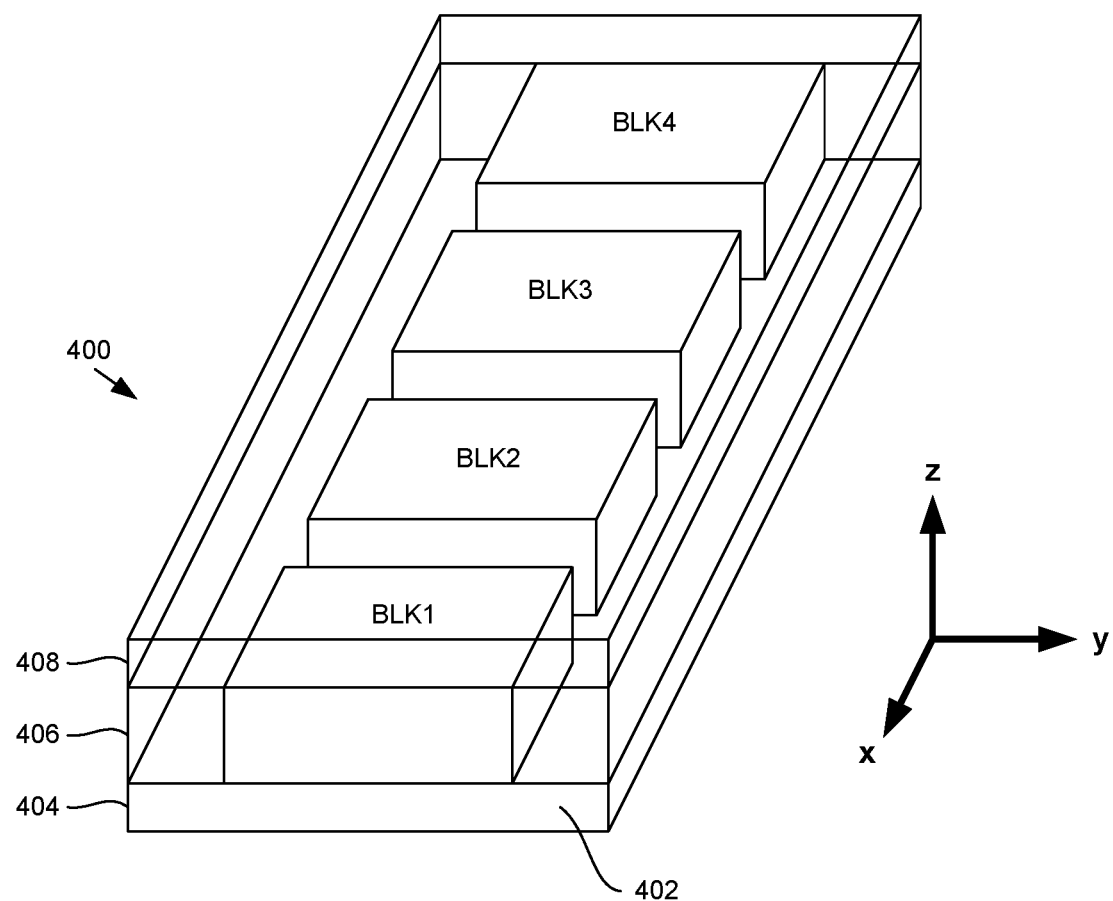
FIG. 4A is a perspective view of at least a portion of the memory die of FIG. 2B that includes a plurality of three-dimensional blocks.

FIG. 4A shows a perspective view of at least a portion of a memory die 104 that includes a set or a plurality of three-dimensional blocks 400, which may represent at least a portion of the memory cell structure 142 of FIG. 2B. For simplicity, the plurality of blocks 400 is shown as including four blocks, BLK1, BLK2, BLK3, and BLK4. In actual implementation, a given memory cell structure 142 of a memory die 104 may include several more blocks than four, such as on the order of hundreds, thousands, or tens of thousands of blocks. In a particular example configuration, one plane of blocks includes 2,000 blocks.

The blocks 400 are located or disposed on a substrate 402 of the memory die 104. The substrate 402 may be part of a lower level or region 404 of the memory die 104 that carries or includes circuitry under the blocks 400, along with one or more lower metal layers patterned to form conductive paths that carry or supply signals or voltages output from the circuitry, such as those used to perform memory operations (read, program, sense, erase, e.g.).

The blocks 400 are disposed in an intermediate level or region 406 (also referred to as a block level or region, or an array level or region) of the memory die 104 in between the lower region 404 and an upper level or region 408 of the memory die 104. The upper region 408 may include one or more upper metal layers patterned in the form of conductive paths that carry or supply signals or voltages output from the circuitry.

The substrate 402 is generally a planar structure having opposing planar surfaces. Herein, the components on a memory die 104 can be physically described with reference to a three-dimensional Cartesian coordinate system having an x-axis, a y-axis, and a z-axis. The z-axis is the axis that extends perpendicular to the planar surfaces of the substrate 402. In general, the components on a memory die 104 are disposed on and/or extend from one of the planar surfaces in a z-direction that is parallel with the z-axis. The terms "above" and "below" as well as other terms such as "top" and "bottom" and "upper" and "lower" are used herein to describe relative positioning of components of the memory die 104 along or with reference to the z-axis. For example, the blocks 400 are "above" the substrate 402, and the substrate 402 is part of the lower region 404 that is "below" the blocks 400. In addition, the upper region 408 is a region of the memory die 104 "above" both the blocks 400 and the substrate 402. Components of the memory die 104 disposed in the upper region 408 are farther away in the z-direction from the substrate 402 than components of the blocks 400. In general, for two components on a given memory die 104, where the first component is "above" the second component, the first component is positioned or disposed farther in the z-direction from the substrate 402 than the second component. In addition, where the first component is "below" the second component, the first component is positioned or disposed closer in the z-direction to the substrate 402 than the second component.

The terms "top" and "bottom" are also used to refer to the relative positioning of components of the memory die 104 in the z-direction and/or along the z-axis. In general, "bottom" components are positioned or disposed closer in the z-direction to the substrate 402 than "top" components, and "top" components are positioned or disposed farther in the z-direction from the substrate 402 than "bottom" components. In this context, a memory die 104 may include one or more top metal layers disposed in the upper region 408 and one or more bottom metal layers disposed in the lower region 404. In general, the bottom metal layers are positioned or disposed closer in the z-direction to the substrate 402 than the top metal layers, and the top metal layers are positioned or disposed farther in the z-direction from the substrate 402 than the bottom metal layers.

Although the terms "upper" and "lower," "above" and "below," and "top" and "bottom" are used to describe the relative position of components on a memory die 104, they should not be construed as limiting the relative positioning of the components since a memory die 104, or the memory system 100 as a whole, can be oriented in any of various positions.

With respect to the components of a block, a block includes a plurality of bias elements and a plurality of control lines. A bias element is a component or unit of a block that receives, is biased with, and/or that responds to a bias. A bias, as used in conjunction with a bias element of a block, is a voltage, a current, a plurality of voltages, a plurality of currents, or a combination of at least one voltage and at least one current that is applied to and/or received by the bias element to cause a response from the bias element or configure the bias element in a particular state. A bias is applied or supplied to the bias element, or the bias element is biased with the bias, at one or more levels to induce a response or configure the bias element in a particular state in order for a memory operation to be carried out.

The plurality of bias elements of a block may all be of a single type or may each be one of a plurality of different types. Bias elements of different types may perform different functions in the block and/or may be biased with different biases at different levels during the memory operations.

One type of bias element is a memory cell. Memory cells that are part of the same block are referred to as a block of memory cells. Other types of bias elements may be possible, depending on the memory technology. In NAND technology, other types of bias elements may include dummy cells, drain select gate transistors (referred to as SGD transistors), and source select gate transistors (referred to as SGS transistors). At least with NAND technology, dummy cells are memory cells that do not store data from a host, and are disposed coplanar with dummy word line layers that shield memory cells and word line layers from certain edge effects. SGD transistors and SGS transistors may be configured to be enabled (turn on) and disabled or inhibited (turn off), or otherwise configured in conductive and non-conductive states, at a certain time and/or in response to certain biases to allow memory operations to be performed—e.g., to allow data to be programmed into, read from, or erased from the memory cells. Bias element types other than or in addition to memory cells, dummy cells, SGD transistors, and/or SGS transistors may be possible.

In addition, a control line of a block is a conductive structure, element, or component of a block that supplies, applies, or outputs at least a part of a bias (such as a single voltage or a single current) to one or more bias elements of a block and/or that biases the one or more bias elements with at least part of the bias. In at least some example configurations, a control line functions as a contact line, in that it is the conductive line that physically extends to and contacts the one or more bias elements it biases, such as by contacting and/or forming at least a part of the electrodes or terminals of the bias element that it biases.

The control lines of a block may be organized, arranged, characterized, divided, or configured into a plurality of different types of control lines. The control lines may be organized into types by the way that they bias the bias elements. For example, control lines of the same type may bias the bias elements in the same way, such as by biasing the same type of bias elements and/or the same types of terminals of the bias elements.

For NAND technology, the control lines of a block may be organized into three main types, including control gate lines, bit lines, and source lines. A control gate line (at least for NAND technology) is a control line that applies a control gate voltage to one or more control gate terminals (or just control gate) of one or more bias elements, and/or that biases one or more control gate terminals of one or more bias elements with a control gate voltage.

A bit line (at least for NAND technology) is a control line that applies a bit line voltage to one or more drain terminals (or just drain) of one or more bias elements, and/or that biases one or more drain terminals of one or more bias elements with a bit line voltage. In this context, the bit line voltage may alternatively be referred to as a drain voltage, where a bit line is a control line that applies a drain voltage to one or more drain terminals of one or more bias elements. In particular example configurations, a bit line biases drain terminals by applying its bit line voltage to one or more drain ends or sides of one or more NAND strings and/or associated channels, and/or by biasing one or more drain ends or sides of one or more NAND strings and/or associated channels with a bit line voltage. In this context, a bit line voltage may alternatively be referred to as a drain-side channel voltage (or just drain-side voltage). Herein, the terms bit line voltage, drain voltage, drain-side voltage, and drain-side channel voltage are used interchangeably, at least as those voltages pertain to NAND technology, unless expressly described otherwise. NAND strings, channels, and their drain ends are described in further detail below.

A source line (at least for NAND technology) is a control line that applies a source line voltage to one or more source terminals (or just source) of one or more bias elements, and/or that biases one or more source terminals of one or more bias elements with a source line voltage. In this context, the source line voltage may alternatively be referred to as a source voltage, where a source line is a control line that applies a source voltage to one or more source terminals of one or more bias elements. In particular example configurations, a source line biases source terminals by applying its source line voltage to one or more source ends or sides of one or more NAND strings and/or associated channels, and/or by biasing one or more source ends or sides of one or more NAND strings and/or associated channels with a source line voltage. In this context, a source line voltage may alternatively be referred to as a source-side channel voltage or (or just source-side voltage). Herein, the terms source line voltage, source voltage, source-side voltage, and source-side channel voltage are used interchangeably, at least as those voltages pertain to NAND technology, unless expressly described otherwise. Also, the source line of a block may alternatively be referred to as a cell source line CELSRC. NAND strings, channels, and their source ends are described in further detail below.

In at least some example configurations, control gate lines of a block may be further organized, arranged, characterized, divided, or configured into a plurality of different control gate types (or sub-types). In particular, the control gate lines may be further arranged into the types of bias elements that they bias, and include word lines, dummy word lines, drain select gate lines (referred to as SGD lines), and source select gate lines (referred to as SGS lines).

A word line is a control gate line that applies a word line voltage to one or more control gates of one or more memory cells, and/or that biases one or more control gates of one or more memory cells with a word line voltage. A dummy word line is a control gate line that applies a dummy word line voltage to one or more control gates of one or more dummy cells, and/or that biases one or more control gates of one or more dummy cells with a dummy word line voltage. A drain select gate line (referred to as an SGD line) is a control gate line that applies a drain select gate voltage (referred to as a SGD line voltage) to one or more control gates of one or more SGD transistors, and/or that biases one or more control gates of one or more SGD transistors with an SGD line voltage. A source select gate line (referred to as a SGS line) is a control gate line that applies a source select gate voltage (referred to as a SGS line voltage) to one or more control gates of one or more SGS transistors, and/or that biases one or more control gates of one or more SGS transistors with an SGS line voltage.

For some example configurations of a three-dimensional block, at least one type of control line is implemented or formed as a plurality of layers. For example, in at least some 3-D NAND configurations, the control gate lines of a block are implemented or formed as layers. In general, a layer, otherwise referred to as a sheet or a plate, is a generally planar structure extending in the x-y directions perpendicular to the z-direction. A layer has opposing planar surfaces facing in opposite directions. One of the planar surfaces is a top surface that faces in the z-direction away from the substrate 402, and the other planar surface is a bottom surface that faces in the z-direction toward the substrate 402.

Herein, the terms "line" and "layer," at least as they are used to refer to control lines—except SGD lines as described in further detail below—are used interchangeably or as alternatives to each other. For example, the terms "control gate line" and "control gate layer" are used interchangeably; the terms "word line" and "word line layer" are used interchangeably; the terms "dummy word line" and "dummy word line layer" are used interchangeably; and the terms "source select gate line" (or SGS line) and "source select gate layer" (or SGS layer) are used interchangeably.

In addition, for at least for some example configurations of 3-D NAND technology, a three-dimensional block includes a stack. In general, a stack is a plurality or a collection of layers disposed on top of one another. For 3-D NAND, a stack of a block includes a plurality of control gate layers and a plurality of dielectric layers. A dielectric layer, at least when implemented with control gate layers of a stack, is a layer that electrically isolates one control gate layer from another control gate layer. In the stack, the control gate layers and the dielectric layers are arranged in an alternating manner, in that as the stack extends in the z-direction away from the substrate, the layers consecutively alternate between control gate layers and dielectric layers. In this context, a stack of a three-dimensional block is a collection of alternatingly disposed control gate layers and dielectric layers.

A stack of a three-dimensional block includes outer surfaces and edges as defined by the side surfaces and edges of the layers, as well as a top surface of a top-most layer of the stack and a bottom surface of a bottom-most layer of the stack. The outer surfaces and edges of the stack, in turn, define an outer boundary of the stack. The bias elements of the three-dimensional block are three-dimensionally arranged within the outer boundary. In this context, the bias elements of the three-dimensional block are referred to as being disposed in or within the stack.

In addition, at least for some example configurations, the bias elements of a three-dimensional block are disposed coplanar (in the x-y direction) with control gate layers. In particular, the bias elements are coplanar with the control gate layers by which they are configured to be biased. Accordingly, memory cells configured to be biased by a particular word line layer are disposed coplanar with the particular word line layer; SGD transistors configured to be biased by a particular SGD layer are disposed coplanar with the particular SGD layer; SGS transistors configured to be biased by a particular SGS layer are disposed coplanar with the particular SGS layer; and dummy cells configured to by biased by a particular dummy word line layer are disposed coplanar with the particular dummy word line layer.

A bias element that is coplanar with and/or configured to be biased by a given control gate layer may be referred to as being disposed in, located in, and/or coupled to the given control gate layer. For example, a memory cell coplanar with and/or configured to be biased by a given word line may be referred to as being disposed in, located in, and/or coupled to the given word line layer.

In addition, at least for some example configurations of 3-D NAND technology, a three-dimensional block includes a plurality of channels. A channel is an elongate structure that extends in the z-direction through a stack of a block, around or about which bias elements of the block are formed or disposed. A bias element that is disposed or formed around or about a channel may at least partially, and in some configurations completely, encompass or surround the channel.

In addition, at least for some example configurations of 3-D NAND technology, bias elements of a block are biased by way of channels. Otherwise stated, a channel is structure of a block by which bias elements are biased. In particular, drain terminals and source terminals of bias elements are biased by way of channels. A bias element that has its source and drain terminals biased by a given channel is coupled to that given channel.

Each channel includes a respective drain end (or drain side) and a respective source end (or source side). A channel extends through a stack in the z-direction toward the substrate from its drain end to its source end. Bit lines of a block are electrically connected or coupled the drain ends of the channels, and the source line of a block is electrically connected or coupled to the source ends of the channels. In a block, a bit line applies a bit line voltage (or drain voltage or drain-side voltage or drain-side channel voltage) to the one or more drain ends of one or more channels to which it is coupled. The source line applies a source line voltage (or source voltage or source-side voltage or source-side channel voltage) to the source ends of the channels to which it is coupled.

Additionally, as used herein, a NAND string is a plurality or a collection of bias elements that are formed or disposed around or about the same channel. A given channel and a given NAND string that includes the bias elements disposed or formed around or about the given channel are referred to as being coupled to and/or associated with each other. In addition, bias elements that are part of the same NAND string are referred as being coupled to each other.

For at least some example configurations, the bias elements of a NAND string include a plurality of memory cells, at least one SGD transistor, and at least one SGS transistor. In particular example configurations, a NAND string may further include one or more dummy cells.

The NAND strings extend in the z-direction about their associated channels. Similar to the channels, the NAND strings each include respective drain ends (or drain sides) and source ends (or source sides). A channel extends in the z-direction toward the substrate from its drain end to its source end.

Drain ends of NAND strings are electrically coupled to drain ends of their associated channels. Accordingly, the bit lines are electrically connected or coupled to drain ends of channels and associated channel elements groups. A bit line is configured to apply a bit line voltage (or a drain voltage, a drain-side channel voltage, or a drain-side voltage) to drain ends of channels and associated NAND strings to which the bit line is coupled. Otherwise stated, a bit line voltage (or a drain voltage, a drain-side channel voltage, or a drain-side voltage) is a voltage that a bit line generates and that it applies to a drain end (or drain side) of a channel and/or a drain end (or drain side) of a NAND string to which it is electrically connected or coupled. During at least some memory operations, a bit line may bias one or more drain terminals of one or more bias elements by applying a bit line voltage (or a drain voltage, a drain-side channel voltage, or a drain-side voltage) to one or more drain ends of one or more channels and/or to one or more drain ends of one or more NAND strings to which it the bit line is electrically connected or coupled. Otherwise stated, during memory operations, a bit line biases one or more drain terminals of one or more bias elements with a bit line voltage (or a drain voltage, a drain-side channel voltage, or a drain-side voltage) by way of the drain ends of one or more channels and/or the drain ends of one or more NAND strings to which the bit line is coupled.

Similarly, source ends of NAND strings are electrically coupled to source ends of their associated channels. Accordingly, the source line is electrically connected or coupled to source ends of channels and associated channel elements groups. The source line is configured to apply a source line voltage (or a source voltage, a source-side channel voltage, or a source-side voltage) to source ends of channels and associated NAND strings to which the source line is coupled. Otherwise stated, a source line voltage (or a source voltage, a source-side channel voltage, or a source-side voltage) is a voltage that a source line generates and that it applies to a source end (or source side) of a channel and/or a source end (or source side) of a NAND string to which the source line is electrically connected or coupled. During at least some memory operations, a source line may bias one or more source terminals of one or more bias elements by applying a source line voltage (or a source voltage, a source-side channel voltage, or a source-side voltage) to one or more source ends of one or more channels and/or to one or more source ends of one or more NAND strings to which it the source line is electrically connected or coupled. Otherwise stated, during memory operations, a source line biases one or more source terminals of one or more bias elements with a source line voltage (or a source voltage, a source-side channel voltage, or a source-side voltage) by way of the source ends of one or more channels and/or the source ends of one or more NAND strings to which the source line is coupled.

In addition, bias elements of a NAND string extend in the z-direction around or about the same channel. Each bias element of the NAND string is disposed coplanar with one of the plurality of control gate layers of the block. In this regard, each control gate layer of the block is configured to bias a control gate of a respective one of the plurality of bias elements of the NAND string.

In addition, for at least some example configurations, the NAND strings of a block may have the same number of bias elements, the same combination of bias element types, and the same number of bias elements of each bias element type. Also, a bias element order in which the bias elements of their respective bias element types extend in the z-direction away from the substrate is the same among the NAND strings of a block. At least for some example configurations of 3-D NAND technology, the bias element order of the bias elements of a NAND string, starting closest to the substrate and moving away from the substrate in the z-direction, includes one or more SGS transistors followed by one or more source-side dummy cells, followed by a plurality of memory cells, followed by one or more drain-side dummy cells, and followed by one or more SGD transistors. Other bias element orders may be possible.

A control gate layer order of the control gate layers and their respective types may match or correspond to the bias element order of a block. Accordingly, at least for some example configurations of 3-D NAND technology, a control gate layer order of a plurality of control gate layers of a block, starting closest to the substrate and moving away from the substrate in the z-direction, includes one or more SGS layers, followed by one or more source-side dummy word line layers, followed by a plurality of word line layers, followed by one or more drain-side dummy word line layers, and followed by one or more SGD layers.

Figure 4B:
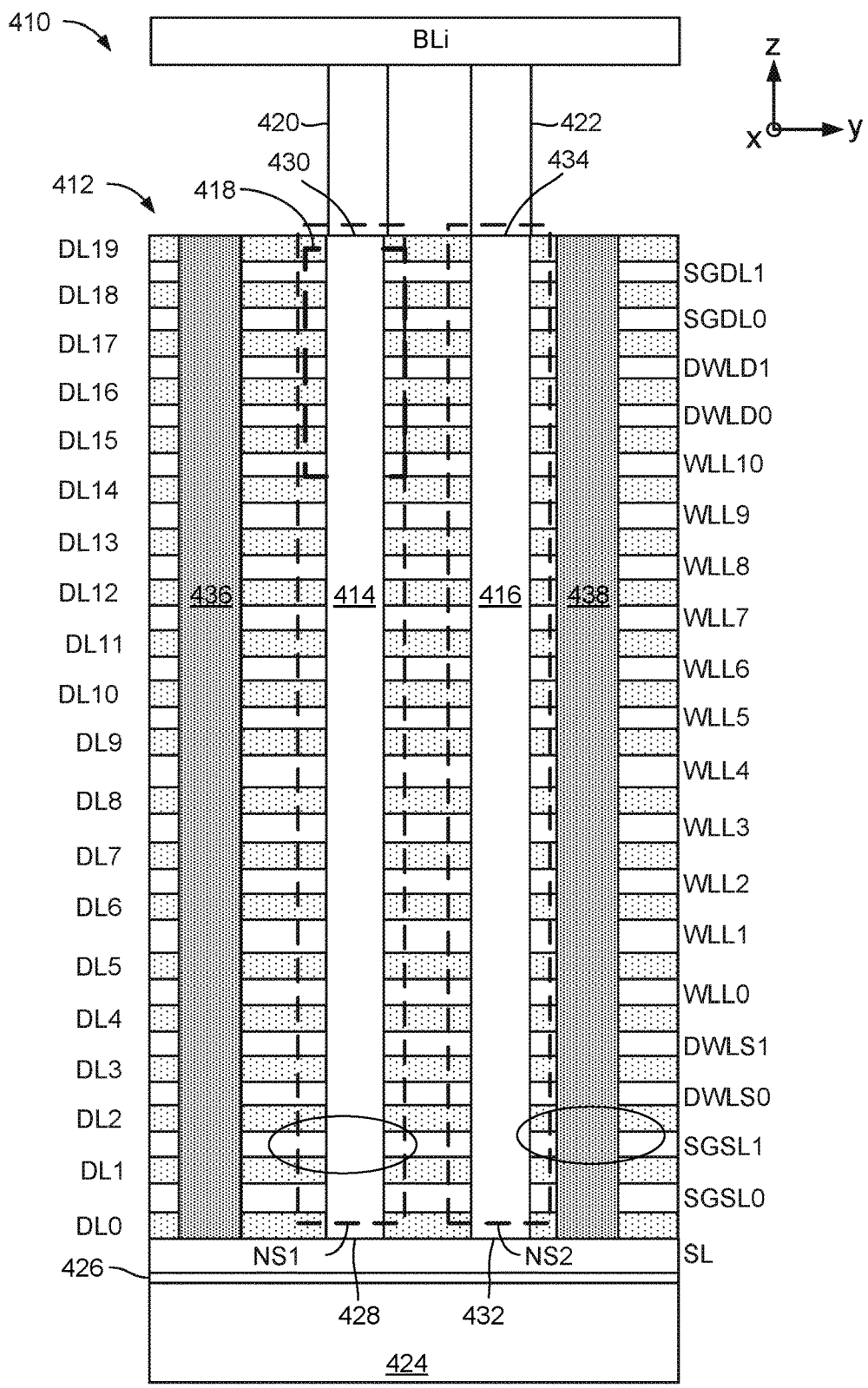
FIG. 4B is a cross-sectional view of a portion of one of the blocks of FIG. 4A.

In further detail, FIG. 4B shows a cross-sectional view of a portion of a block 410, which may be representative of one of the blocks 400 of FIG. 4A. The block 410 includes a stack 412 of alternating control gate layers and dielectric layers (DL). In addition, the portion shown in FIG. 4B includes two channels (or memory holes) extending through the layers, including a first channel 414 and a second channel 416. Bias elements forming two NAND strings around the two channels 414, 416 are identified by dotted boxes in FIG. 4B. In particular, bias elements forming a first NAND string NS1 around the first channel 414 are identified by a dotted box labeled NS1, and bias elements forming a second NAND string NS2 around the second channel 416 are identified by a dotted box labeled NS2. Further details of bias elements and example materials to form the elements and the channels are described in further detail below with respect to FIG. 4C with reference to a particular region 418 of the first NAND string NS1 and associated first channel 414.

For purposes of illustration, in FIG. 4B, the first and second NAND strings CEG1, CEG2 formed around the first and second channels 414, 416 are both electrically connected to an ith bit line BLi. In actual implementation, a block may include hundreds or thousands of bit lines. An arrangement of channels and associated NAND strings of a block may determine which channels and NAND strings are electrically connected to which bit lines. Among the plurality of channels and NAND strings of a block, certain combinations of channels and associated NAND strings are electrically connected to the same bit line as each other, while certain other combinations of channels and associated NAND strings are electrically connected to different bit lines from each other.

In addition, a given NAND string may be electrically connected to a given bit line by way of its associated channel and a conductive via electrically connecting the associated channel with the bit line. For example, in FIG. 4B, the first NAND string CEG1 is electrically connected to the ith bit line BLi by way of the first channel 414 and a conductive via 420 that electrically connects the first channel 414 with the ith bit line BLi. The second NAND string CEG2 is electrically connected to the ith bit line BLi by way of the second channel 416 and a conductive via 422 that electrically connects the second channel 416 with the ith bit line BLi. Other ways of electrically connecting bit lines with NAND strings may be possible.

The block 410 may further include or be disposed on a substrate 424. An insulating film 426 may be formed on the substrate 424, and a source line SL may be formed or disposed on a bottom-most layer of the stack 412.

In addition, in the example configuration shown in FIG. 4B, each channel 414, 416 includes a source end connected to the source line SL, and a drain end connected to its associated conductive via. In FIG. 4B, the first channel 414 includes a source end 428 connected to the source line SL, and a drain end 430 connected to the conductive via 420. Similarly, the second channel 416 includes a source end 432 connected to the source line SL, and a drain end 434 connected to the conductive via 422.

In addition, at least some example configurations, the block 410 may further include vertical interconnects (e.g., metal-filled slits) extending through the stack 412 that connect the source line SL to a conductive line above the stack 412, such as a conductive line in one of the metal layers in the upper region 408 (FIG. 4A). For purposes of illustration, FIG. 4B shows two interconnects 436, 438 extending through the stack 412.

In addition, in the example configuration in FIG. 4B, for purposes of illustration, each of the NAND strings include two SGS transistors, two source-side dummy cells, eleven memory cells, two drain-side dummy cells, and two SGD transistors. Accordingly, the control gate layers of the stack 412 include: two SGS layers, including a first SGS layer SGSL0 and a second SGS layer SGSL1; two source-side dummy word line layers, including a first source-side dummy word line layer DWLS0 and a second source-side dummy word line layer DWLS1; eleven word line layers extending from a first word line layer WLL0 to an eleventh word line layer WLL10; two drain-side dummy word line layers, including a first drain-side dummy word line layer DWLD0 and a second drain-side dummy word line layer DWLD1; and two SGD layers, including a first SGD layer SGSL0 and a second SGD layer SGDL1. The stack further includes twenty dielectric layers, extending from a first dielectric layer DL0 to a twentieth dielectric layer DL19, alternatingly disposed between the control gate layers.

The numbers of bias elements and their respective bias element types used for the NAND strings and the number of corresponding control gate layers in the example configuration of the block 410 in FIG. 4B are non-limiting and merely exemplary for purposes of illustration. Other numbers of bias elements for any of the bias element types, or other configurations that do not include bias elements of certain bias elements types or that include one or more bias elements of bias element types other than those shown in FIG. 4B, may be possible.

Figure 4C:
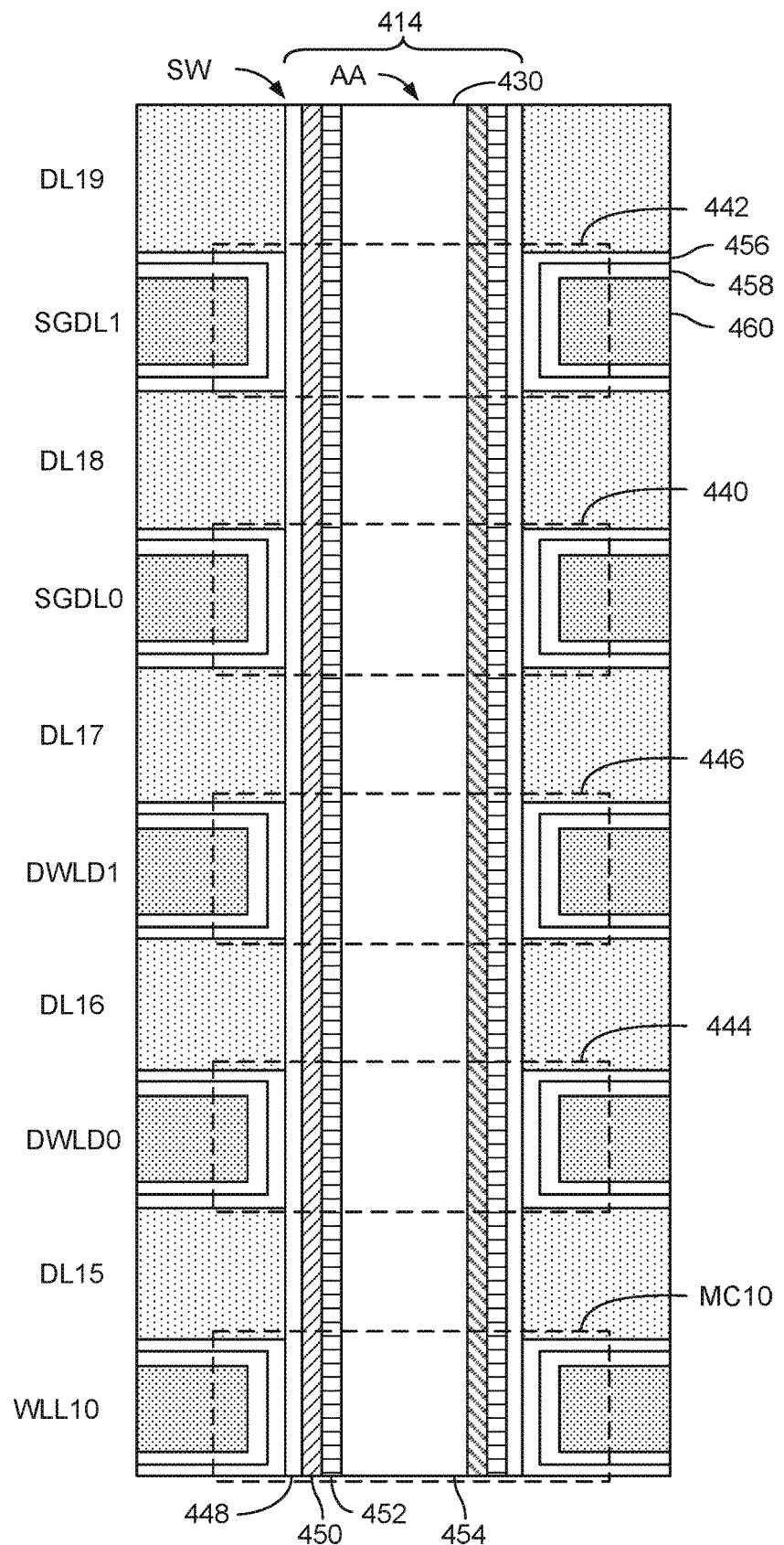
FIG. 4C is a close-up view of a region of the cross-section of FIG. 4B.

FIG. 4C is a close-up view of the region 418 of the block 410 of FIG. 4B. The materials forming the bias elements are formed at different levels of the stack 412 at the intersection of respective control gate layers and respective channels. In the example configuration of the block 410, as depicted in the close-up view of FIG. 4C, a first SGD transistor 440 and a second SGD transistor 442 are disposed below the drain end 430 of the first channel 414, and above first and second drain-side dummy cells 444, 446 and an eleventh memory cell MC10.

Physically or structurally, a channel includes a memory hole extending in the z-direction defines a sidewall (SW). A channel further includes one or more layers of materials disposed in the memory hole and/or on the side wall, such as by using atomic layer deposition as an example. In some example configurations, as described with respect to the first channel 414, the layers of materials of a channel (which may be referred to as a column or a pillar of materials) may include a charge-trapping layer or film 448 such as silicon nitride, a tunneling layer 450, a polysilicon body or channel 452, and a dielectric core 454. In addition, in some example configurations, such as the one shown in FIG. 4C, the materials making up each of the bias elements may include a blocking oxide/block high-k material 456, a barrier metal 458, and a conductive metal 460 (e.g. Tungsten) that forms the control gates of the transistors. The materials forming the bias elements may be disposed in the same level or in the same plane as the respective control gate layers. Other configurations may use materials deposited along the sidewall (SW) and/or for the bias elements other than those shown and described with reference to FIG. 4C.

Figure 4D:
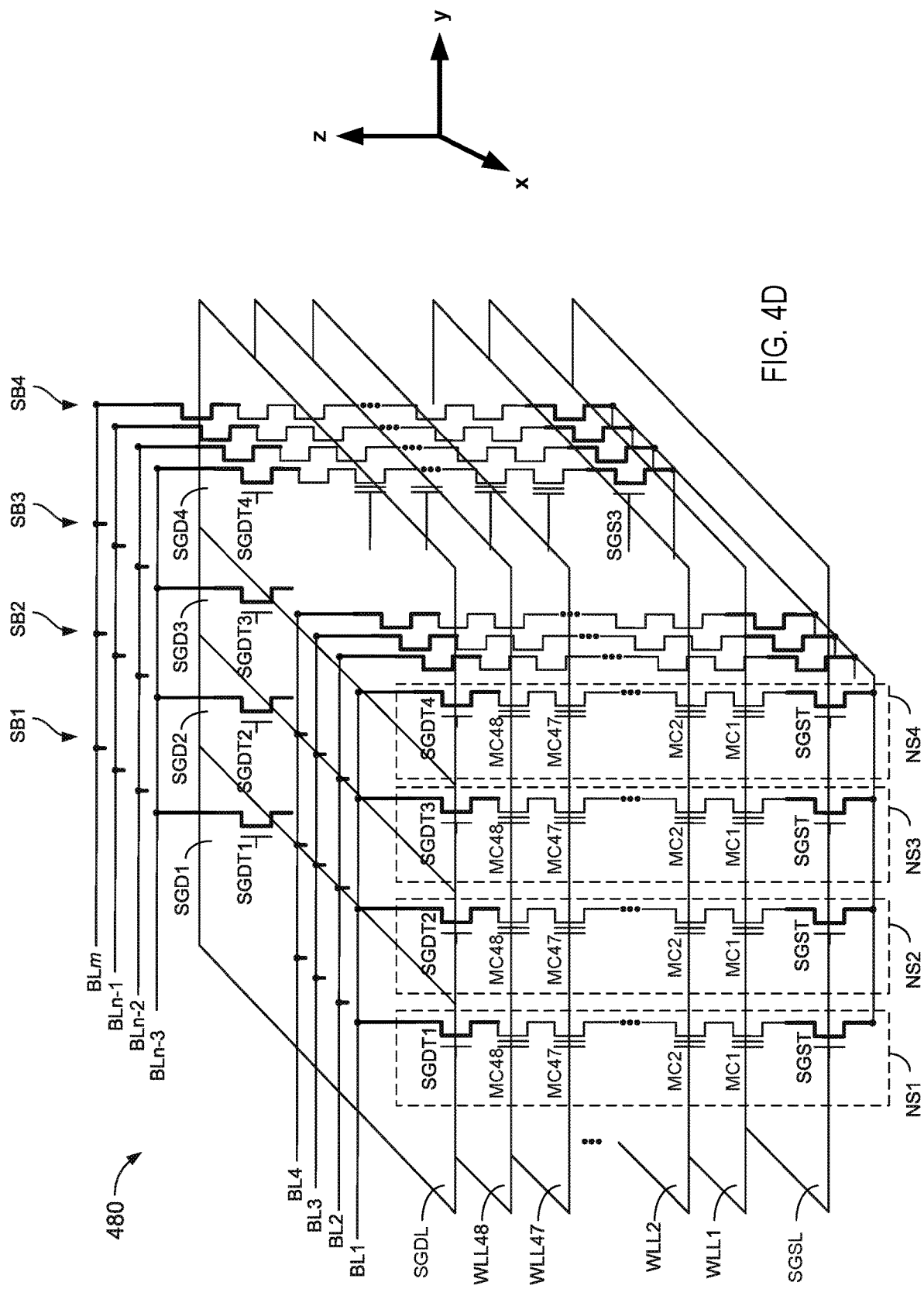
FIG. 4D is a circuit schematic diagram of a block of memory cells three-dimensionally arranged into a plurality of NAND strings.

FIG. 4D shows a circuit schematic diagram of an example configuration of a three-dimensional block 480, which may be representative of at least a portion of one of the blocks 400 of FIG. 4A and/or have the physical construction or structure as depicted in FIGS. 4B, 4C. In FIG. 4D, each bias element is represented or depicted as a transistor. In addition, memory cells are labeled MC, SGD transistors are labeled SGDT, and SGS transistors are labeled SGST. In the example block 480, each NAND string (e.g., CEG1) includes 50 cells, including 48 memory cells, extending from a first memory cell MC1 to a 48th memory cell MC48, one SGD transistor SGDT, and one SGS transistor SGST. Other NAND string configurations are possible, including those that include one or more source-side dummy cells, one or more drain-side dummy cells, more than one SGD transistor, and/or more than one SGS transistor, as previously described.

In accordance with the NAND string configuration in FIG. 4B, the block 480 includes 50 control gate layers, including 48 word line layers extending from a first word line layer WLL1 to a 48th word line layer WLL48, a SGD layer SGDL, and a SGS layer SGSL. As previously described, the ith memory cells MCi in each NAND string are disposed in and configured to have their respective control gates biased by the ith word line layer WLLi of the control gate layers. As examples, first memory cells MC1 of the NAND strings CEG are disposed in and configured to have their control gates biased by the first word line layer WLL1, the second memory cells MC2 are disposed in and configured to have their control gates biased by the second word line layer WLL2, and the 48th memory cells MC48 of the NAND strings CEG are disposed in and configured to have their control gates biased by the 48th word line layer WLL48. In addition, the SGD transistors of the NAND strings are disposed in and configured to have their respective control gates biased by the SGD layer SGDL, and the SGS transistors of the NAND strings are disposed in and configured to have their respective control gates biased by the SGS layer SGSL.

As depicted in FIG. 4D, the NAND strings CEG and their associated channels are two-dimensionally arranged in the x and y directions in the block 480, and electrically connected to an m-number of bit lines. In particular example configurations, the NAND strings CEG and their associated channels are two-dimensionally arranged in accordance with a channel arrangement that depends on a P-number of NAND strings and their associated channels that are connected to a single bit line. Otherwise stated, each bit line BL is configured to electrically connect to, apply a respective bit line voltage to, and/or bias with a respective bit line (channel) voltage, a unique set of a P-number of NAND strings and their associated channels.

In the example configuration of FIG. 4D, each bit line BL is configured to electrically connected to four NAND strings (i.e., P=4). Accordingly, FIG. 4D shows the first bit line BL1 electrically connected to each of a first NAND string CEG1, a second NAND string CEG2, a third NAND string CEG3, and a fourth NAND string CEG4. Each of the other two through mth bit lines BL2 to BLm are also electrically connected to a respective set of four NAND strings and their respective channels. Numbers for P other than four may be possible for various other configurations.

In some example configurations, an SGD layer may be separated or divided into a plurality of different drain select gate (SGD) sub-layers that are electrically isolated or disconnected from each other. For example, an SGD layer may be etched to remove portions of the metal forming the SGD layer in order to form a plurality of electrically isolated or disconnected SGD sub-layers.

Different SGD sub-layers of the same SGD layer may be independently and/or individually biased and/or supplied with a different one of a plurality of SGD line voltages. In turn, for a given plurality of SGD transistors disposed in the same SGD layer, each SGD sub-layer of the same SGD layer may be configured to bias the control gates of those SGD transistors disposed in its SGD sub-layer, but not the SGD transistors disposed in the other SGD sub-layers. In this way, the plurality of SGD sub-layers may be configured to independently or individually bias the different SGD transistors within their respective SGD sub-layers with a respective one of a plurality of SGD line voltages.

In addition, for example configurations that include multiple SGD layers, each SGD layer may include multiple SGD sub-layers. The number of SGD sub-layers in each SGD layer may be the same. In addition, certain combinations of SGD-sub-layers in different SGD layers may be electrically coupled together and/or supplied with the same SGD line voltage such that SGD transistors of the same NAND string have their control gates biased with the same SGD line voltage. SGD sub-layers that bias SGD transistors with the same SGD line voltage form part of the same SGD line.

As used herein, an SGD line is a conductive structure of a block that biases control gates of SGD transistors with a common or the same SGD line voltage. Accordingly, as used specifically herein for SGD layers and SGD lines, the terms "line" and "layer" are not used interchangeably. Instead, an SGD line is a single SGD sub-layer, or a collection of SGD sub-layers each part of a different SGD layer. In particular, for 3-D block configurations that include a single SGD layer, each SGD sub-layer of the SGD layer forms an entire SGD line. For 3-D block configurations that include multiple SGD layers, each SGD sub-layer forms a part of an SGD line with one or more other SGD sub-layers from one or more other SGD layers.

In addition, different SGD lines are configured to independently or separately bias different sets or groups of SGD transistors of a block with different SGD line voltages. An SGD line is configured to bias the control gates of those SGD transistors to which it is coupled or electrically connected, and not bias the control gates of those SGD transistors from which it is uncoupled or electrically disconnected. Accordingly, the SGD transistors SGDT of a block are arranged or formed into a plurality of SGDT groups. SGD transistors that are part of the same SGDT group are coupled to the same SGD line and configured to be biased by the same SGD line voltage. SGD transistors that are part of different SGDT groups are coupled to different SGD lines and configured to be biased by different SGD line voltages.

In addition, for at least some example configurations of a 3-D block, the number of SGD lines is equal to the P-number of NAND strings and associated channels that are connected to the same bit line. For example, with reference to FIG. 4D, the block 480 includes four SGD lines corresponding to the four NAND strings connected to a single bit line, including a first SGD line SGD1, a second SGD line SGD2, a third SGD line SGD3, and a fourth SGD line SGD4. Otherwise stated, the SGD layer SGDL includes four SGD lines SGD1, SGD2, SGD3, and SGD4.

In addition, the NAND strings may be arranged so that for a given set of NAND strings connected to the same bit line, each NAND string of the set has its SGD transistor SGDT coupled to a different one of the SGD lines. For example, in the block 480 of FIG. 4D, the set of four NAND strings CEG1, CEG2, CEG3, CEG4 connected to the first bit line BL1 have their respective SGD transistors connected to a different one the SGD lines SGD1, SGD2, SGD3, SGD4. In particular, the first NAND string CEG1 includes an SGD transistor SGDT1 coupled to and configured to have its control gate biased by the first SGD line SGD1, the second NAND string CEG2 includes an SGD transistor SGDT2 coupled to and configured to have its control gate biased by the second SGD line SGD2, the third NAND string CEG3 includes an SGD transistor SGDT3 coupled to and configured to have its control gate biased by the third SGD line SGD3, and the fourth NAND string CEG4 includes an SGD transistor SGDT4 coupled to and configured to have its control gate biased by the fourth SGD line SGD4.

A 3-D block may be arranged, organized, or divided into sub-blocks (e.g., items SB1-SB4 in FIG. 4D) across the m-number of word lines based on the different SGD lines. As used herein, a sub-block is a portion of a block that has NAND strings with SGD transistors configured to be biased by the same SGD line and/or with the same SGD line voltage. A sub-block may span, such as in the x-direction, across the m-number of word lines of a block. In addition, NAND strings with SGD transistors configured to be biased by different SGD lines and/or with different SGD line voltages are part of different sub-blocks.

The number of sub-blocks of a block may be equal to the number of SGD lines. For example, the example block 480 of FIG. 4D includes four sub-blocks (SB) equal to the number of SGD lines, including a first sub-block SB1, a second sub-block SB2, a third sub-block SB3, and a fourth sub-block SB4. The first sub-block SB1 includes those NAND strings with SGD transistors SGD1 coupled to the first SGD line SGD1 and configured to be biased with a first SGD line voltage, the second sub-block SB2 includes those NAND strings with SGD cells SGD2 coupled to the second SGD line and configured to be biased with a second SGD line voltage, the third sub-block SB3 includes those NAND strings with SGD cells SGD3 coupled to the third SGD line and configured to be biased with a third SGD line voltage, and the fourth sub-block SB4 includes those NAND strings with SGD cells SGD4 coupled to the fourth SGD line and configured to be biased with a fourth SGD line voltage.

In addition, a block of memory cells (i.e., memory cells that are part of the same block), may be arranged, organized, separated, and/or labeled on a sub-block level, or on both a sub-block level and a word line level. A plurality of memory cells MC that are part of the same sub-block is referred to as a sub-block of memory cells. Otherwise stated, a sub-block of memory cells are memory cells of NAND strings having SGD cells coupled to the same SGD line and/or configured to be biased with the same SGD line voltage.

In addition, a plurality of memory cells that are part of the same sub-block, and that are also disposed in the same word line layer and/or that are configured to have their control gates biased by the same word line and/or with the same word line voltage are referred to as a word line cell group of memory cells. Otherwise stated, a word line cell group of memory cells is a plurality or a collection of memory cells coupled to the same word line layer, and that are part of NAND strings configured to be biased with the same SGD line voltage.

A single word line layer may include a plurality of word line cell groups, such that the memory cells disposed in a single word line layer are organized, arranged, or disposed into a plurality of word line cell groups. Memory cells coupled to the same word line layer but that are part of NAND strings having SGD transistors coupled to different SGD lines are part of different word line cell groups. In particular example configurations, the number of word line cell groups coupled to a single word line layer is equal to the number of SGD lines of a block. In addition, the number of memory cells of a single word line cell group may be equal to the m-number of bit lines BL1 to BLm, such that each memory cell of a word line cell group is electrically connected to a different one of the m-number of bit lines BL1 to BLm.

In addition, the memory cells of a block, or of the memory cell structure 142 generally, are configured to store data as bits or binary digits, with each bit having either a logic 0 or a logic 1 binary value. A single memory cell may be configured to store either a single bit or a plurality of bits. A bit or bits that a single memory cell stores is referred to as a data value. Otherwise stated, a data value is an n-bit binary value that a single memory cell stores, where n is the number of bits of the binary value, and where the number n is one or more. The number of possible data values that a single memory cell can store depends on the n-number of bits it is configured to store. In particular, the number of possible data values a single memory cell can store is $2^n$.

Memory cells may be referred to as single-level cells or multi-level cells depending on the number of bits they are configured to store. A single-level cell, referred to as a SLC cell (or just SLC), is a memory cell configured to store a single or one bit of data. A multi-level cell, referred to as a MLC cell (or just MLC), is a memory cell configured to store multiple (i.e., two or more) bits of data. Example numbers of bits that an MLC cell can store include 2, 3, or 4, although MLC cells that store more than 4 bits may be possible.

In general, certain collections of memory cells are configured to store the same number of bits. For example, memory cells that are part of the same word line cell group, part of the same block, or part of the same memory cell structure 142, are configured to store the same number of bits. In this context, a given collection of memory cells (e.g., memory cells of the same word line cell group, the same block, the same memory cell structure, etc.) stores data on a bits-per-cell basis. Each memory cell of the given collection stores the same number of bits-per-cell.

In addition, a memory cell structure 142, including blocks and word line cell groups of the memory cell structure 142, may store data as pages. Herein, a page is a single unit of data that a single word line cell group of memory cells stores. The number of pages that a single word line cell group stores depends on the number of bits-per-cell that the memory cells of the single word line cell group are configured to store. As examples, a word line cell group of SLC cells is configured to store a single or one page of data; a word line cell group of MLC cells configured to store two-bits-per-cell is configured to store two pages of data; and a word line cell group of MLC cells configured to store three-bits-per-cell is configured to store three pages of data.

In addition, a memory cell structure 142 may store data according to one or more storage schemes. As used herein, a storage scheme is a general plan including a predefined set of actions and a predefined set of parameters that a memory system implements to store data. A given storage scheme for a particular collection of memory cells may identify or define the number of bits-per-cell that the memory cells of the particular collection are configured to store. The components of the memory system, including the circuit components on a given memory die, are configured to perform memory operations on the particular collection in accordance with the given storage scheme in order to program data into and/or read data from the particular collection of memory cells.

Memory cells of different memory technologies may store data in accordance with different storages schemes. In addition, memory cells of the same memory technology may store data in accordance with different storage schemes. For example, memory cells of the same memory technology but located in different memory systems, or in the same memory system but in different memory dies, or in different blocks or planes of the same memory die, or even different word line layers or different word line cell groups of the same block, may store data in accordance with different storage schemes, at least with respect to the number of bits-per-cell the different memory cells are configured to store.

At least for NAND memory technology, the NAND memory cells may be configured to store data in accordance with one of multiple different storage schemes, with each storage scheme associated or identifying a different number of bits-per-cell. In at least some example configurations, some NAND memory cells may store data according to one storage scheme while other NAND memory cells store data according to a different storage scheme. Accordingly, two different collections of NAND memory cells located in different memory systems, or in the same memory system but in different dies, planes, blocks, word line layers, or word line cell groups, may store different numbers of bits-per-cell according to different storage schemes. To illustrate, one collection of NAND memory cells may be configured as SLC cells and another collection of NAND memory cells may be configured as MLC cells.

In addition, the same memory cell (or the same collection of memory cells) may be configured to store different numbers of bits-per-cell according to different storage schemes at different times. To illustrate, in one example, a memory cell may be configured as an SLC cell at one point in time, and then reconfigured as an MLC cell at a later point in time. As another example, a memory cell may be configured as an MLC cell at one point in time, and then reconfigured as an SLC cell at a later point in time. As another example, a memory cell may be configured as an MLC cell storing a first number of bits-per-cell at one point in time, and then reconfigured as an MLC cell storing a second number of bits-per-cell at a later point in time, where the first and second numbers are different from each other, with the first number being either less than or greater than the second number.

In addition, a memory cell stores data by having an associated storage parameter (alternatively or otherwise referred to as a characteristic, property, or feature) set to a level, value, magnitude, or state. The associated parameter is adjustable or variable, and can be controlled by biasing the control lines coupled to the memory cells at certain levels, at certain times, during certain memory operations, and according to certain storage schemes. Within one storage scheme defining a set of data values, a memory cell can store data at a certain one of the data values by having its storage parameter set to a level, value, magnitude, or state, or within a predetermined range of levels, values, magnitudes, or states. The level, value, magnitude, or state that the memory cell is at or set to corresponds to the data value of the set that the memory cell is storing. In addition, the memory cell can be configured to store a different value, or to change the data value of the data it is storing from one data value to another data value, by changing or adjusting the storage parameter to a different level, value, magnitude, or state.

The storage parameter that a memory cell has to store data depends on the memory technology, and can vary across different memory technologies. For NAND technology, the storage parameter is threshold voltage. At least with respect to NAND memory cells, a threshold voltage of a memory cell is a voltage applied to a control gate of the memory cell at which the memory cell becomes conductive. The level (otherwise referred to as the value or magnitude) of the threshold voltage depends on or is proportional to the amount of electrical charge that the memory cell is storing or trapping. The more charge that a memory cell is storing, the higher its threshold voltage, and the less charge that a memory cell is storing, the lower its threshold voltage. Accordingly, the data value that the memory cell is storing is set by setting the threshold voltage of the memory cell to a certain level, and the data value is adjusted or changed by changing the threshold voltage to a different level or within a different range of levels.

In addition, for NAND technology, the memory cells store data by being configured in memory states. As used herein, a memory state is an identifier that identifies a data value of data that a memory cell is storing, can store, or is intended to store. A storage scheme identifies or defines an associated plurality or set of memory states at which a memory cell can be configured. Each memory state identifies, corresponds to, and/or is associated with one of the plurality of data values identified or defined by the storage scheme. Accordingly, a memory cell configured in a given memory state is storing a data value that corresponds to the given memory state. A memory cell can store a different data value by being configured into a different memory state.

For a given storage scheme, the memory states include an erased state and one or more program states. An erased state is a memory state in which a memory cell is configured when erased. For at least some example configurations, the erased state is the memory state that all of a collection of memory cells are in at the start of a program operation to program at least some of the memory cells of the collection. A program state is a memory state that a memory cell is in after being subjected to a program operation. At a given point in time, a memory cell may be in the erased state or one of the program states.

In addition, for a given storage scheme, each memory state has, corresponds to, or is associated with an associated range of threshold voltage levels, with each range being bounded by an upper threshold voltage level and a lower threshold voltage level. Otherwise stated, a given storage scheme may define a plurality of non-overlapping threshold voltage ranges, with each range being associated with or corresponding to a respective one of the plurality of memory states defined or identified by the given storage scheme. In turn, each range has, corresponds to, or is associated with a respective one of the data values. In this way, a storage scheme establishes a one-to-one correspondence between the threshold voltage ranges, the memory states, and the data values. Memory cells are programmed and read according to the one-to-one correspondence. That is, a memory cell configured with a threshold voltage level within a given threshold voltage range is configured in the memory state associated with the given threshold voltage range, and in turn is storing data having a data value that is associated with the given threshold voltage range and the corresponding memory state.

For particular embodiments, the erased state is associated with the lowest threshold voltage range. The program states are associated with consecutively or sequentially higher threshold voltage ranges from the range associated with the erased state.

In addition, the storage schemes may label or name the memory states in any of various ways, including alphabetically, numerically, or alphanumerically, as non-limiting examples. In particular example configurations, the erased state is called the erased state, and the program states are named with letters, numbers, or a combination thereof by associating higher letters in the alphabet or higher numbers with higher threshold voltage ranges. As illustrations, a memory state C is associated with a higher threshold voltage range than a memory state A, and a memory state 8 is associated with a higher threshold voltage range than a memory state 1. Various ways of labeling or naming memory states are possible.

In addition, memory states may be referred to as being higher memory states and lower memory states relative to each other. A first memory state is a higher memory state than a second memory state where the first memory state is associated with a higher threshold voltage range than the threshold voltage range with which the second memory state is associated. In addition, a first memory state is a lower memory state than a second memory state where the first memory state is associated with a lower threshold voltage range than the threshold voltage range with which the second memory state is associated.

In addition, the way in which the data values correspond to the memory states and/or the threshold voltage ranges may vary, and in particular embodiments, how the data values correspond to or are assigned to the memory states and/or threshold voltage ranges may depend on a particular code scheme, such as the Gray code scheme, for example.

In implementation, a collection of memory cells programmed into the same memory state may have an associated collection of threshold voltage as a result of the programming. The threshold voltages may be represented as a threshold voltage probability distribution, or just threshold distribution of the number of memory cell in the collection as a function of threshold voltage.

A given storage scheme may have a model, reference, ideal, or target threshold voltage distribution, which may be in the form of a continuous probability distribution, such as a Gaussian distribution, for example, for each of the memory states and associated threshold voltage ranges defined by the given storage scheme. A model threshold voltage distribution may represent a model of an ideal threshold voltage distribution for a collection of memory cells programmed into the same memory state to have. The lower and upper tails of the model threshold voltage distributions may align or correspond to the upper and lower threshold voltage levels of the ranges with which each of the model threshold voltage distributions is associated.

Figure 5A:
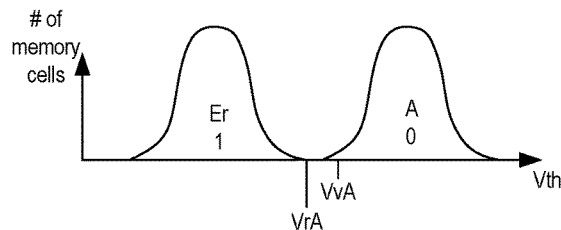
FIG. 5A is a plot of threshold voltage distribution curves for memory cells storing one bit of data per cell.
Figure 5B:
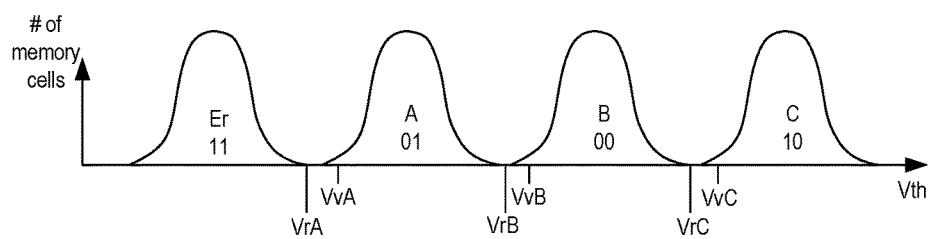
FIG. 5B is a plot of threshold voltage distribution curves for memory cells storing two bits of data per cell.
Figure 5C:
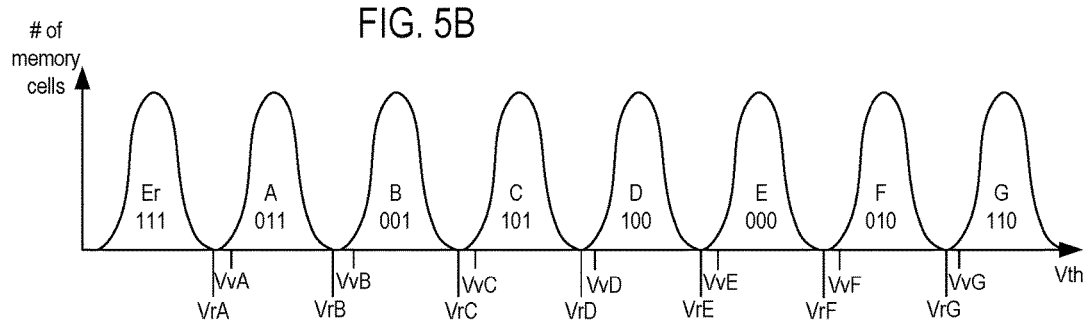
FIG. 5C is a plot of threshold voltage distribution curves for memory cells storing three bits of data per cell.
Figure 5D:
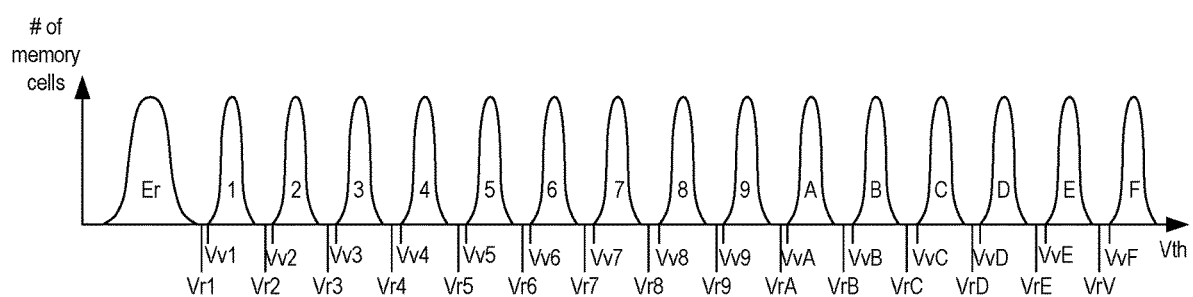
FIG. 5D is a plot of threshold voltage distribution curves for memory cells storing four bits of data per cell.

FIGS. 5A-5D are plots of threshold voltage distribution curves for different storage schemes for storing different numbers of bits into memory cells. The threshold voltage distribution curves are plotted for numbers of memory cells as a function of threshold voltage Vth. In addition, FIGS. 5A-5D show the memory state, the data value, and the threshold voltage range with which each threshold voltage distribution curve is associated. FIG. 5A shows threshold voltage distribution curves for an SLC storage scheme for storing one bit of data per memory cell. FIGS. 5B-5D show threshold voltage distribution curve for MLC storage schemes. In particular, FIG. 5B shows threshold voltage distribution curves for an MLC storage scheme for storing two bits of data per memory cell; FIG. 5C shows threshold voltage distribution curves for an MLC storage scheme for storing three bits of data per memory cell; and FIG. 5D shows voltage distribution curves for an MLC storage scheme for storing four bits of data per memory cell. Similar threshold voltage distribution curves may be defined or generated for other storage schemes used for storing numbers of bits other than (such as more than) two, three, or four bits-per-cell.

With reference to FIG. 5A, for memory cells configured to store one bit of data, each of the memory cells may be configured in an erase state Er or a program state A. With reference to FIG. 5B, for memory cells configured to store two bits of data, each of the memory cells may be configured in an erase state Er or one of three program states A, B, C. With reference to FIG. 5C, for memory cells configured to store three bits, each of the memory cells may be configured in an erase state Er or one of seven program states A, B, C, D, E, F, G. With reference to FIG. 5D, for memory cells configured to store four bits, each of the memory cell may be configured in an erase state Er or one of fifteen program states 1, 2, 3, 4, 5, 6, 7, 8, 9, A, B, C, D, E, F. As shown in FIGS. 5A-5D, each voltage distribution curve is associated with the erase state or one of the program states. Also, herein, the terms "memory state" and "program state" are used interchangeably. For example, the terms "memory state A" and "program state A" are used interchangeably to refer to the same memory state.

In addition, in FIGS. 5A-5D, the associated memory state and data value is included within or under each of the threshold voltage distribution curves. For example, FIG. 5A shows the left threshold voltage distribution curve as being associated with the erased state Er and a logic 1 value, and the right threshold voltage distribution curve as being associated with memory state A and a logic 0 value. For the example MLC storage schemes depicted in FIGS. 5B-5D, the data values sequentially change with increasing memory states and threshold voltage ranges according to a Gray code scheme. For example, with reference to FIG. 5B, memory cells configured in the erase state Er store data value "11"; memory cells configured in memory state A store data value "01"; memory cells configured in memory state B store data value "00"; and memory cells configured in memory state B store data value "10." Similar relationships or correspondences between data values, memory states, and threshold voltage ranges can be made for memory cells programmed to store three bits (FIG. 5C), four bits (FIG. 5D), or more than four numbers of bits-per-cell.

In addition, as illustrated in FIGS. 5A-5D, each program state is associated with a respective verify voltage pulse level (or just verify pulse level) Vv and a read voltage pulse level (or just read pulse level) Vr. For example, with respect to the storage schemes of FIGS. 5A-5D, a verify pulse level VvA and a read pulse level VrA are associated with memory state A, verify pulse level VvB and read pulse level VrB are associated with memory state B, and verify pulse level VvC and read pulse level VrC are associated with memory state C. Similar verify and read pulse levels Vv, Vr are associated with other memory states, such as memory states D-G and memory states 1-9, as depicted in FIGS. 5C and 5D.

As shown in FIGS. 5A-5D, the verify and read pulse levels Vv, Vr specify or are positioned relative to lower bounds or tails of the threshold voltage distribution curves. As described in further detail below, the verify pulse levels Vv may be used to set levels of selected word line voltages during program operations in order to verify program statuses of the memory cells, and the read pulse levels Vr may be used to set levels of selected word line voltages during read operations in order to read data from the memory cells.

Referring back to FIG. 2B, the memory die 104 may further include a read/write circuit 144 that includes a plurality or a p-number of sense blocks (also referred to as sense modules or sense systems) 146. As described in further detail below, the sense blocks 146 are configured to participate in reading data from or programming data into word line cell groups of memory cells in parallel.

The memory die 104 may also include a row address decoder (or just row decoder) 148 and a column address decoder (or just column decoder) 150. The row decoder 148, which may also be referred to as a word line decoder, an x decoder, or an x-wire decoder, may decode a row address (also referred to as a word line address or an x address), and select a particular word line in the memory cell structure 142 corresponding to and/or identified by the decoded row address when reading data from or programming/writing data into to the memory cell structure 142. The column decoder 150, which may also be referred to as a bit line decoder, a y decoder, or a y-wire decoder, may decode a column address (also referred to as a bit line address or a y address), and select a particular bit line or group of bit lines in the memory cell structure 142 corresponding to and/or identified by the column address, when reading data from or programming data to the memory cell structure 142.

In addition, the non-volatile memory die 104 may include a peripheral circuit 152. The peripheral circuit 152 may include a control logic circuit (also referred to as a control logic, an on-chip controller, or an on-die controller) 154, which, at least in some example embodiments, may be implemented as a state machine, that is configured to control on-chip memory operations as well as send status information to the controller 102. The peripheral circuit 152 may also include an on-chip address decoder 156 that provides an address interface between addressing used by the controller 102 and/or a host and the addressing used by the row and column decoders 148, 150. In addition, the peripheral circuit 152 may include volatile memory 158. An example configuration of the volatile memory 158 may include latches, although other configurations are possible.

In addition, the peripheral circuit 152 may include a power control circuit 160 that is configured to generate and supply control line voltages (including voltage pulses) to control lines of the memory cell structure 142. The control line voltages include control gate line voltages supplied to control gate layers, bit line voltages supplied to bit lines, and supply line voltages supplied to supply lines. The control gate line voltages include word line voltages supplied to the word lines, drain select gate line voltages (SGD line voltages) supplied to the SGD lines, and source select gate line voltages (SGS line voltages) supplied to the SGS lines. The power control circuit 160 also be configured to generate and/or supply voltages other than the control lines voltages, including other voltages that may be supplied to the memory cell structure 142, the read/write circuits 144, the sense blocks 146, and/or other circuit components on the memory die 104.

The power control circuit 160 may include any of various circuit topologies or circuit configurations to generate and/or supply the voltages at appropriate levels to perform memory operations, (including read, program/write, sense, and erase operations), such as driver circuits, current sources, charge pumps, reference voltage generators, regulators, and pulse generation circuits, or any of various combinations thereof. Other types of circuits to generate the voltages may be possible. In addition, the power control circuit 160 may communicate with and/or be controlled by the control logic circuit 154, the read/write circuits 144, and/or the sense blocks 146 in order to supply the voltages at appropriate levels and at appropriate times to carry out the memory operations.

Figure 6:
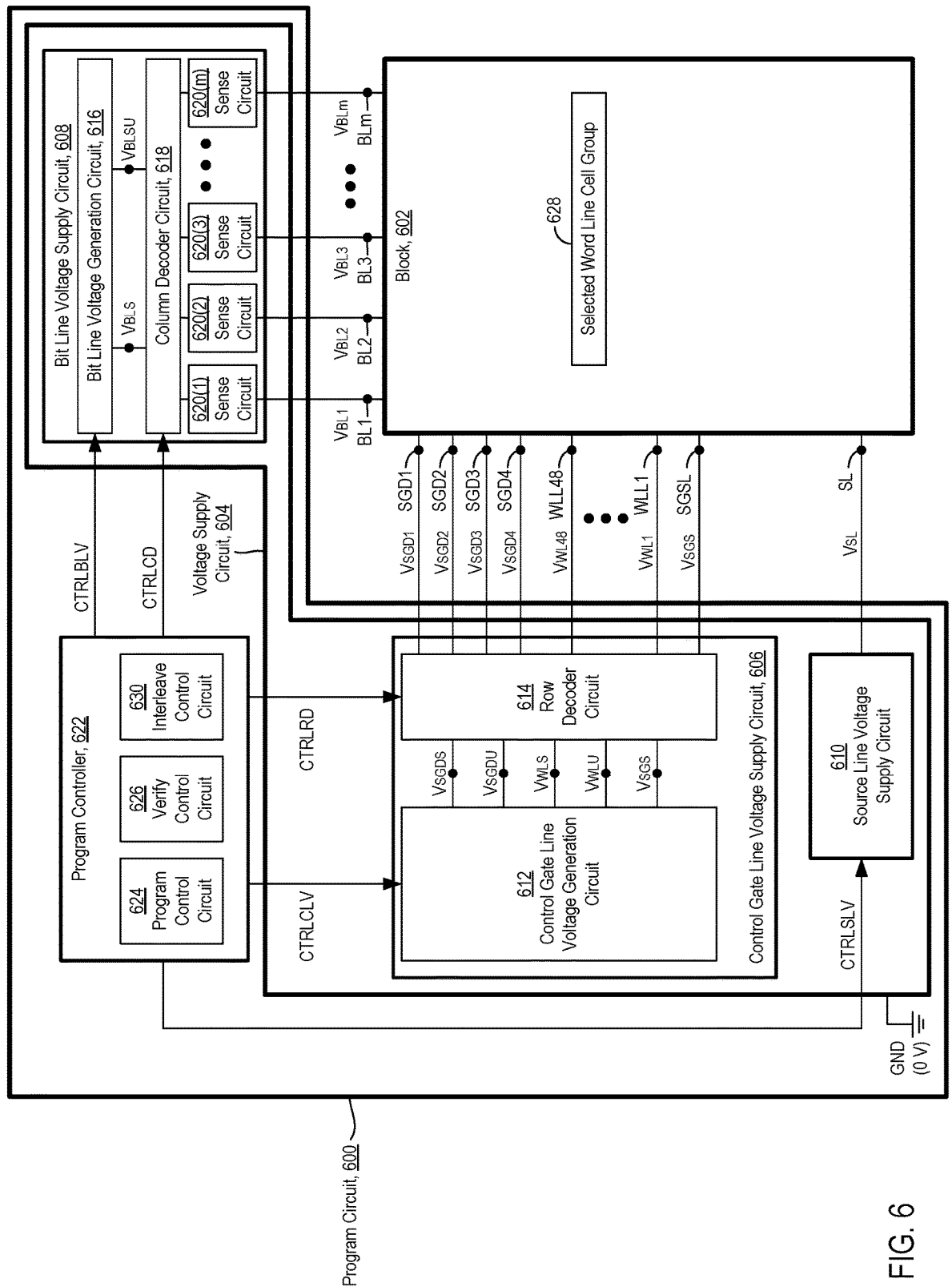
FIG. 6 is a block diagram of an example program circuit of the memory die of FIG. 2B configured to program data into blocks.

FIG. 6 is a block diagram of an example program circuit 600 configured to perform program operations to program (write) data into a block 602. As used herein, a program circuit is a circuit, or a collection of circuits or circuit components, that programs or writes data into memory cells. In addition, for at least some example embodiments, a program circuit can verify the program status of memory cells that it programs. In particular example embodiments, a program circuit is located on the same memory die as the memory cells that it programs and/or verifies. Also, as used herein, a program operation (otherwise referred to as a write operation) is a sequence of steps that a program circuit performs to change an electrical and/or magnetic characteristic of memory cells such that the changed electrical and/or magnetic characteristic of one or more memory cells represents a data value.

The block 602 may be a block of the memory cell structure 142 of FIG. 2B, one of the blocks BLK in FIG. 3A, 3B, or 4A, have the physical construction or structure of the block 410 in FIGS. 4B, 4C, and/or have the circuit configuration of the block 480 in FIG. 4D. The block 602 includes a plurality of control lines, including a plurality of control gate line layers (or just control gate lines), a plurality of bit lines BL, and a source line SL. Corresponding to the block 480 of FIG. 4D, the block 602 includes an m-number of bit lines BL1 to BLm, and the control gate layers include four SGD lines SGD1, SGD2, SGD3, SGD4; forty-eight word line layers (or just word lines) WLL1 to WLL48; and an SGS line/layer SGSL.

The bit lines BL are configured to generate bit line voltages $V_{BL}$ (also or alternatively referred to as drain voltages, drain-side channel voltages, or drain-side voltages) and apply the bit line voltages $V_{BL}$ to channels and associated NAND strings of the block 602. Each bit line BL is configured to generate a respective bit line voltage and apply the respective bit line voltage to an associated set of channels and associated NAND strings. As examples, a first bit line BL1 is configured to generate a first bit line voltage $V_{BL1}$ and apply the first bit line voltage $V_{BL1}$ to a first set of channels and associated NAND strings; a second bit line BL2 is configured to generate a second bit line voltage $V_{BL2}$ and apply the second bit line voltage $V_{BL2}$ to a second set of channels and associated NAND strings; a third bit line BL3 is configured to generate a third bit line voltage $V_{BL3}$ and apply the third bit line voltage $V_{BL3}$ to a third set of channels and associated NAND strings; and an mth bit line BLm is configured to generate an mth bit line voltage $V_{BLm}$ and apply the mth bit line voltage $V_{BLm}$ to an mth set of channels and associated NAND strings. The other bit lines BL4 to BL(m−1) not shown in FIG. 6 are similarly configured to generate respective bit line voltages and apply their respective bit line voltages to associated sets of channels and NAND strings.

In addition, the control gate lines are configured to generate control gate voltages and apply the control gate voltages to control gates of the bias elements to which the control gate lines are respectively coupled. As examples, a first SGD line SGD1 is configured to generate a first SGD line voltage $V_{SGD1}$ and apply the first SGD line voltage $V_{SGD1}$ to control gates of SGD transistors coupled to the first SGD line SGD1; a second SGD line SGD2 is configured to generate a second SGD line voltage $V_{SGD2}$ and apply the second SGD line voltage $V_{SGD2}$ to control gates of SGD transistors coupled to the second SGD line SGD2; a third SGD line SGD3 is configured to generate a third SGD line voltage $V_{SGD3}$ and apply the third SGD line voltage $V_{SGD3}$ to control gates of SGD transistors coupled to the third SGD line SGD3; and a fourth SGD line SGD4 is configured to generate a fourth SGD line voltage $V_{SGD4}$ and apply the fourth SGD line voltage $V_{SGD4}$ to control gates of SGD transistors coupled to the fourth SGD line SGD4. In addition, a first word line WLL1 is configured to generate a first word line voltage $V_{WL1}$ and apply the first word line voltage $V_{WL1}$ to control gates of memory cells coupled to the first word line WLL1; and a forty-eighth word line WLL48 is configured to generate a forty-eighth word line voltage $V_{WL48}$ and apply the forty-eighth word line voltage $V_{WL48}$ to control gates of memory cells coupled to the forty-eighth word line WLL48. The other word lines WLL2 to WLL47 not shown in FIG. 6 are similarly configured to generate respective word line voltages and apply their respective word line voltages to memory cells to which the word lines are coupled. In addition, the SGS line SGSL is configured to generate an SGS line voltage $V_{SGS}$ and apply the SGS line voltage $V_{SGS}$ to SGS transistors coupled to the SGS line SGSL. Also, as shown in FIG. 6, the source line SL is configured to generate a source line voltage $V_{SL}$ and apply the source line voltage $V_{SL}$ to source ends of channels and associated NAND strings to which the source line SL is coupled.

The program circuit 600 performs program operations to program data into selected memory cells. As used herein, a selected memory cell of a program operation is a memory cell that is programmed during the program operation. In addition or alternatively, a selected memory cell of a program operation is a memory cell that changes its memory state from an initial memory state to a target memory state during the program operation. An initial memory state of a selected memory cell is the memory state of the memory cell at the start of the program operation. A target memory state is the memory state that the memory cell is to be in at the end of the program operation in order for data to be correctly stored in the memory cell. For at least some program operations, the initial memory state for a selected memory cell is the erase state. For such program operations, a selected memory cell is a memory cell that changes its memory state from the erase state to a program state. In addition or alternatively, a selected memory cell of a program operation is a memory cell that changes a level, value, or state of a storage parameter in order to change its memory state from an initial memory state to a target memory state.

At least for NAND technology, a selected memory cell of a program operation is a memory cell that changes a level of its threshold voltage from an initial threshold voltage level to a target threshold voltage level in order to change its memory state from an initial memory state to a target memory state during the program operation. An initial threshold voltage level of a selected memory cell is the threshold voltage level of the target memory cell at the start of a program operation, and is a threshold voltage level that is within a range of threshold voltage levels that corresponds to the initial memory state of the selected memory cell. A target threshold voltage level of a selected memory cell is a threshold voltage level that is within a range of threshold voltage levels that corresponds to the target memory state of the selected memory cell. In addition, at least for NAND technology, a selected memory cell of a program operation is a memory cell that changes its threshold voltage level from an initial threshold voltage level to a target threshold voltage level in response to at least one program voltage pulse (or just program pulse) during the program operation. Program pulses generated during a program operation are described in further detail below.

In addition, memory cells that are not the subject of a program operation are referred to as unselected memory cells. Otherwise stated, an unselected memory cell of a program operation is a memory cell that is not programmed during a program operation. An unselected memory cell may be a memory cell that stays or remains in its initial memory state throughout the duration of the program operation.

In particular example embodiments, the program circuit 600 confines a program operation to a particular region or portion of the memory cell structure 142. For such embodiments, the selected memory cells include a first portion or first group of the particular region, and the unselected memory cells include a second portion or second group of the particular region.

At least for NAND technology, the program circuit 600 confines a program operation to a block. The selected memory cells of a program operation are part of a first set or group of the memory cells of the block, and the unselected memory cells are part of a second set or group of the memory cells of the block, namely those memory cells that are not the selected memory cells. In particular example embodiments, the selected memory cells of a program operation are disposed in the same word line (or word line layer) and/or are configured to be biased by the same word line (or word line layer). In further particular embodiments, the selected memory cells of a program operation include only those memory cells that are part of the same or a single word line cell group.

The program circuit 600 may perform a program operation over one or more program loops. A program loop, also referred to as a program cycle or a program iteration, is at least a portion of a program operation during which a program circuit performs a discrete set of program actions to move the memory states of selected memory cells into their respective target memory states (the target states represent/encode data values). In certain embodiments, a program loop includes a verify stage configured to determine which cells have reached one or more target states. As described in further detail below, the discrete set of program actions may include applying a discrete set of biases, such voltages or current levels, to control lines of the block 602 in order to change the levels, magnitudes, values, or states of the storage parameters of at least some of the selected memory cells. One of the discrete set of program actions includes applying a program pulse to a selected word line.

In the event that the program circuit 600 is unable to program all of the selected memory cells in a single program loop with a single discrete set of program actions, the program circuit 600 may perform a plurality of program loops, such as sequentially or consecutively, until the selected memory cells are programmed in their respective target memory states. Where the program circuit 600 performs a plurality of program loops to program the selected memory cells into their target memory states, the program circuit 600 may perform a plurality of sets of discrete program actions, each in a different one of the plurality of program loops.

At any given moment in time during a program operation, a selected memory cell can have an associated program status, which can be one of three different program statuses, including a sufficiently programmed status, an insufficiently programmed status, and an over-programmed status. A selected memory cell that has a sufficiently programmed status is a sufficiently programmed memory cell, which is a memory cell that is in or has reached its target memory state. A selected memory cell that has an insufficiently programmed status is an insufficiently programmed memory cell, which is a memory cell that has not yet reached its target memory state. A selected memory cell that has an over-programmed status is an over-programmed memory cell, which is a memory cell that is not in its target memory state, and that cannot be moved into its target memory state through further performance of one or more discrete sets of program actions. A selected memory cell can be over-programmed in situations where it is in its target memory state at the start of a program stage, but is program-enabled instead of program-inhibited, and thus responds to the discrete set of program actions during the program stage. In other situations, a selected memory cell can be over-programmed where the selected memory cell is insufficiently programmed at the start of a program stage, but the discrete set of program actions performed during the program stage changes the storage parameter of the selected memory cell too much such that performance of additional discrete sets of program actions cannot move the storage parameter of the selected memory cell to a level corresponding to the target memory state.

After the program circuit 600 performs a program loop, the program circuit 600 determines whether all of the selected memory cells are sufficiently programmed. If all of the selected memory cells are sufficiently programmed, then the program circuit 600 ends the program operation. Alternatively, if at least one of the selected memory cells is insufficiently programmed, then the program circuit 600 performs a next program loop. The program circuit 600 may iterate through the program loops until the program circuit 600 determines that all of the selected memory cells are sufficiently programmed, or the program circuit 600 identifies that a timeout event has occurred, which causes the program circuit 600 to end the program operation. In one example configuration, the timeout event is a number of program loops reaching a predetermined maximum number of program loops. Other timeout events may be possible.

In addition, the program circuit 600 is configured to perform the discrete set of program actions in or during program stages of the program loops. As used herein, a program stage is at least a portion of a program loop during which a program circuit performs a discrete set of program actions to move at least some selected memory cells into their target memory states.

During a program stage, the program circuit 600 may configure each of the selected memory cells in one of two program bias states, including a program-enable state and a program-inhibit state. The program-enable and program-inhibit states are referred to as bias states in that different biases, such as in the form of voltages having different levels, are applied to bit lines and SGD transistors in order to configure each of the selected memory cells in the program-enable state or the program-inhibit state.

The program-enable state is a program bias state that enables or allows a selected memory cell to respond to a discrete set of program actions by changing a storage parameter associated with the memory states into which the selected memory cell can be programmed. When a selected memory cell is configured in the program-enable state, the program-enabled selected memory cell (which can just be referred to as a program-enabled memory cell), is enabled or allowed to change a level or value of its storage parameter in response to the discrete set of actions.

When the program-enabled memory cell changes its storage parameter in response to a discrete set of program actions during a program stage, the change in the storage parameter may or may not change a present memory state that the memory cell is in at the start of the program stage. That is, in response to a discrete set of program actions, the program-enabled memory cell may stay in the same memory state or change to a new memory state.

As previously described, for NAND technology, the storage parameter of a memory cell is its threshold voltage. When a selected memory cell is configured in the program-enable state, the program-enabled memory cell may respond to a discrete set of program actions by increasing the level of its threshold voltage. The increase in the threshold voltage may keep the selected memory cell in its current memory state or may move the selected memory cell into a new memory state.

The program-inhibit state is a program bias state that inhibits or prevents a selected memory cell from responding to a discrete set of program actions. When a selected memory is configured in the program-inhibit state, the program-inhibited selected memory cell (which can just be referred to as a program-inhibited memory cell), is prevented or inhibited from, or unable to, change a level of its storage parameter when the program circuit 600 performs a discrete set of program actions. Otherwise stated, when the program circuit 600 performs a discrete set of program actions during a program stage, the program-inhibited memory cell keeps a current value or level of its storage parameter unchanged, and in turn, stays in the same memory state. In addition or alternatively to being referred to as a program-inhibited memory cell, a selected memory cell configured in the program-inhibit state may be referred to as a locked-out memory cell in that it is locked out from being programmed during a program stage.

At the start of a program stage, the program circuit 600 may configure each of the selected memory cells in the program-enable state or the program-inhibit state. At the start of a program stage, if a selected memory cell is sufficiently programmed—i.e., it is in or has reached its target memory state—then the program circuit 600 configures the selected memory cell in the program-inhibit state so that the selected memory cell does not change its memory state during the program stage. On the other hand, if a selected memory cell is insufficiently programmed—i.e., it is not yet at or has not yet reached its target memory state—then the program circuit 600 configures the selected memory cell in the program-enable state so that the program-enabled memory cell changes a level of its storage parameter to either move into or at least move closer to its target memory state.

A program loop may be one of various types. One type of program loop is a program-only loop. A program-only loop is a program loop configured to only program selected memory cells. In one embodiment, a program-only loop only includes program stages and does not include other stages. That is, a program-only loop excludes a verification step or a verify stage that would confirm that a selected memory cell is programmed at the target or desired memory state. After the program circuit 600 performs a program stage, the program circuit 600 either ends the program operation, or starts performing a next or another program stage of a next or another program loop without making any express checks or verifications of program statuses of selected memory cells. For program-only loops, the program circuit 600 makes implicit determinations or presumptions of whether a selected memory cell is sufficiently or insufficiently programmed. For example, the program circuit 600 may perform a predetermined number of one or more program stages and/or a predetermined number of one or more program-only loops, and presume that the selected memory cells are sufficiently programmed after performing the predetermined number of program stages or program-only loops.

Figure 7A:
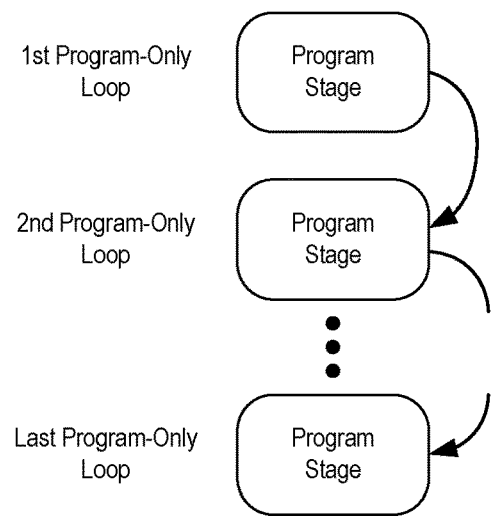
FIG. 7A is a schematic diagram of a program operation performed with program-only loops.

FIG. 7A shows a schematic diagram of a program operation performed with program-only loops. After performing a first program stage of a first program-only loop, the program circuit 600 may proceed directly to performing a next program stage in a second program-only loop. The program circuit 600 may continue to perform program stages in consecutive program-only loops in this manner until the program circuit 600 performs a last program stage in a last program-only loop, after which the program circuit 600 may end the program operation.

Another type of program loop is a program-verify loop. A program-verify loop is a program loop that both programs selected memory cells and checks or verifies program statuses of the selected memory cells being programmed. When the program circuit 600 performs program-verify loops, the program circuit 600 makes determinations of the program statuses of the selected memory cells during verify stages. A verify stage is a portion of a program operation performed to check or verify program statuses of selected memory cells. When performed in conjunction with or as part of a program operation, the verify stage may be considered a sub-operation of the program operation.

In particular implementations, the program circuit 600 performs a single verify stage in one program-verify loop. During a program-verify loop, after performing a program stage, the program circuit 600 performs a verify stage to check or verify whether the selected memory cells are sufficiently programmed before moving on to a next program-verify loop.

Herein, the phrase "verify a memory cell" is used refer to an action or collection of actions that determine a program status of the memory cell, and in particular, whether the memory cell is sufficiently programmed or insufficiently programmed. Also, as used herein, the term "last program stage" when referenced in relation to a particular verify stage, is used to refer to the program stage performed in the same program-verify loop as the particular verify stage, or the program stage that is performed immediately prior to the particular verify stage.

For some example configurations, for a given program-verify loop, the program circuit 600 verifies all of the selected memory cells during the verify stage of the given program-verify loop. For other example configurations, for a given program-verify loop, the program circuit 600 verifies, during the following verify loop, only those selected memory cells that were program-enabled during the last program stage. Since selected memory cells that were program-inhibited during the last program stage are considered to be sufficiently programmed, the program circuit 600 may not need to verify their program statuses, and thus not subject them to the following verify stage. A verify stage consumes power, and so not subjecting certain selected memory cells already determined to be sufficiently programmed may save power.

During a verify stage, the program circuit 600 may configure the selected memory cells in one of two verify bias states, including a verify-enable state and a verify-inhibit state. A verify-enable state is a bias state that enables or allows a selected memory cell to be verified—i.e., enables or allows a program status of the selected memory cell to be determined. When the program circuit 600 configures a selected memory cell in the verify-enable state, the verify-enabled selected memory cell (which can just be referred to as a verify-enabled memory cell) is able or allowed to be verified. A verify-inhibit state is a bias state that prevents or inhibits a selected memory cell from being verified—i.e., prevents or inhibits a program status of the selected memory cell from being determined. When the program circuit 600 configures a selected memory cell in the verify-inhibit state, the verify-inhibited selected memory cell (which can just be referred to as a verify-inhibited memory cell) is prevented or inhibited from being verified. Like the program-enable and program-inhibit states, the verify-enable and verify-inhibit states are referred to as bias states in that the program circuit 600 applies different biases, such as in the form of voltages having different levels, to bit lines and SGD lines in order to configure each of the selected memory cells in the verify-enable state or the verify-inhibit state. In addition or alternatively to being referred to as a verify-inhibited memory cell, a selected memory cell configured in the verify-inhibit state may be referred to as a locked-out memory cell in that it is locked out from being verified during a verify stage.

Figure 7B:
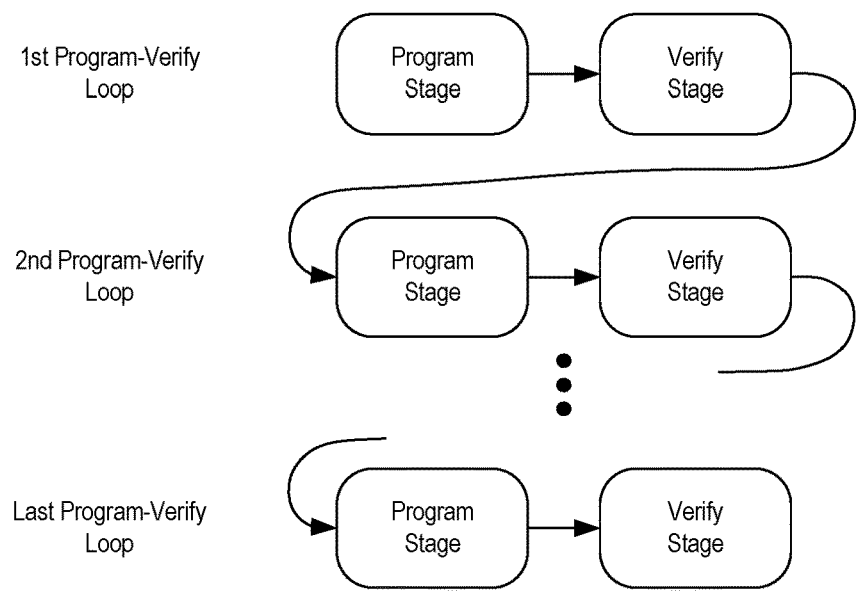
FIG. 7B is a schematic diagram of a program operation performed with program-verify loops.

FIG. 7B shows a schematic diagram of a program operation performed with program-verify loops. After performing a first program stage of a first program-verify loop, the program circuit 600 may perform a first verify stage of the first program-verify loop. After performing the first verify stage, the program circuit proceeds to performing a next program stage followed by a next verify stage in a second program-verify loop. The program circuit 600 may continue to perform program stages followed by verify stages in consecutive program-verify loops in this manner until the program circuit 600 performs a last program stage followed by a last verify stage in a last program-verify loop, after which the program circuit 600 may end the program operation if the last verify stage was successful or a maximum number of program-verify loops is reached.

In some example configurations, when performing a verify stage within or as part of a program-verify loop, the program circuit 600 may separate or divide the verify stage into discrete verify sub-stages. A verify sub-stage is at least a portion of a verify stage during which the program circuit 600 performs a discrete set of verify actions to verify selected memory cells that have a common target memory state. As described in further detail below, the discrete set of verify actions may include applying a discrete set of biases, such as voltages, to the control lines of the block in order to verify the selected memory cells having the same target memory state. The discrete set of verify actions may also include performing sense operations to sense program statuses of the selected memory cells having the same target memory state. For a given program-verify loop, the program circuit 600 verifies selected memory cells that have the same target memory state in the same verify sub-stage, and verifies selected memory cells that have different target memory states in different verify sub-stages.

By dividing or separating a verify stage into different verify sub-stages, the program circuit 600 associates each verify sub-stage with a different one of the plurality of memory states that the selected memory cells can have. The memory state associated with a given verify sub-stage is referred to as the associated memory state of the given verify sub-stage.

For a given verify sub-stage with an associated memory state, the program circuit 600 verifies those selected memory cells that have target memory states that match or that are the same as the associated memory state of the given verify sub-stage. In addition, the program circuit 600 may not verify those selected memory cells that have target memory states that do not match or that are different from the associated memory state of the given verify sub-stage, and instead verifies those selected memory cells during one or more other verify sub-stages of the verify stage.

A selected memory cell that has a target memory state that matches or is the same as an associated memory state of a given verify sub-stage is referred to as a matched memory cell of the given verify stage. In addition, a selected memory cell that has a target memory state that does not match or that is different from the associated memory state of the given verify sub-stage is referred to as unmatched memory cell of the given verify sub-stage. Among the selected memory cells of a program operation, each of the selected memory cells is a matched memory cell for one of the verify sub-stages, and is an unmatched memory cell for the other verify sub-stages. For at least some example configurations, the program circuit 600 verifies only matched memory cells during a given sub-verify stage by configuring matched memory cells in the verify-enable state while configuring unmatched memory cells in the verify-inhibit state during the given verify sub-stage.

To perform a verify stage, the program circuit 600 performs or executes the verify sub-stages sequentially in a predetermined verify order. The verify order may be an order of memory states, such as memory state A, memory state B, memory state C, and so on. Where a given memory state is positioned in the verify order determines when the program circuit 600 performs a given verify sub-stage associated with the given memory state relative to when the program circuit 600 performs the other verify sub-stages. For example, if memory state A is the first memory state in the verify order, the verify stage associated with memory state A is the first verify sub-stage that the program circuit 600 performs in the verify stage.

For a verify stage that includes a plurality of verify sub-stages, the program circuit 600 sequentially performs or executes the verify stage by sequentially transitioning from one verify sub-stage to another verify sub-stage according to the verify order. When the program circuit 600 ends a current verify sub-stage, the program circuit 600 identifies a next verify sub-stage in the verify order as the current verify sub-stage, and begins performing the new current verify sub-stage. The program circuit 600 sequentially performs the verify sub-stages in this manner until a last verify sub-stage in the verify order is performed.

As the program circuit 600 transitions from a current verify sub-stage associated with a first memory state to a next verify sub-stage associated with a second memory state according to the verify order, those selected memory cells that were matched memory cells in the current verify sub-stage transition from matched memory cells to unmatched memory cells in the next verify sub-stage. For some example configurations of performing verify stages, the program circuit 600 changes those memory cells that transition from matched to unmatched by changing their configuration from the verify-enable state to the verify-inhibit state. In addition, those selected memory cells that were unmatched memory cells in the current verify sub-stage but now have target memory states that match the second memory state of the next verify sub-stage transition from unmatched memory cells to matched memory cells. For some examples configurations, the program circuit 600 changes those memory cells that transition from unmatched to matched by changing their configuration from the verify-inhibit state to the verify-enable state. Also, some selected memory cells that were unmatched memory cells in the current verify sub-stage and still have target memory states that do not match the second memory state in the next verify sub-stage stay as unmatched memory cells. For some example configurations, the program circuit 600 keeps those memory cells configured in the verify-inhibit state.

In addition, for some example configurations, the transitioning between matched and unmatched memory cells during a verify stage pertains to only those selected memory cells that were program-enabled during the last program stage. For those selected memory cells that were program-inhibited during the last program stage, the program circuit 600 may keep them configured in the verify-inhibit state throughout the duration of the verify stage, regardless of whether their respective target memory states match an associated memory state of a given verify sub-stage. For other example configurations, the transitioning between matched and unmatched memory cells during a verify stage pertains also to selected memory cells that were not program-enabled—i.e., that were program-inhibited—during the last program stage. That is, for these other example configurations, even if a selected memory cell is configured in the program-inhibit state during the last program stage, the program circuit 600 configures the selected memory cell in the verify-enable state for a given verify sub-stage if the selected memory cell is a matched memory cell for the given verify sub-stage.

In addition, for at least some example configurations, the program circuit 600 may not perform all of the verify sub-stages for every program-verify loop. Which verify sub-stages are performed can change from loop to loop. One way that the verify sub-stages can change is by completing programming for a given target memory state. If those selected memory cells having the same target memory state are all sufficiently programmed, the program circuit 600 configures them all in the verify-inhibit state for the remainder of the verify stages, and skips the verify sub-stage associated with that target memory state for the remainder of the verify stages. Another way that the verify sub-stages can change is by reaching predetermined threshold numbers of program-verify loops. In some example configurations, it may be impossible or at least statistically unlikely that the program circuit 600 can sufficiently program a selected memory cell before the program circuit 600 performs a predetermined number of discrete program actions. To save time, the program circuit 600 may skip or omit a verify sub-stage associated with the certain target memory cell from earlier verify stages of the program operation. For example, an initial predetermined number of program-verify loops may have verify orders that exclude one or more certain verify sub-stages. Then, after the program circuit 600 performs a predetermined or threshold number of program-verify loops, the program circuit 600 may add the one or more certain verify sub-stages to verify orders of subsequent program-verify loops.

As a brief illustration, suppose the program circuit 600 is programming a plurality of selected memory cells according to a three bits-per-cell storage scheme. The program circuit 600 may exclude verify sub-stages associated with higher memory states, such as memory state D and above for a predetermined n-number of program-verify loops. Then, once the program operation reaches the (n+t)th program-verify loop, the program circuit 600 starts performing verify sub-stages associated with memory state D, and possible one or more other higher memory states, such as memory state E, for example. Then, after performing a predetermined p-number of program-verify loops, where p is greater than n, the program circuit 600 starts performing verify sub-stages associated with further higher memory states, such as memory states F and G, for example. Various ways of configuring the program circuit 600 to add verify sub-stages associated with higher memory states for later-performed program-verify loops may be possible.

Figure 7C:
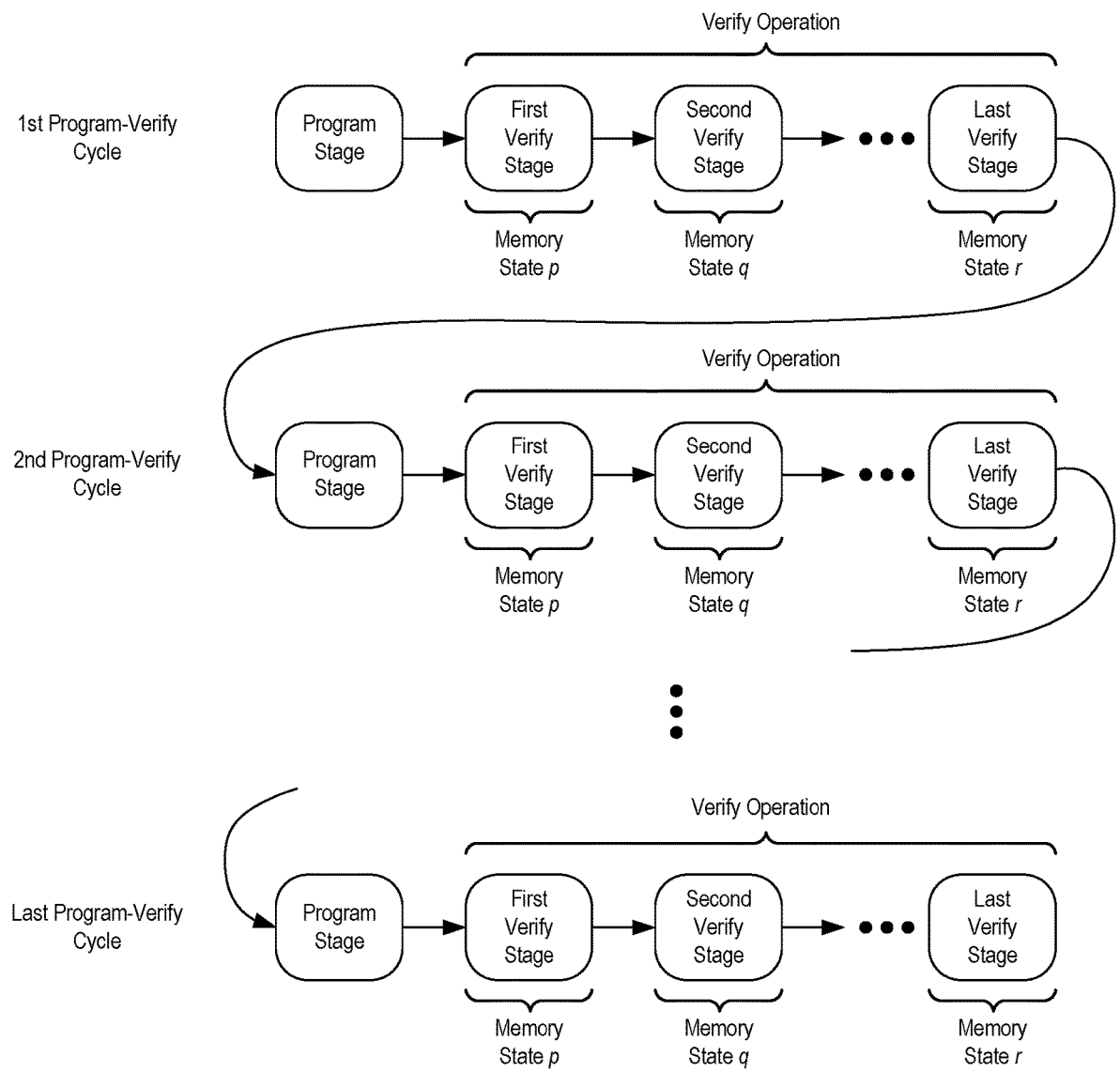
FIG. 7C is a schematic diagram of a program operation performed with program-verify loops, illustrating verify stages separated into verify sub-stages.

FIG. 7C shows a schematic diagram of a program operation performed with program-verify loops. The program circuit 600 may begin the program operation by performing a first program stage of a first program-verify loop. After performing the first program stage, the program circuit 600 may transition to the verify stage of the first program-verify loop by performing a first or initial verify sub-stage of the verify stage. After performing the first verify sub-stage, the program circuit 600 may proceed to the second verify sub-stage. The program circuit 600 may proceed in this manner by consecutively performing verify sub-stages in accordance with a verify order associated with the first program-verify loop until it performs a last verify sub-stage of the verify stage of the first program-verify loop.

During or after performance of the verify stage of the first program-verify loop, the program circuit 600 may determine which of the selected memory cells are sufficiently programmed as a result of performing the first program sub-stage in the first program-verify loop. If all of the selected memory cells are not sufficiently programmed, then the program circuit 600 may proceed or transition to the second or next program-verify loop. The program circuit 600 may start the second or next program-very loop by performing a program stage of the program-verify loop. After performing the program stage, the program circuit 600 may perform the verify stage of the second program-verify loop by consecutively performing the verify sub-stages in accordance with the verify order of the second program-verify loop. After performing the last verify sub-stage, if there are still memory cells that are insufficiently programmed, the program circuit 600 may proceed to a third program-verify sub-stage. The program circuit 600 may proceed in this manner by consecutively performing program-verify loops until the selected memory cells are sufficiently programmed following a last program-verify loop.

As shown in FIG. 7C, the first, second, and last verify stages of each of the program-verify loops are associated with memory states p, q, and r, respectively. Memory states p, q, and r represent any of various memory states into which selected memory cells can be programmed. The memory states p, q, and r can be the same or different from each other for the different program-verify loops depending on the verify orders of those program-verify loops. In particular example configurations, the memory states p, q, and r may correspond to increasing or ascending threshold voltage ranges, with memory state q corresponding to a higher threshold voltage range than memory stage p, and memory state r corresponding to a higher threshold voltage range than memory states p and q.

For at least some example configurations, during a given program-verify loop, when performing the first memory sub-stage associated with memory state p, the program circuit 600 may configure those selected memory cells having memory state p as their target memory states as verify-enabled memory cells and configure the other selected memory cells as program-inhibited or locked out memory cells. The program circuit 600 may then verify the selected memory cells with target memory state p during the first verify sub-stage. When transitioning to the second verify sub-stage associated with memory state q, the program circuit 600 may configure those selected memory cells having memory state p as their target memory state in the verify-inhibit state, and configure those selected memory cells having memory state q as their target memory state in the verify-enable state. The program circuit 600 may keep those selected memory cells having memory state r as their target memory state in the verify-inhibit state. The program circuit 600 may perform similar actions when transitioning to the last verify sub-stage associated with memory state r.

Referring back to FIG. 6, the program circuit 600 may perform discrete sets of program actions during program stages and discrete sets of verify actions during verify sub-stages, as previously described. At least for NAND technology, a set of program actions that the program circuit 600 performs during a given program stage includes biasing the control gates and channels of a block with a set of program voltages. Each program voltage may be at one of a plurality of program levels associated with the given program stage. In addition, a set of verify actions that the program circuit 600 performs during a given verify sub-stage includes biasing the control gates and channels of a block with a set of verify voltages. Each verify voltage may be at one of a plurality of verify levels associated with the given verify sub-stage. Also, as described in further detail below, a discrete set of verify actions performed during a given verify sub-stage also includes performing sense operations to sense program statuses of selected memory cells having a target memory state that matches the memory state associated with the given verify sub-stage.

With respect to a program stage, the set of program voltages with which the program circuit 600 biases the control gates and channels includes a program selected memory cell gate voltage, a program unselected memory cell gate voltage, a program selected SGD gate voltage, a program unselected SGD gate voltage, a program SGS gate voltage, a program selected drain-side voltage, a program unselected drain-side voltage, and a program source-side voltage. The program circuit 600 biases control gates of selected memory cells with a program selected memory cell gate voltage during a program stage to move selected memory cells into or toward their target memory states, such as by increasing their respective threshold voltages. The program circuit 600 biases, with the program unselected memory cell gate voltage, control gates of unselected memory cells during a program stage. The program circuit 600 biases, with the program selected SGD gate voltage, control gates of SGD transistors coupled to selected memory cells during a program stage. The program circuit 600 biases, with the program unselected SGD gate voltage, control gates of SGD transistors coupled to unselected memory cells during a program stage. The program circuit 600 biases, with the program SGS gate voltage, control gates of SGS transistors during a program stage. The program circuit 600 biases, with the program selected drain-side voltage, drain ends of channels coupled to program-enabled memory cells during a program stage. The program circuit 600 biases, with the program unselected drain-side voltage, drain ends of channels coupled to program-inhibited memory cells during a program stage. The program circuit 600 biases, with the program source-side voltage, the source ends of channels during a program stage.

With respect to a verify sub-stage, the set of verify voltages with which the program circuit 600 biases the control gates and channels includes a verify selected memory cell gate voltage, a verify unselected memory cell gate voltage, a verify selected SGD gate voltage, a verify unselected SGD gate voltage, a verify SGS gate voltage, a verify selected drain-side voltage, a verify unselected drain-side voltage, and a verify source-side voltage. The program circuit 600 biases control gates of selected memory cells with the verify selected memory cell gate voltage during a verify sub-stage. The program circuit 600 biases, with the verify unselected memory cell gate voltage, control gates of unselected memory cells during a verify sub-stage. The program circuit 600 biases, with the verify selected SGD gate voltage, control gates of SGD transistors coupled to selected memory cells during a verify sub-stage. The program circuit 600 biases, with the verify unselected SGD gate voltage, control gates of SGD transistors coupled to unselected memory cells during a verify sub-stage. The program circuit 600 biases, with the verify SGS gate voltage, control gates of SGS transistors during a verify sub-stage. The program circuit 600 biases, with the verify selected drain-side voltage, drain ends of channels coupled to verify-enabled memory cells during a verify sub-stage. The program circuit 600 biases, with the verify unselected drain-side voltage, drain ends of channels coupled to verify-inhibited memory cells during a verify sub-stage. The program circuit 600 biases, with the verify source-side voltage, the source ends of channels during a verify sub-stage.

The program circuit 600 is configured to bias the control gates and channels with the program and verify voltages during the program and verify stages by way of the control lines of the block 602, including the control gate lines SGD, WLL, SGSL, the bit lines BL, and the source line SL. In particular, the program circuit 600 is configured to bias the control gates of the memory cells, the SGD transistors, and the SGS transistors with the program and verify gate voltages by way of the word lines WLL, the SGD lines, and the SGS line, respectively. The program circuit 600 is configured to bias the drain ends of the channels with the program and verify drain-side voltages. The program circuit 600 is configured to bias the source ends of the channels with the program and verify source-side voltages.

In this context, the program and verify voltages are also or alternatively referenced or labeled with respect to the control lines biasing the control gates and channels. In particular, the program and verify selected memory cell gate voltages are referred to as program and verify selected word line voltages, the program and verify unselected memory cell gate voltage are referred to as program and verify unselected word line voltages, the program and verify selected drain-side voltages are referred to as program and verify selected bit line voltages, the program and verify unselected drain-side voltages are referred to as program and verify unselected bit line voltages, the program and verify unselected source-side voltages are referred to as program and verify source line voltages, the program and verify SGS gate voltages are referred to as program and verify SGS line voltages, the program and verify selected SGD gate voltages are referred to as program and verify selected SGD line voltages, and the program and verify unselected SGD gate voltages are referred to as program and verify unselected SGD line voltages.

In order to bias the control lines of the block, and in turn the control gates and the channels with the program and verify voltages, the program circuit 600 may include a voltage supply circuit 604 that supplies the program and verify voltages to the control lines. Through supply of the program and verify voltages to the control lines, the voltage supply circuit 604 applies the program and verify voltages to the control lines, biases the control lines with the program and verify voltages, and/or generates the program or verify voltage on the control lines. From the perspective of the control lines, a control line receives, is supplied with, or is biased with a program or verify voltage from the voltage supply circuit 604, biases respective control gates or channels with the program or verify voltage it receives, applies the program or verify voltage it receives to respective control gates or channels, generates a program or verify voltage in response to receipt of the program or verify voltage it receives from the voltage supply circuit 604, generates the program or verify voltage at a level of the program or verify voltage it receives, applies the program or verify voltage it generates to a respective control gate or channel, or biases a respective control gate or channel with the program or verify voltage it generates in response to the program or verify voltage it receives. These terms and phrases to describe how the program circuit 600 biases the control gates and channels of the block 602 with the program and verify voltages through supply of the program and verify voltages to the control lines of the block 602 are generally used interchangeably herein, unless expressly described otherwise.

As indicated in FIG. 6, the voltage supply circuit 602 may be configured to generate the program and verify voltages, and/or cause the control lines to generate their respective voltages at levels relative to a ground reference GND having a ground reference voltage level of 0 V. However, some voltages during some of the program or verify stages may be generated at levels referenced to a different reference point other than the ground reference GND, such as the source line SL for example. Herein, voltage levels may be presumed to be indicated with reference to the ground reference voltage level of 0 V, unless expressly described otherwise.

In the example configuration in FIG. 6, the voltage supply circuit 604 includes three voltage supply circuits that supply the program and verify voltages to the control lines, including a control gate line voltage supply circuit 606, a bit line voltage supply circuit 608, and a source line voltage supply circuit 610. The control gate line voltage supply circuit 606 is configured to supply or apply the program and verify gate voltages to the control gate lines of the block 602. In particular, the control gate line voltage supply circuit 606 is configured to supply the program and verify selected and unselected word line voltages to the word lines WLL, the program and verify selected and unselected SGD line voltages to the SGD lines, and the program and verify SGS line voltages to the SGS line. The bit line voltage supply circuit 608 is configured to supply or apply the program and verify selected and unselected bit line voltages to the bit lines BL of the block 602. The source line voltage supply circuit 610 is configured to supply or apply the program and verify source line voltages to the source line SL of the block 602. Other ways of configuring the voltage supply circuit 604 may be possible.

In addition, in the example configuration in FIG. 6, the control gate line voltage supply circuit 606 and the bit line voltage supply circuit 608 each include two circuit components, a voltage generation circuit and a decoder circuit. In general, a voltage generation circuit generates voltages supplied to control lines, and a decoder circuit selectively routes the generated voltages to the control lines.

In further detail, the control gate line voltage supply circuit 606 includes a control gate line voltage generation circuit 612 and a row decoder circuit 614. The control gate voltage generation circuit 612 may represent at least a portion of the power control circuit 160 of FIG. 2B. The row decoder circuit 614 may represent at least a portion of the row decoder 148 of FIG. 2B.

The control gate voltage generation circuit 612 is configured to generate a plurality or a set of control gate line voltages, including a selected word line voltage $V_{WLS}$, an unselected word line voltage $V_{WLU}$, a selected SGD line voltage $V_{SGDU}$, an unselected SGD line voltage $V_{SGDU}$, and a SGS line voltage $V_{SGS}$. For simplicity, the control gate line voltages generated by the control gate line voltage generation circuit 612 are not separated into distinct program control gate line voltages and verify control gate line voltages. Instead, the control gate line voltage generation circuit 612 is shown in FIG. 6 as generating a single set of control gate line voltages. In practical implementation, the control gate line voltage generation circuit 612 may simultaneously generate the control gate line voltages for program and verify stages in various ways. In one example implementation, as depicted in FIG. 6, the control gate line voltage generation circuit 612 may generate a single set of control gate line voltages. The control gate line voltages may be program gate line voltages during program stages and verify gate line voltages during verify stages. The control gate line voltage generation circuit 612 may be configured to set the control gate line voltages to program levels for program stages and set the control gate line voltages to verify levels for verify stages. In addition, the control gate line voltage generation circuit 612 may be configured to adjust the levels of the control gate line voltages between program levels and verify levels as the program circuit 600 transitions from a program stage to a verify stage or from a last verify sub-stage in one program-verify loop to a program stage of a next program-verify loop. In other example implementations, the control gate line voltage generation circuit 612 is configured to generate separate sets of program and verify control gate line voltages. For such implementations, the control gate line voltage generation circuit 612 may include a selection circuit, such as in the form of switches or multiplexers, that selects which set of control gate line voltages, either the program control gate line voltages or the verify control gate line voltages, to provide to the row decoder circuit 614.

Regardless of the implementation, the control gate line voltage generation circuit's 612 generation of a program or verify control gate line voltage and generation of a control gate line voltage at a program level or a verify level are used interchangeably herein to refer to the same voltage. That is, during a program stage, the control gate line voltage generation circuit 612 generates program control gate line voltages or control gate line voltages at program levels. During a verify stage (or sub-stage), the control gate line voltage generation circuit 612 generates verify control gate line voltages or control gate line voltages at verify levels.

In general, as used herein, phrases or terms such as "generating a program or verify voltage" and "generating a voltage at a program or verify level"—as well as other similar phrases or terms such as "supplying a program voltage" and "supplying a voltage at a program or verify level"; "applying a program or verify voltage" and "applying a voltage at a program or verify level"; or "biasing a control line with program or verify voltage" and "biasing a control line with a voltage at a program or verify level"—are generally used interchangeably, unless expressly described otherwise.

In addition, the control gate line voltage generation circuit 612 may be configured to generate the control gate line voltages at different program levels for different program stages, and/or at different verify levels for different verify stages and/or different verify sub-stages. For example, for at least some program operations, the control gate line generation circuit 612 may be configured to generate the selected word line voltage $V_{WLS}$ in the form of program gate voltage pulses (or just program voltage pulses or program pulses) at different program pulse levels in or during different program stages. As another example, for at least some program operations, the control gate line generation circuit 612 may be configured to generate the selected word line voltage $V_{WLS}$ in the form of verify gate voltage pulses (or just verify voltage pulses or verify pulses) at different verify pulse levels in or during different verify stages. For example, the control gate line generation circuit 612 may output the verify pulse at one level when verifying selected memory cells associated with a first target memory state in a first verify stage, and the verify pulse at a different level when verifying selected memory cells associated with a second target memory state in a second verify stage. As the program circuit 600 transitions from one verify stage to another, the control gate line voltage generation circuit 612 may change or transition the level of the selected word line voltage $V_{WLS}$ from one verify pulse level to another verify pulse level, with each verify pulse level associated with the respective verify sub-stage being performed, in order to generate consecutive verify pulses for the consecutive verify stages.

The row decoder circuit 614 is a circuit that selectively routes or supplies the control gate line voltages to the control gate lines. The row decoder circuit 614 may include a set of input terminals that receives the control gate line voltages from the control gate line voltage generation circuit 612. In addition, the row decoder circuit 614 may include a set of output terminals coupled to the control gate lines. The row decoder 614 may selectively route or supply the control gate line voltages it receives at its input terminals from the control gate voltage generation circuit 612 to its output terminals for supply or application to the control gate lines.

The row decoder circuit 614 is configured to selectively route or supply the control gate line voltages in that the row decoder 614 may route the control gate line voltages to different control gate lines at different times within the same program operation or during different program operations, depending on the memory cells of the block 602 that are selected, unselected, program-enabled, program-inhibited, verify-enabled, and verify inhibited for different program operations or for different program or verify stages (or verify sub-stages) within the same program operation. As an example, the row decoder circuit 614 may supply the selected word line voltage $V_{WLS}$, such as in the form of one or more program pulses, to a first word line during a first program operation, and may supply the selected word line voltage $V_{WLS}$, such as in the form of one or more program pulses, to a second, different word line WLL during a second program operation.

The row decoder circuit 614 may have any of various circuit configurations to selectively route or supply the control gate line voltages to the control gate lines. For at least some example configurations, the row decoder circuit 614 may include a plurality of switches (e.g., transistors) that turn on and off to selectively connect the input terminals to the output terminals. The on and off states of the switches may form conductive paths between the input and output terminals of the row decoder 614 that selectively supply or route the control gate line voltages. The switches may have any of various configurations, such as single-tier or multi-tier (or tree) configurations. For a given program operation or a given program stage or verify stage (or sub-stage) of the program operation, a given overall state of the control gate switches configured in on and off states may determine how the row decoder circuit 614 routes the control gate line voltages to the various control gate lines of the block 602.

In addition, the bit line voltage supply circuit 606 includes a bit line voltage generation circuit 616 and a column decoder circuit 618. The bit line voltage generation circuit 616 may represent at least a portion of the power control circuit 160 of FIG. 2B. The column decoder circuit 618 may represent at least a portion of the column decoder 148 of FIG. 2B.

The bit line voltage generation circuit 616 is configured to generate a plurality or a set of bit line voltages, including a selected bit line voltage $V_{BLS}$ and an unselected bit line voltage $V_{BLU}$. For simplicity, the bit line voltages generated by the bit line voltage generation circuit 616 are not separated into distinct program voltages and verify voltages. Instead, the bit line voltage generation circuit 616 is shown in FIG. 6 as generating a single set of bit line voltages. In practical implementation, the bit line voltage generation circuit 616 may generate the bit line voltages for program and verify stages, including verify sub-stages, in various ways. In one example implementation, as depicted in FIG. 6, the bit line voltage generation circuit 616 may generate a single set of bit line voltages. The bit line voltages may be program voltages during program stages and verify voltages during verify stages. The bit line voltage generation circuit 616 may be configured to set the bit line voltages to program levels for program stages and set the bit line voltages to verify levels for verify stages. In addition, the control gate voltage generation circuit 616 may be configured to adjust the levels of the bit line voltages between program levels and verify levels as the program circuit 600 transitions from a program stage to a verify stage (including from a program stage to an initial verify sub-stage) or from a last sub-verify stage in one program-verify loop to a program stage of a next program-verify loop. In other example implementations, the bit line voltage generation circuit 616 is configured to generate separate sets of program and verify bit line voltages. For such implementations, the bit line voltage generation circuit 616 may include a selection circuit, such as in the form of switches or multiplexers, that selects which set of bit line voltages, either the program voltages or the verify voltages, to provide to the column decoder circuit 618.

Regardless of the implementation, the bit line voltage generation circuit 616 generating a program or verify bit line voltage and the bit line voltage generation circuit 616 generating a bit line voltage at a program level or a verify level are used interchangeably and refer to generation of the same voltage. That is, during a program stage, the bit line voltage generation circuit 616 generates program bit line voltages or bit line voltages at program levels. During a verify stage and/or a verify sub-stage, the bit line voltage generation circuit 616 generates verify bit line voltages or bit line voltages at verify levels.

The column decoder circuit 618 is a circuit that selectively routes or supplies the bit line voltages to the bit lines. The column decoder circuit 618 may include a set of input terminals that receives the bit line voltages from the bit line voltage generation circuit 616. In addition, the column decoder circuit 618 may include a set of output terminals coupled to the bit lines. The column decoder 618 may selectively route or supply the selected and unselected bit line voltages it receives at its input terminals from the bit line voltage generation circuit 616 to its output terminals for supply or application to the bit lines.

The column decoder circuit 618 is configured to selectively route or supply the bit line voltages in that the column decoder 618 may route the bit line voltages to different bit lines at different times within the same program operation or during different program operations, depending on the memory cells of the block 602 that are selected, unselected, program-enabled, program-inhibited, verify-enabled, and verify-inhibited for different program operations or for different program or verify stages, including verify sub-stages, within the same program operation. As an example, during a program stage of a program-verify loop, the column decoder circuit 618 may supply the selected bit line voltage $V_{BLS}$ at an associated program level to a first set of the bit lines BL, and supply the unselected bit line voltage $V_{BLU}$ at an associated program level to a second set of the bit lines BL. During a first verify sub-stage of the program-verify loop, the column decoder circuit 618 may supply the selected bit line voltage $V_{BLS}$ at an associated verify level to a third set of the bit lines BL, and supply the unselected bit line voltage $V_{BLU}$ at an associated verify level to a fourth set of the bit lines BL. Then, during a second verify sub-stage of the program-verify loop, the column decoder circuit 618 may supply the selected bit line voltage $V_{BL}$ at the associated verify level to a fifth set of the bit lines BL, and supply the unselected bit line voltage $V_{BLU}$ at the associated verify level to a sixth set of the bit lines BL. The first, third, and fifth bit line sets receiving the selected bit line voltage $V_{BLS}$ during the program stage and the first and second verify sub-stages may include bit lines that are the same or different from each other, or have some bit lines that are the same and some that are different. Similarly, the second, fourth, and sixth bit line sets receiving the unselected bit line voltage $V_{BLU}$ during the program stage and the first and second verify sub-stages may include bit lines that are the same or different from each other, or have some bit lines that are the same and some that are different.

The column decoder circuit 618 may have any of various circuit configurations to selectively route or supply the bit line voltages to the bit lines BL. For at least some example configurations, the column decoder circuit 618 may include a plurality of switches (e.g., transistors) that turn on and off to selectively connect the input terminals to the output terminals. The on and off states of the switches may form conductive paths between the input and output terminals of the column decoder 618 that selectively supply or route the bit line voltages. The switches may have any of various configurations, such as single-tier or multi-tier (or tree) configurations. For a given program operation or a given program or verify stage (or verify sub-stage) of the program operation, a given overall state of the switches configured in on and off states may determine how the column decoder circuit 618 routes the bit line voltages to the various bit lines of the block 602.

For some example configurations, such as the one shown in FIG. 6, the output terminals of the column decoder circuit 618 are coupled to the bit lines BL by way of a plurality of sense circuits 620 configured to perform sense operations to sense program statuses of selected memory cells during verify stages, including verify sub-stages, of program operations. Details of the sense circuits 620 and sense operations are described in further detail below.

In the example configuration in FIG. 6, the plurality of sense circuits 620 includes an m-number of sense circuits 620(1) to 620(m), with each sense circuit 620 coupled to a respective one of the m-number of bit lines BL1 to BLm. Other sense circuit configurations may be possible. For example, the number of sense circuits 620 may be less than the number of bit lines BL of a block. In addition or alternatively, one sense circuit 620 may be coupled to different bit lines of different blocks. For example, the first sense circuit 620(1) may be coupled to the first bit line BL1 of the block 602, and may be coupled to a different first bit line BL1 of a different block of the memory cell structure 142. Other sense circuit configurations are possible, as described in further detail below.

For some example configurations, the bit line voltages output from the column decoder 618 may directly pass through the sense circuits 620 such that the levels of the bit line voltages as they are received by the bit lines BL are the same or substantially the same as their levels at the output terminals of the column decoder circuit 618. In other example configurations, the sense circuits 620 may each include any of various circuit components, such as resistors, capacitors, and/or semiconductor devices (e.g., transistors) as non-limiting examples, that alter the voltage levels of the bit line voltages they receive, such as by reducing the levels. In particular example configurations, the sense circuits 620 each include a respective semiconductor device, such as a transistor, that receives a bit line voltage from the column decoder 618. The semiconductor devices may include respective first terminals, such as gate terminals, that receive the bit line voltages from the column decoder circuit 618. The semiconductor devices may further include respective second terminals, such as source terminals, that output the bit line voltages onto the bit lines BL by lowering the bit line voltages by a threshold voltage level from the level at which the bit line voltages were received at their first (gate) terminals. Various ways of supplying bit line voltages to bit lines by way of sense circuits may be possible.

The program circuit 600 may further include a program controller 622. A program controller is a component, or module, designed, and built, to control program operations. In certain embodiments, a program controller may comprise hardware, firmware (or software), or a combination of hardware and firmware (or software). For example, a program controller may include or be a component of an integrated circuit (IC), such as an application specific integrated circuit (ASIC) or a field programmable gate array (FPGA), a circuit, a digital logic circuit, an analog circuit, a combination of discrete circuits, gates, or any other type of hardware or combination thereof. In addition, or alternatively, a program controller may include memory hardware that comprises instructions executable with a processor or processor circuitry to implement one or more of the features of the program controller. A program controller, which may be an on-die NAND program controller in certain embodiments, can take the form of processing circuitry, a microprocessor or processor, and a computer-readable medium (e.g., a non-transitory computer readable storage medium) that stores computer-readable program code (e.g., software or firmware) executable by the (micro)processor, logic gates, switches, an application specific integrated circuit (ASIC), a programmable logic controller, and an embedded microcontroller.

Additionally, a program controller controls when program operations begin and when they end. In addition, a program controller controls when program stages and verify stages, including verify-sub-stages, within a program operation begin and end. A program controller controls the transitions of stages from one stage to a next stage, and controls the transitions of program loops from one program loop to a next program loop. For example, a program controller controls transitions from a program stage to a verify stage, from a program stage to an initial verify sub-stage, from one verify sub-stage to a next verify sub-stage, or from a last verify sub-stage of one program-verify loop to a program stage of a next program-verify loop.

In addition, a program controller sets the voltages at program and/or verify levels on the control lines of a block, applies or supplies voltages at program and/or verify levels to the control lines of a block, and/or biases control lines of a block with voltages at program and/or verify levels. A program controller may do so by controlling the voltage levels of the voltages that a voltage supply circuit generates and supplies, and when the voltage supply circuit generates and supplies the voltages at their particular levels. For example, a program controller controls whether and/or when selected and unselected voltages are generated at associated program levels or associated verify levels. In addition, a program controller sets the voltages on the control lines, applies or supplies the voltages to the control lines, and/or biases control lines with the voltages by controlling how voltages are routed to control lines of a block, and can change which voltages are routed to which control lines. Accordingly, as used herein unless expressly described otherwise, reference to or description of the program controller 622 setting a voltage on a control line is used interchangeably with the program controller 622 controlling the voltage supply circuit 604 (or one of its components) to set a voltage on a control line; the program controller 622 applying or supplying a voltage to a control line is used interchangeably with the program controller 622 controlling the voltage supply circuit 604 (or one of its components) to supply or apply a voltage on a control line; and the program controller 622 biasing a control line with a voltage is used interchangeably with the program controller 622 controlling the voltage supply circuit 604 (or one of its components) to bias a control line with a voltage.

In addition, a program controller may also determine where to store data. For example, a program controller may determine that data is to be stored, and identify a collection of memory cells into which to store or program the data, such as by identifying a plane, a block, a word line, and/or a word line cell group that includes the collection of memory cells. The program controller may identify that collection of memory cells as the selected memory cells of a program operation.

A program controller may determine where to store data in response to receipt of address information from the controller 102 (FIG. 2A) or otherwise identify a unique physical address (e.g., one that includes a particular plane, a particular block, a particular word line, and/or a particular word line cell group) that identifies a physical location of the selected memory cells into which to program the data.

In addition, a program controller may know or determine a storage scheme under which data is be stored in selected memory cells. By knowing the storage scheme, a program controller may know whether to program the selected memory cells as SLC cells or MLC cells, as defined by the storage scheme. In addition, where the selected memory cells are to be programmed as MLC cells, the program controller may know the number of bits-per-cell each of the MLC cells are configured to store, as defined by the storage scheme. A program controller may control the biasing on the control lines in order program the selected memory cells as SLC cells or MLC cells, in accordance with the storage scheme.

A program controller may also identify the data values of the data to be programmed into the selected memory cells. A program controller may know which data values are to be stored in which memory cells of the selected memory cells. Based on this knowledge, the program controller may know the target memory states of each of the selected memory cells of a program operation. In turn, the program controller may determine, during the course of the program operation, which selected memory cells are sufficiently programmed and which selected memory cells are insufficiently programmed. Based on these determinations, a program controller can determine which selected memory cells to configure as program-inhibited memory cells and which selected memory cells to configure as program-enabled memory cells during the program stages. In addition, by knowing the target memory states of each of the selected memory cells, a program controller can determine which of the selected memory cells to configure as verify-enabled memory cells and which of the selected memory cells to configure as verify-inhibited memory cells during the verify stages and/or verify sub-stages. A program controller can control the biasing on the control lines in order to configure the various selected memory cells as program-enabled or program-inhibited memory cells during program stages, and as verify-enabled or verify-inhibited memory cells during the verify stages and/or verify sub-stages.

In further detail with respect to example configuration FIG. 6, the program controller 622 may be configured to set the voltages on the control lines at certain levels and during certain program and verify stages, including certain verify sub-stages, in order to perform program operations. To do so, the program controller 622 is configured to control the voltage supply circuit 604 to supply, apply, or output the program voltages to the control lines during program stages, and to supply, apply, or output the verify voltages to the control lines during verify stages and sub-stages.

With respect to the control gate line voltage supply circuit 606, the program controller 622 is configured to control the control gate line voltage supply circuit 606 to supply, apply, or output the control gate line voltages $V_{SGDS}$, $V_{SGDU}$, $V_{WLS}$, $V_{WLU}$, $V_{SGS}$ to the control gate lines at program levels during program stages, and at verify levels during the verify stages and sub-stages. The program controller 622 may control the control gate line voltage generation circuit 612 to generate the control gate line voltages $V_{SGDS}$, $V_{SGDU}$, $V_{WLS}$, $V_{WLU}$, $V_{SGS}$ at associated program levels during program stages. In addition, the program controller 622 may control the control gate line voltage generation circuit 612 to generate the control gate line voltages $V_{SGDS}$, $V_{SGDU}$, $V_{WLS}$, $V_{WLU}$, $V_{SGS}$ at associated verify levels during verify stages and sub-stages. In some example configurations, as shown in FIG. 6, the program controller 622 may output a control gate line voltage control signal CTRLCLV to control the control gate line voltage generation circuit 612 to generate the control gate line voltages $V_{SGDS}$, $V_{SGDU}$, $V_{WLS}$, $V_{WLU}$, $V_{SGS}$ at either the associated program levels or verify levels, or otherwise output the control gate line voltages $V_{SGDS}$, $V_{SGDU}$, $V_{WLS}$, $V_{WLU}$, $V_{SGS}$ as either program voltages or verify voltages to the row decoder circuit 614.

In addition, the program controller 622 is configured to control the row decoder circuit 614 by configuring the row decoder 614 in any of various states to route the control gate line voltages $V_{SGDS}$, $V_{SGDU}$, $V_{WLS}$, $V_{WLU}$, $V_{SGS}$ to the control gate lines in order to program and verify the selected memory cells during the program and verify stages and sub-stages. As shown in FIG. 6, the program controller 622 may control the row decoder circuit 614 by outputting a row decoder control signal CTRLRD to the row decoder circuit 614. The row decoder circuit 614 may respond to the row decoder control signal CTRLRD by being configured in a state corresponding to a level or value of the row decoder control signal CTRLRD, such as by turning on an off various switches. The program controller 622 may output the row decoder control signal CTRLRD based on physical address information identifying the selected memory cells.

With respect to the bit line voltage supply circuit 608, the program controller 622 is configured to control the bit line voltage supply circuit 606 to supply, apply, or output the bit line voltages $V_{BLS}$, $V_{BLU}$ to the bit lines at program levels during program stages, and at verify levels during the verify stages and sub-stages. The program controller 622 may control the bit line voltage generation circuit 616 to generate the bit line voltages $V_{BLS}$, $V_{BLU}$ at associated program levels during program stages. In addition, the program controller 622 may control the bit line voltage generation circuit 616 to generate the bit line voltages $V_{BLS}$, $V_{BLU}$ at associated verify levels during verify stages and sub-stages. In some example configurations, as shown in FIG. 6, the program controller 622 may output a bit line voltage control signal CTRLBLV to control the bit line voltage generation circuit 616 to generate the bit line voltages $V_{BLS}$, $V_{BLU}$ at either the associated program levels or verify levels, or otherwise output the bit line voltages $V_{BLS}$, $V_{BLU}$ as either program voltages or verify voltages to the column decoder circuit 618.

In addition, the program controller 622 is configured to control the column decoder circuit 618 by configuring the column decoder 618 in any of various states to route the bit line voltages $V_{BLS}$, $V_{BLU}$ to the bit lines in order to program and verify the selected memory cells during the program and verify stages and sub-stages. As shown in FIG. 6, the program controller 622 may control the column decoder circuit 618 by outputting a column decoder control signal CTRLCD to the column decoder circuit 618. The column decoder circuit 618 may respond to the column decoder control signal CTRLCD by being configured in a state corresponding to a level or value of the column decoder control signal CTRLCD, such as by turning on an off various switches.

The program controller 622 may output the column decoder control signal CTRLCD based on physical address information identifying the selected memory cells. In addition, the program controller 622 may output the column decoder control signal CTRLCD based on the program statuses of the selected memory cells obtained during verify stages and sub-stages. Based on the program statuses, the program controller 622 may output the column decoder control signal CTRLCD so that the column decoder 618 routes or supplies the selected bit line voltage $V_{BLS}$ to bit lines coupled to insufficiently programmed selected memory cells, and routes or supplies the unselected bit line voltage $V_{BLU}$ to bit lines coupled to sufficiently programmed selected memory cells during program stages. In addition, the program controller 622 may output the column decoder control signal CTRLCD based on the target memory states of the selected memory cells. Based on the target memory states, the program controller 622 may output the column decoder control signal CTRLCD so that the column decoder 618 routes or supplies the selected bit line voltage $V_{BLS}$ to bit lines coupled to matched memory cells and routes or supplies the unselected bit line voltage $V_{BLU}$ to bit lines coupled to unmatched memory cells during the verify stages and sub-stages.

With respect to the source line voltage supply circuit 610, the program controller 622 is configured to control the source line voltage supply circuit 610 to supply, apply, or output the source line voltage $V_{SL}$ to the source line SL at program levels during program stages, and at verify levels during the verify stages and sub-stages. In some example configurations, as shown in FIG. 6, the program controller 622 may output a source line voltage control signal CTRLSLV to control the source line voltage supply circuit 610 to generate the source line voltage $V_{SL}$ at either the associated program level or verify level.

During a program operation, the program controller 622 configures the word lines, the bit lines, and the SGD lines of the block 602 in selected states and unselected states in order to program selected memory cells into their target memory states while keeping the unselected memory cells in their initial memory states. A word line in a selected state is referred to as being selected and/or as a selected word line. A word line in an unselected state is referred to as being unselected and/or as an unselected word line. A bit line in a selected state is referred to as being selected and/or as a selected bit line. A bit line in an unselected state is referred to as being unselected and/or as an unselected bit line. An SGD line in a selected state is referred to as being selected and/or as a selected SGD line. An SGD line in an unselected state is referred to being unselected and/or as an unselected SGD line.

A selected word line (or selected word line layer) of a program operation is a word line (or word line layer) that is coupled to selected memory cells during a program operation. A selected word line may perform different roles or different functions during program stages and verify stages of a program operation. At least for NAND technology, during a program stage, a selected word line applies a selected word line voltage at an associated program level, referred to as a program gate voltage pulse (or just program voltage pulse or program pulse), to selected memory cells and/or biases selected memory cells with a program pulse, such as by applying a program pulse to control gates of selected memory cells, and/or by biasing the control gates of selected memory cells with a program pulse during the program stage. During a verify sub-stage, a selected word line applies a selected word line voltage at a verify level, referred to as a verify gate voltage pulse (or just verify voltage pulse or verify pulse), to selected memory cells and/or biases selected memory cells with a verify pulse, such as by applying a verify pulse to control gates of selected memory cells, and/or by biasing the control gates of selected memory cells with a verify pulse during the verify sub-stage.

An unselected word line (or unselected word line layer) of a program operation is a word line (or word line layer) that is not coupled to any selected memory cells during a program operation. In addition or alternatively, an unselected word line of a program operation is a word line that does not apply at least one program pulse to at least one selected memory cell and/or that does not apply at least one verify pulse to at least one selected memory cell during the program operation. For program operations that are confined to a particular region of the memory cell structure 142, the unselected word lines are those word lines in the particular region that are not the selected word line. For example, for a program operation where the selected memory cells are coupled to the same word line (or disposed in the same word line layer), the unselected word lines are the word lines of the block that are not the selected word line.

A selected bit line of a program operation is a bit line that enables or allows a selected memory cell coupled to the selected bit line to be programmed or verified. During a program stage of a program operation, a selected bit line is a bit line that configures a selected memory cell in a program-enable state to allow or enable the selected memory cell to be programmed during the program stage. During a verify stage and/or sub-stage of a program operation, a selected bit line is a bit line that configures a selected memory cell in a verify-enable state to allow or enable the selected memory cell to be verified during the verify stage and/or sub-stage.

An unselected bit line of a program operation is a bit line that inhibits, prevents, or locks out a selected memory cell coupled to the unselected bit line from being programmed or verified. During a program stage of a program operation, an unselected bit line is a bit line that configures a selected memory cell in a program-inhibit state to inhibit, prevent, or lock out the selected memory cell from being programmed during the program stage. During a verify stage and/or sub-stage of a program operation, an unselected bit line is a bit line that configures a selected memory cell in a verify-inhibit state to inhibit, prevent, or lock out the selected memory cell from being verified during the verify stage and/or sub-stage.

In addition, a selected SGD line of a program operation is a SGD line that enables or allows selected memory cells coupled to the SGD line to be programmed or verified. During a program stage of a program operation, a selected SGD line is a SGD line that configures a selected memory cell in a program-enable state to allow or enable the selected memory cell to be programmed during the program stage. During a verify stage and/or sub-stage of a program operation, a selected SGD line is a SGD line that configures a selected memory cell in a verify-enable state to allow or enable the selected memory cell to be verified during the verify stage and/or sub-stage.

An unselected SGD line of a program operation is an SGD line that inhibits, prevents, or locks out unselected memory cells coupled to the SGD line from being programmed or verified. The SGD line may inhibit, prevent, or lock out these unselected memory cells from being programmed or verified even though they may be coupled to selected bit lines and/or selected word lines. During a program stage of a program operation, an unselected memory cell disposed in the same word line layer as a selected memory cell may be coupled to a selected bit line during the program stage. The unselected SGD line coupled to that unselected memory cell is an SGD line that configures the unselected memory cell in the program-inhibit state so that the unselected memory cell is not programmed during the program stage despite being coupled to the selected bit line. During a verify stage and/or sub-stage of a program operation, an unselected memory cell disposed in the same word line layer as a selected memory cell may be coupled to a selected bit line during the verify stage and/or sub-stage. The unselected SGD line coupled to that unselected memory cell is an SGD line that configures the unselected memory cell in the verify-inhibit state so that the unselected memory cell is not verified during the verify stage and/or sub-stage despite being coupled to the selected bit line.

At any given point in time during a program operation, the word lines, the bit lines, and the SGD lines have respective selected statuses. A selected status of a control line is a status identifier that identifies whether the control line is a selected control line or an unselected control line. During the course or duration of a program operation, the selected status of a control line may stay the same or may change. For a selected status of a control line that changes, the change may be from the selected state to the unselected state, or from the unselected state to the selected state. In addition, for a selected status of a control line that changes, the change may occur within a single program loop (e.g., a single program-verify loop). For example, within a single program loop, a change in a selected status of a control line may occur during a transition from a program stage to a verify stage and/or sub-stage, or from one verify sub-stage to another verify sub-stage. Within the single program loop, a selected status of a control line may change once or multiple times. In addition or alternatively, for a selected status of a control line that changes, the change may occur across program loops. For example, a control line may be selected during a program stage of one program loop and then unselected during a program stage of another or next program loop. As another example, a control line may be selected during a last verify sub-stage of one program loop and then may be unselected during a program stage of another or a next program loop.

For each program stage and verify stage and/or sub-stage of a program operation, the program controller 622 may identify each of the word lines WLL, the bit lines BL, and the SGD lines as selected or unselected, and configure each of the word lines WLL, the bit lines BL, and the SGD lines in selected and unselected states according to the identifications. In particular, according to the identifications, the program controller 622 configures each of the word lines WLL as a selected word line or an unselected word line, configures each of the bit lines BL as a selected bit line or an unselected bit line, and configures each of the SGD lines as a selected SGD line or an unselected SGD line.

The program controller 622 configures each of the word lines WLL, the bit lines BL, and the SGD lines in selected and unselected states by supplying or biasing them with respective selected and unselected voltages. In particular, the program controller 622 configures a word line as a selected word line by supplying or applying the selected word line voltage $V_{WLS}$ to that word line and/or by biasing the word line with the selected word line voltage $V_{WLS}$. The word line receiving or biased with the selected word line voltage $V_{WLS}$ becomes or is configured as a selected word line and generates a selected word line voltage by generating its voltage at a selected word line level. Similarly, the program controller 622 configures a word line as an unselected word line by supplying or applying the unselected word line voltage $V_{WLU}$ to that word line and/or by biasing the word line with the unselected word line voltage $V_{WLU}$. The word line receiving or biased with the unselected word line voltage $V_{WLU}$ becomes or is configured as an unselected word line and generates an unselected word line voltage by generating its voltage at an unselected word line level.

In a similar manner, the program controller 622 configures a SGD line as a selected SGD line by supplying or applying the selected SGD line voltage $V_{SGDS}$ to that SGD line and/or by biasing the SGD line with the selected SGD line voltage $V_{SGDS}$. The SGD line receiving or biased with the selected SGD line voltage $V_{SGDS}$ becomes or is configured as a selected SGD line and generates a selected SGD line voltage by generating its voltage at a selected SGD level. Similarly, the program controller 622 configures a SGD line as an unselected SGD line by supplying or applying the unselected SGD line voltage $V_{SGDU}$ to that SGD line and/or by biasing the SGD line with the unselected SGD line voltage $V_{SGDU}$. The SGD line receiving or biased with the unselected SGD line voltage $V_{SGDU}$ becomes or is configured as an unselected SGD line and generates an unselected SGD line voltage by generating its voltage at an unselected SGD level.

The selected and unselected levels at which the word lines and SGD lines generate their respective voltages may be the same as or different than the voltage levels of the selected and unselected word line and SGD line voltages $V_{WLS}$, $V_{WLU}$, $V_{SGDS}$, $V_{SGDU}$. For example, the row decoder circuit 614 may provide a voltage drop such that the selected and unselected word lines and SGD lines are biased with or generate their respective selected and unselected voltages at levels that are lower than the levels at which the control gate line voltage generation circuit 612 generates the selected and unselected word line and SGD line voltages $V_{WLS}$, $V_{WLU}$, $V_{SGDS}$, $V_{SGDU}$. For such example configurations, the control gate line voltage generation circuit 612 is configured to generate the selected and unselected word line and SGD line voltages $V_{WLS}$, $V_{WLU}$, $V_{SGDS}$, $V_{SGDU}$, as well as the SGS line voltage $V_{SGS}$ at sufficiently high levels to achieve appropriate biasing of the control gate lines SGD, WLL, SGSL.

For some example configurations, the selected and unselected word line and SGD line voltages $V_{WLS}$, $V_{WLU}$, $V_{SGDS}$, $V_{SGDU}$ are be referred to as global selected and unselected voltages, and the selected and unselected voltages that the word lines and SGD lines generate and/or are biased with are referred to as local selected and unselected voltages. Similarly, the control gate line voltage generation circuit 612 generates a global SGS line voltage $V_{SGS}$, and the SGS line SGSL generates and/or is biased with a local SGS line voltage $V_{SGS}$. In this context, the control gate line voltage supply circuit 606 generates global control gate line voltages, including global selected and unselected control gate line voltages, and supplies or routes the global control gate line voltages to the control gate lines of the block 602. In response, the control gate lines of the block 602 generate respective local control gate line voltages. Selected control gate lines generate local selected control gate line voltages or voltages at local selected levels, and unselected control gate lines generate local unselected control gate line voltages or voltages at local selected levels. Herein, for simplicity, no express distinction is made between the levels, including the selected and unselected levels, of the control gate line voltages that the control gate line voltage generation circuit 612 generates, and the levels, including the selected and unselected levels, of the control gate line voltages that the control gate lines generate.

In addition, the program controller 622 configures a bit line as a selected bit line by supplying or applying the selected bit line voltage $V_{BLS}$ to that bit line and/or by biasing the bit line with the selected bit voltage $V_{BLS}$. The bit line receiving or biased with the selected bit line voltage $V_{BLS}$ becomes or is configured as a selected bit line and generates a selected bit line voltage by generating its voltage at a selected bit line level. Similarly, the program controller 622 configures a bit line as an unselected bit line by supplying or applying the unselected bit line voltage $V_{BLU}$ to that bit line and/or by biasing the bit line with the unselected bit line voltage $V_{BLU}$. The bit line receiving or biased with the unselected bit line voltage $V_{BLU}$ becomes or is configured as an unselected bit line and generates an unselected bit line voltage by generating its voltage at an unselected bit line level.

The selected and unselected levels at which the bit lines generate their respective voltages may be the same as or different than the voltage levels of the selected and unselected bit line voltages $V_{BLS}$, $V_{BLU}$. For example, the column decoder circuit 618 and/or the sense circuits 620 may provide one or more voltage drops such that the selected and unselected bit lines are biased with or generate their respective selected and unselected bit line voltages at levels that are lower than the levels at which the bit line voltage generation circuit 616 generates the selected and unselected bit line voltages $V_{BLS}$, $V_{BLU}$. For such example configurations, the bit line voltage generation circuit 616 is configured to generate the selected and unselected bit line voltages $V_{BLS}$, $V_{BLU}$ at sufficiently high levels to achieve appropriate biasing of the bit lines.

For some example configurations, the selected and unselected bit line voltages $V_{BLS}$, $V_{BLU}$ are be referred to as global selected and unselected bit line voltages, and the selected and unselected voltages that the bit lines generate and/or are biased with are referred to as local selected and unselected bit line voltages. In this context, the bit line voltage supply circuit 608 generates global bit line voltages, including global selected and unselected bit line voltages, and supplies or routes the global bit line voltages to the bit lines of the block 602. In response, the bit lines generate respective local bit line voltages. Selected bit lines generate local selected bit line voltages or voltages at local selected levels, and unselected bit lines generate local unselected bit line voltages or voltages at local selected levels. Herein, for simplicity, no express distinction is made between the levels, including the selected and unselected levels, of the bit line voltages that the bit line voltage generation circuit 616 generates, and the levels, including the selected and unselected levels, of the bit line voltages that the bit lines generate.

As previously described, the program controller 622 may identify or assign each of the word lines, bit lines, and SGD lines as selected or unselected for the program and verify stages, including verify sub-stages, of a program operation. The determinations or identifications that the program controller 622 makes to assign each of the word lines, SGD lines, and bit lines as selected or unselected depends on the physical location of the selected memory cells being programmed or verified (i.e., the word lines and bit lines to which they are coupled), the target memory states of the selected memory cells, the program statuses of the selected memory cells, and the particular program stage or verify stage and/or verify-sub-stage being performed at a given point in time of the program operation.

In addition, for at least some example configurations, the program controller 622 may include a program control circuit 624 and a verify control circuit 626. As used herein, a program control circuit is a component or module of a program controller that controls program stages of program operations. The program control circuit 624, such as through control of the voltage supply circuit 604 and/or its components, may set program voltages (or voltages at program levels) on control lines of blocks, may supply or apply program voltages (or voltages at program levels) to control lines of blocks, or may bias control lines with program voltages (or with voltages at program levels) during program stages of program operations. The program control circuit 624 may determine or identify when a program stage begins and when a program stage ends; and may control the program levels of the program voltages, including the program selected and unselected levels, of the various program voltages applied to the control gate lines, the bit lines, and the source lines during program stages. In general, the program control circuit 624 has the same functionality and control of program stages that the program controller 622 does. Accordingly, actions performed during program stages may be interchangeably described or referred to as being performed by the program controller 622 or the program control circuit 624.

Similarly, as used herein, a verify control circuit is a component or module of a program controller that controls verify stages, including the verify sub-stages, of program operations. The verify control circuit 626, such as through control of the voltage supply circuit 604 and/or its components, may set verify voltages (or voltages at verify levels) on control lines of blocks, may supply or apply verify voltages (or voltages at verify levels) to control lines of blocks, or may bias control lines with verify voltages (or with voltages at verify levels) during verify stages, including the verify sub-stages, of program operations. The verify control circuit 626 may determine or identify when a verify stage begins and when a verify stage ends. Additionally, the verify control circuit 626 may determine or identify verify orders, perform verify stages in or according to verify orders, apply or supply sequences of verify pulses in or according to verify orders during verify stages, transition between verify sub-stages during a verify stage, and control the verify levels of the verify voltages, including the verify selected and unselected levels, of the various verify voltages applied to the control gate lines, the bit lines, and the source lines during verify stages, including the verify sub-stages. In general, the verify control circuit 626 has the same functionality and control of or over verify stages, including the verify sub-stages, that the program controller 622 does. Accordingly, actions performed during verify stages, including the verify sub-stages, may be interchangeably described or referred to as being performed by the program controller 622 or the verify control circuit 626.

Additionally, the program control circuit 624 and the verify control circuit 626 may be configured to operate in sync with each other in order perform program operations, including program-verify loops. Accordingly, the program control circuit 624 and the verify control circuit 626 may operate in sync with each other in order to transition between program stages and verify stages and/or transition from one program-verify loop to a next program-verify loop. Also, as components or modules of the program controller 622, each of the program control circuit 624 and the verify control circuit 626 may have any of the various hardware and/or combination of hardware and firmware (or hardware and software) configurations that the program controller 622 can have in order to perform or carry out the program stages and verify stages of program operations. For some example configurations, the program control circuit 624 and the verify control circuit 626 may include separate, discrete sets of circuitry, such as separate, discrete sets of logic circuits or other types of hardware circuits. For other example configurations, the program control circuit 624 and the verify control circuit 626 may include the same hardware circuitry, such as the same processor for example, but execute different firmware, such as different sets of computer code or instructions, in order carry out their respective functions, operations, or actions. Various configurations or combinations of configurations are possible for the program control circuit 624 and the verify control circuit 626 of the program controller 600.

In an example program operation, the program circuit 600 may perform a program operation to program data (such as one or more pages of data) into a selected word line cell group 628 of the block 602. In general, a selected word line cell group is a word line cell group that includes the selected memory cells that are programmed during the program operation. Those word line cell groups that do not include selected memory cells—i.e., that include unselected memory cells—are unselected word line cell groups of the program operation.

Figure 8A:
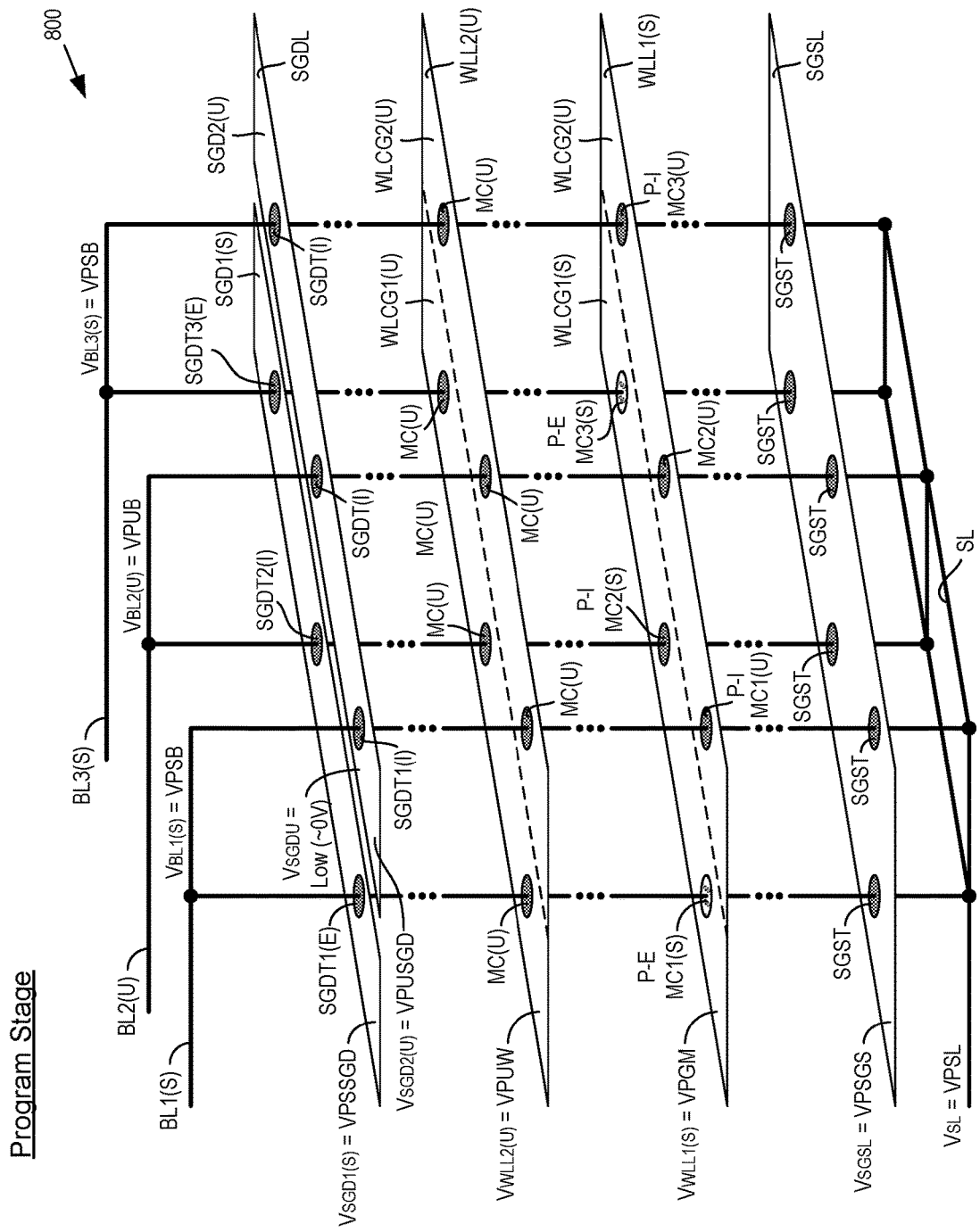
FIG. 8A is an exploded view of a portion of a block biased with program voltages during a program stage of a program-verify loop.
Figure 8B:
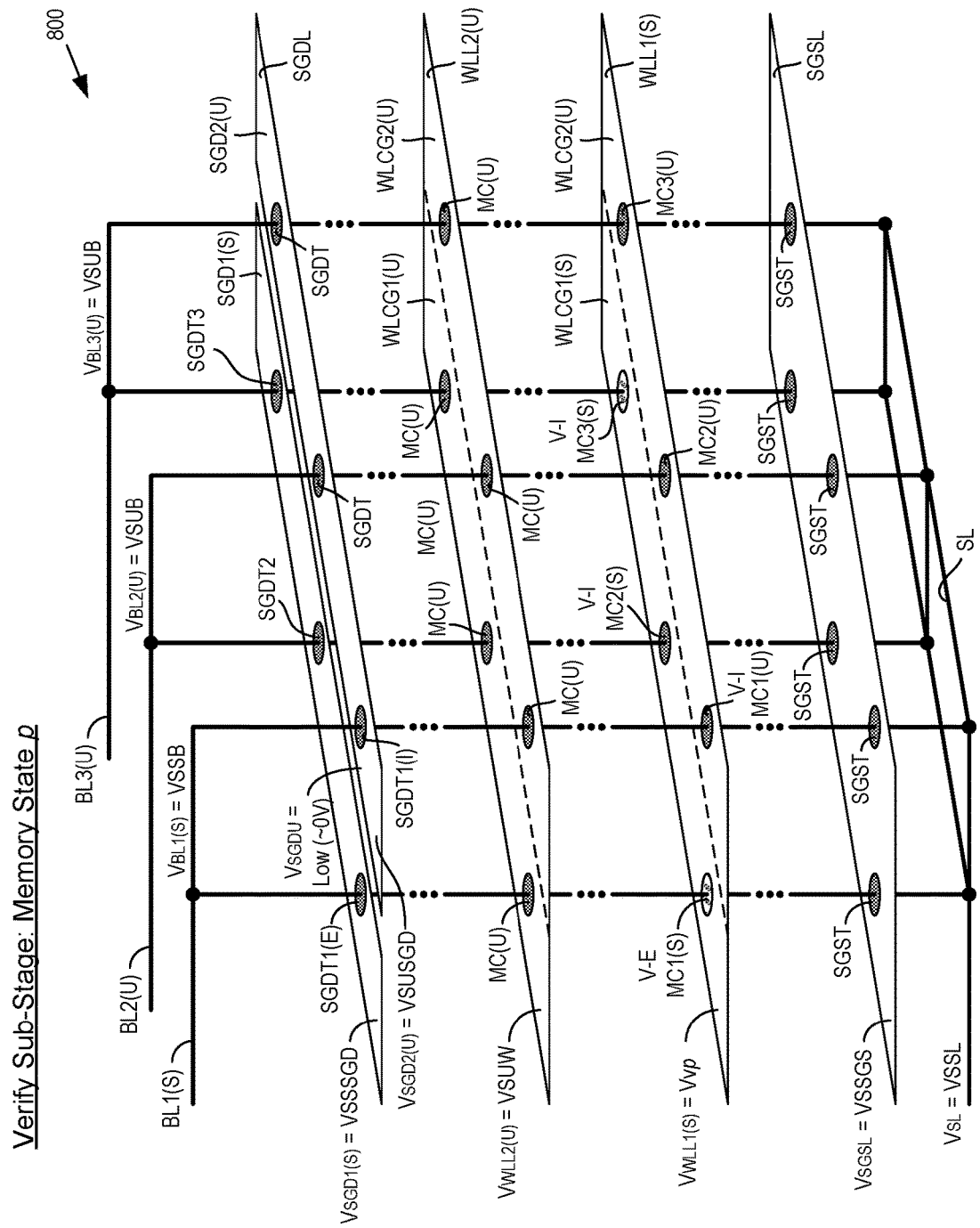
FIG. 8B is the exploded view of the block of FIG. 8A, but biased with verify voltages during a first verify sub-stage of the program-verify loop.
Figure 8C:
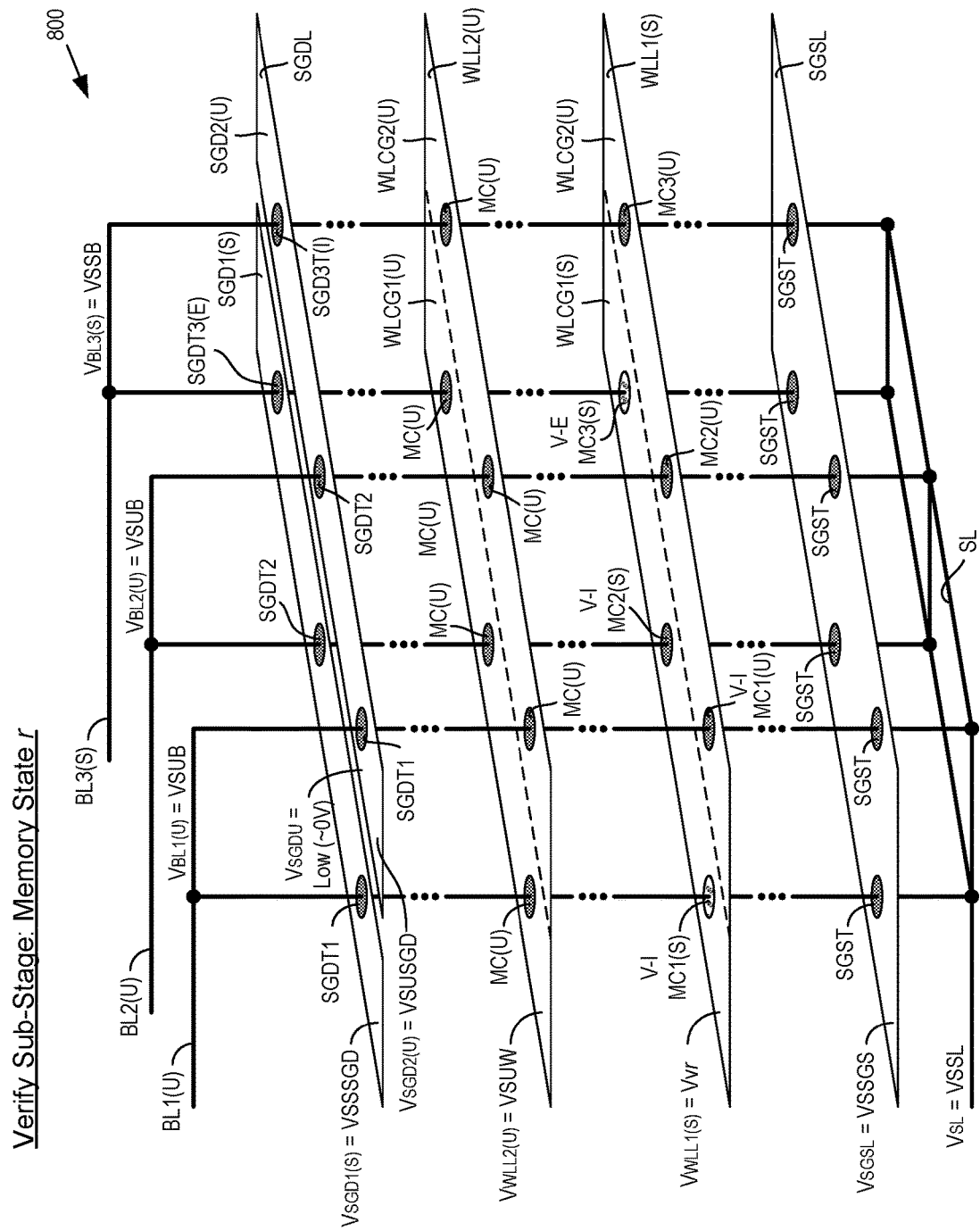
FIG. 8C is the exploded view of the block of FIGS. 8A and 8B, but biased with verify voltages during a second verify sub-stage of the program-verify loop.

An example program operation (or at least a portion of a program operation) to program data into a selected word line cell group is described with reference to FIGS. 8A-8C and 9, in conjunction with FIG. 6. FIGS. 8A-8C show an exploded perspective view of at least a portion of a 3-D block 800 that includes selected memory cells MC(S) being programmed during the program operation. For simplicity, the block 800 includes two word lines (or word line layers) WLL1, WLL2, two SGD lines SGD1, SGD2, disposed or extending in one or more SGD layers SGDL, an SGS line or layer SGSL, and three bit lines BL1, BL2, BL3. The two word lines WLL1, WLL2 may be adjacent or non-adjacent to each other. For example, the two word lines WLL1, WLL2 may represent any two of the 48 word lines WLL1 to WLL48 of the block 602 of FIG. 6. Similarly, the three bit lines BL1, BL2, BL3 may be adjacent or non-adjacent to each other. For example, the three bit lines BL1, BL2, BL3 may represent any three of the m-number of bit lines BL1 to BLm of the block 602 of FIG. 6.

Figure 9:
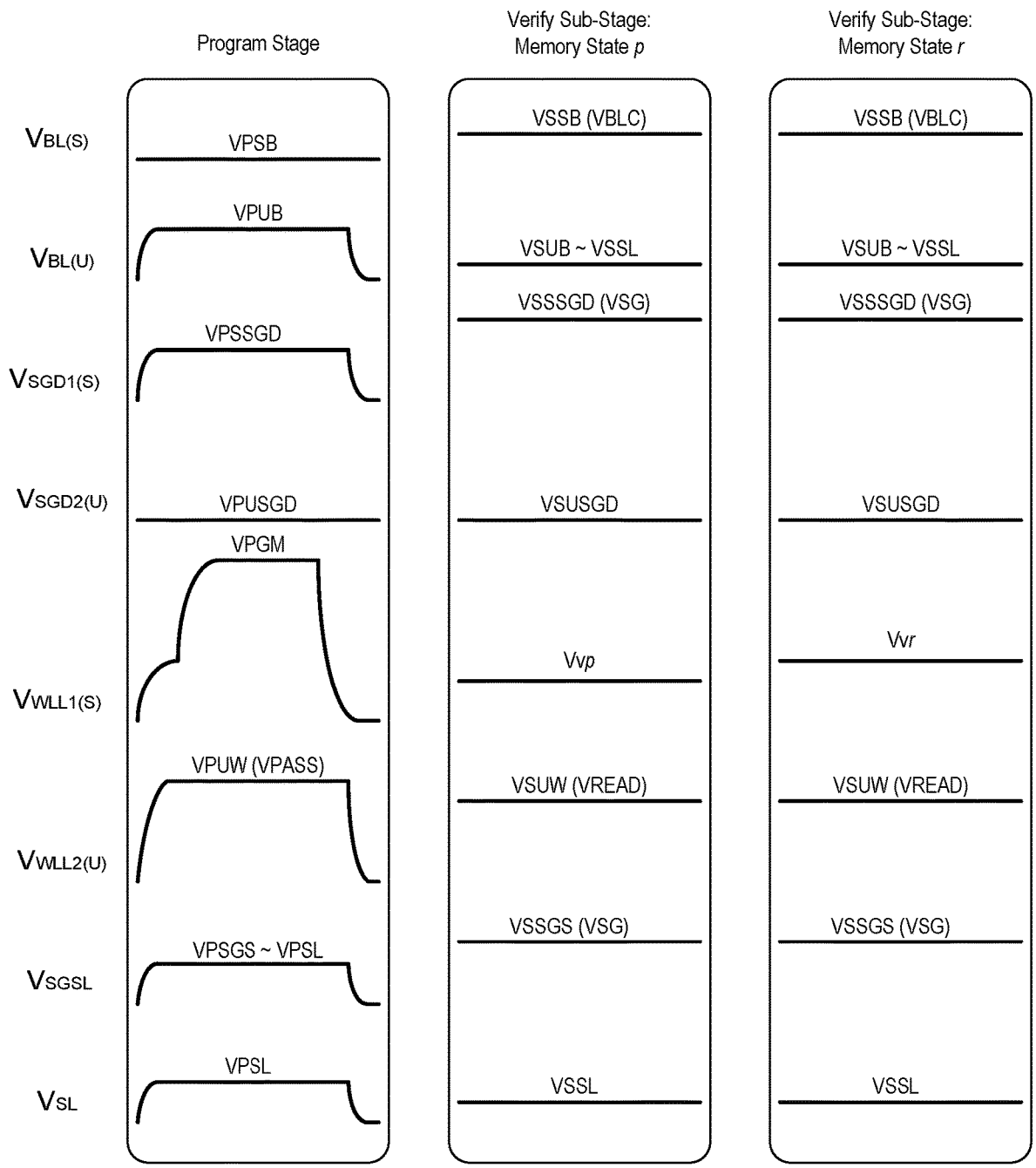
FIG. 9 is a timing diagram of voltage waveforms of the program and verify voltages generated on the control lines of the block of FIGS. 8A-8C during the program and verify stages.

The program operation described with reference to FIGS. 8A-8C and 9 includes a program stage and a verify stage that includes two verify sub-stages of a program-verify loop. Application of the program voltages to the control lines of the block 800 during the program stage is described with reference to FIG. 8A. Application of verify voltages to the control lines of the block 800 during the first verify sub-stage is described with reference to FIG. 8B. Application of verify voltages to the control lines of the block 800 during a second verify sub-stage is described with reference to FIG. 8C. FIG. 9 shows a timing diagram of voltage waveforms of the program and verify voltages generated on the control lines of the block 800 during the program and verify stages.

Referring to FIG. 8A, in the example program operation, the program controller 622 has determined to program data into a first word line cell group WLCG1 coupled to the first word line WLL1. Accordingly, the program controller 622 identifies the first word line WLL1 as a selected word line WLL1(S), and the second word line WLL2 as an unselected word line WLL2(U). In addition, the program controller 622 identifies the first word line cell group WLCG1 as a selected word line cell group WLCG1(S), and the other word line cell groups as unselected word line cell groups WLCG(U). The three memory cells MC1, MC2, MC3 of the selected word line cell group WLCG1(S) are selected memory cells MC1(S), MC2(S), MC3(C) of the program operation. The selected memory cells MC(S) of the selected word line cell group WLCG(S) may represent at least a portion of the selected word line cell group 628 of FIG. 6. The other memory cells of the unselected word line cell groups are unselected memory cells MC(U).

In addition, in the example program-verify loop, the program controller 622 determines that second selected memory cell MC2(S) is sufficiently programmed, and configures it in the program-inhibited state or as a program-inhibited memory cell P-I MC2(S). However, the program controller 622 determines that the first and third selected memory cells MC1(S), MC3(S) are insufficiently programmed and wants to subject them to a program pulse during the program stage. Accordingly, the program controller 622 configures the first and third selected memory cells MC1(S), MC3(S) in the program-enabled state or as program-enabled memory cells P-E MC1(S), P-E MC3(S).

As shown in FIG. 8A, the first bit line BL1 is coupled to the first selected memory cell MC1(S), the second bit line BL2 is coupled to the second selected memory cell MC2(C), and the third bit line BL3 is coupled to the third selected memory cell MC3(C). Accordingly, the program controller 622 identifies the first and third bit lines as selected bit lines BL1(S), BL3(S), since they are coupled to the program-enabled memory cells P-E MC1(S), P-E MC3(S). In addition, the program controller 622 identifies the second bit line as an unselected bit line BL2(U) since it is coupled to the program-inhibited memory cell P-I MC2(S).

In addition, the selected memory cells MC(S) of the selected word line cell group WLCG(S) are coupled to the first SGD line SGD1. Accordingly, the program controller 622 identifies the first SGD line SGD1 as a selected SGD line SGD1(S) and the second SGD line SGD2 as an unselected SGD line SGD2(U) for the program stage.

To properly bias the control lines during the program stage, the program controller 622 may control the voltage supply circuit 604 to generate its voltages at program levels (rather than verify levels). In addition, the program controller 622 may control the row and column decoders 614, 618 to ensure that the selected and unselected voltages are properly routed or supplied to the selected and unselected lines it has identified. In particular, the program controller 622 may control the row decoder 614 so that the row decoder 614 supplies the selected word line voltage $V_{WLS}$ to the selected first word line WLL1(S), the unselected word line voltage $V_{WLU}$ to the unselected second word line WLL2(U), the selected SGD line voltage $V_{SGDS}$ to the selected first SGD line SGD1(S), and the unselected SGD line voltage $V_{SGDU}$ to the unselected second SGD line SGD2(U). In addition, the program controller 622 may control the column decoder 618 so that the column decoder 618 supplies the selected bit line voltage $V_{BLS}$ to the selected first and third bit lines BL1(S), BL3(S), and supplies the unselected bit line voltage $V_{BLU}$ to the unselected second bit line voltage BL2(U).

With reference to FIGS. 8A and 9, during the program stage, the selected first word line WLL1(S) may generate a selected word line voltage at a program level in the form of a program gate voltage pulse (or just program voltage pulse or program pulse). For example, the control gate line voltage supply circuit 606 may supply the selected word line voltage $V_{WLS}$ in the form of a program pulse, and in response, the selected first word line WLL1(S) may generate a program pulse in response to receipt of the selected word line voltage $V_{WLS}$. As used herein, a program gate voltage pulse (or just program voltage pulse or program pulse) is a voltage that is generated, supplied, output, or applied to change a level, value, magnitude, or state of a storage parameter of a memory cell in order to program the memory cell during a program operation. For NAND technology, the program pulse is a voltage applied to or used to bias a selected word line and/or that is applied to the control gates of memory cells coupled to the selected word line. At least for NAND technology, a program-enabled selected memory cell (or just program-enabled memory cell) is a memory cell that responds, or is at least configured to respond, to a program pulse by increasing a level of its threshold voltage.

FIG. 9 shows that during the program stage, the selected word line WLL1(S) generates the program pulse by increasing the selected word line voltage $V_{WLL1(S)}$ from an initial voltage level up to a program pulse level VPGM. The selected word line WLL1(S) maintains the program pulse at the program pulse level VPGM for a predetermined period of time, and then decreases the voltage back down after the predetermined period of time at or near the end of the program stage. For at least some embodiments, the program pulse level is in a range of about 16 volts (V) to 22 V. Additionally, program controller 622 may control the program pulse level, such as by increasing the level of the selected word line voltage $V_{WLS}$ during the program stage. For some example configurations, the program pulse level may increase according to an increasing number of program-verify loops performed.

For at least some program operations, in order for the program-enabled memory cells to increase their threshold voltage levels in response to a program pulse, the program-enabled memory cells have their drain terminals (or just drains) biased to a voltage at a level lower than the program pulse level VPGM and have their source terminals (or just sources) cut off or electrically disconnected from the source line SL. In particular example configurations, the level lower than the program pulse level VPGM is the ground reference voltage level 0 V. To achieve this biasing, the selected bit lines are configured to bias the drain-sides of channels coupled to the program-enabled memory cells with selected bit line voltages at a program selected bit line level VPSB that is lower than the program pulse level VPGM, such as 0 V for example. FIG. 9 collectively labels the selected bit line voltages generated on the selected bit lines BL1(S) and BL3(S) as $V_{BL(S)}$, and shows the selected bit line voltages $V_{BL(S)}$ at a program selected bit line level VPSB during the program stage.

In addition, at least for some example configurations, the SGS line SGSL and the source SL generate their respective SGS line and source line voltages $V_{SGSL}$, $V_{SL}$ at levels that are the same or about the same as each other in order to turn off the SGS transistors SGST during the program stage, which in turn cuts off the source terminals of the memory cells from the source line SL. For some example configurations, the source line SL generates its source line voltage $V_{SL}$ at a program source line level VPSL that is positive (i.e., above the ground reference voltage 0 V), such as 2 V for example, to more effectively cut off the source line SL from the source terminals and/or to reduce the likelihood or impact of channel disturbs. The program source line level VPSL may alternatively be referred to as a program source level PROGSRC. The SGS line SGSL may generate its SGS line voltage $V_{SGSL}$ at a program SGS level that is the same as or about the same as the program source line level VPSL, as indicated in FIG. 9.

In addition, during the program stage, the unselected word line WLL2(U) may generate an unselected word line voltage $V_{WLL2(U)}$ at a program unselected word line level VPUW. In some example configurations, the unselected word line voltage generated by unselected word lines may be referred to as a pass voltage or a voltage generated at a pass voltage level VPASS. In addition or alternatively, for at least some example configurations, the program unselected word line level VPUW (or pass voltage level VPASS) may be in a range of about 8-11 V, such as 10 V for example, although other voltage levels may be possible.

Also, the unselected bit lines may bias the drain-sides of channels coupled to program-inhibited memory cells, and in turn the drains of the program-inhibited memory cells, with an unselected bit line voltage at a program unselected bit line level VPUB that will lock out or prevent selected memory cells from increasing their threshold voltage in response to the program pulse. For at least some example configurations, the program unselected bit line level VPUB is higher than the program selected bit line level VPSB, such as in a range of about 2-3 V for example. Also, for at least some example configurations, the program unselected bit line level VPUB may alternatively be referred to as a sense amp VDD level VDDSA. Accordingly, FIGS. 8A and 9 illustrate the unselected bit line BL2(U) biasing the program-inhibited memory cell P-I MC2(U) with an unselected bit line voltage $V_{BL2(U)}$ at the program unselected bit line level VPUB.

Also, for the example program operation in FIG. 8, the selected bit lines BL1(S), BL3(S) and the selected word line WLL1(S) are also coupled to unselected memory cells that are not to be programmed during the program operation, namely the first and third unselected memory cells MC1(U), MC3(U) of the unselected word line cell group WLCG2(U). For this situation (and other similar situations during program operations), the SGD lines SGD1, SGD2 are used to program-enable those memory cells that are part of the selected word line cell group WLCG1(S), and to program-inhibit those memory cells that are part of the unselected word line cell group WLCG2(U).

To do so, the first SGD line SGD1 is configured as a selected SGD line SGD1(S) that generates a selected SGD line voltage at a program selected SGD level VPSSGD, which in turn configures the SGD transistors coupled to the first SGD line SGD1 as enabled SGD transistors SGDT(E). As used herein, an enabled SGD transistor is an SGD transistor that enables or allows a selected bit line to bias the drain terminal of a memory cell coupled to the selected bit line. Otherwise stated, an enabled SGD transistor is a transistor that enables or allows a drain terminal of a memory cell to be biased by a selected bit line. Accordingly, with respect to FIG. 8A, by being coupled to both selected bit lines BL1(S), BL3(S) and the selected SGD line SGD1(S), first and third SGD transistors coupled to the first SGD line SGD1(S) are configured as enabled SGD transistors SGDT1(E), SGDT3(E) and, in turn, program-enable the first and third selected memory cells MC1(S), MC(3) of the selected word line cell group WLCG1(S).

On the other hand, the second SGD line SGD2 is configured as an unselected SGD line SGD2(U) that generates an unselected SGD line voltage at a program unselected SGD level VPUSGD, which in turn configures the SGD transistors coupled to the unselected second SGD line SGD2 (U) as inhibited SGD transistors SGDT(I). An inhibited SGD transistor is an SGD transistor that prevents, inhibits, or locks out a selected bit line from biasing the drain terminal of a memory cell coupled to the selected bit line. Otherwise stated, an inhibited SGD transistor is a transistor that prevents, inhibits, or locks out a drain terminal of a memory cell from being biased by a selected bit line. Inhibiting an SGD transistor may alternatively be referred to as boosting the SGD transistor. With respect to FIG. 8A, by being coupled to both the selected bit lines BL1(S), BL3(S) and the unselected SGD line SGD2(U), the first and third SGD transistors coupled to the second SGD line SGD2(U) are configured as inhibited SGD transistors SGDT1(I), SGDT3(I) and, in turn, program-inhibit the first and third unselected memory cells MC1(U), MC3(U) of the unselected word line cell group WLCG2(U).

For some example configurations, the program selected SGD level is higher than the program unselected SGD level. In particular configurations, the program selected SGD level PSSGD is 3 V, and the program unselected SGD level PUSGD is 0 V, although other voltage levels may be possible.

In general, certain combinations of selected and unselected SGD and bit line voltages applied to the SGD transistors may either enable them or inhibit them. In particular implementations, the combination of a selected SGD line voltage and a selected bit line voltage applied may enable the SGD transistors, and the other combinations may inhibit the SGD transistors.

In further detail, an SGD transistor SGDT that has its control gate biased with a selected SGD line voltage and its drain biased with a selected bit line voltage may be enabled. Accordingly, the program circuit 600 may enable an SGD transistor by supplying a selected SGD line coupled to the SGD transistor with the selected SGD line voltage $V_{SGDS}$ and supplying a selected bit line coupled to the SGD transistor with the selected bit line voltage $V_{BLS}$.

An SGD transistor that has its control gate biased with a selected SGD line voltage and its drain biased with an unselected bit line voltage may be inhibited. This type of inhibiting may be referred to as x-mode boosting. The program circuit 600 may perform x-mode boosting to inhibit an SGD transistor by supplying a selected SGD line coupled to the SGD transistor with the selected SGD line voltage $V_{SGDS}$ and an unselected bit line coupled to the SGD transistor with the unselected bit line voltage $V_{BLU}$.

An SGD transistor that has its control gate biased with an unselected SGD line voltage and its drain biased with an unselected bit line voltage may be inhibited. This type of inhibiting may be referred to as xy-mode boosting. A program circuit 600 may perform xy-mode boosting to inhibit an SGD transistor by supplying an unselected SGD line coupled to the SGD transistor with the unselected SGD line voltage $V_{SGDU}$ and by supplying an unselected bit line coupled to the SGD transistor with the unselected bit line voltage $V_{BLU}$.

An SGD transistor that has its control gate biased with an unselected SGD line voltage and its drain biased with a selected bit line voltage may be inhibited. This type of inhibiting may be referred to as y-mode boosting. A program circuit 600 may perform y-mode boosting to inhibit an SGD transistor by supplying an unselected SGD line coupled to the SGD transistor with the unselected SGD line voltage $V_{SGDU}$ and by supplying a selected bit line coupled to the SGD transistor with the selected bit line voltage $V_{BLS}$.

Referring particularly to the program operation described with reference to FIGS. 8A-8C and 9, the program controller 622 may control the voltage supply circuit 604 to supply the program voltages to the control gate lines for a predetermined period of time associated with the program stage. Upon expiration of the predetermined time period, the program controller 622 may control the voltage supply circuit 604 to lower the program voltages to initial levels in order to end, terminate, or exit the program stage. Upon exiting the program stage, the program controller 622 may transition the program operation to an initial verify sub-stage of the program-verify loop.

In general, the program controller 622 can control the transitioning of stages performed in a program operation. A transition of a program operation is a movement or a progression of the program operation from one (sub-)stage to another (sub-)stage, such as from a first (sub-)stage to a second (sub-)stage, or from a current (sub-)stage to a (sub-)next stage. The two (sub-)stages can be in the same program loop. For example, the transition can be a transition from a program stage to a verify stage or an initial sub-stage of the verify stage, or can be a transition from one verify sub-stage to another verify sub-stage, such as in accordance with a verify order of a program-verify loop. Alternatively, the two (sub-)stages can be in different program loops. For example, for two program-verify loops, the transition can be from a last verify sub-stage of a current program-verify loop to a program stage of a next program-verify loop. As another example, for two program-only loops, the transition can be from a program stage of a current program-only loop to a program stage of a next program-only loop.

The program controller 622 may control the transitioning of the (sub-)stages by controlling the program and verify voltages that the voltage supply circuit 604 supplies to the control lines of the block 602. For example, as illustrated in FIG. 9, the program controller 622 ends or terminates the program stage at least by transitioning the program voltages from program levels down to initial levels. This includes stopping the supply of the program pulse to the selected word line WLL1(S), causing the selected word line WLL1(S) to decrease its selected word line voltage from the program pulse level VPGM down to an initial level, such as 0 V for example.

Another example, the program controller 622 may control the transitioning by changing the level of at least one of the control line voltages. To transition from a program stage to a verify stage, such as to an initial verify sub-stage, the program controller 622 may change all of the levels from program voltage levels to verify voltage levels. When transitioning from a first verify sub-stage to a second verify sub-stage, the program controller 622 may control the transition by changing at least one of the verify voltage levels. For example, the program controller 622 may change a verify voltage pulse applied to the selected word line from a first verify voltage pulse level to a second verify voltage pulse level. In addition, the program controller 622 may control the transition of one verify sub-stage to a next verify sub-stage by changing the voltage levels of the bit line voltages according to the bit lines changing their selected statuses between verify sub-stages.

In further detail with respect to the example program operation of FIGS. 8A-8C and 9, suppose for example that the three selected memory cells MC1(S), MC2(S), MC3(S) have target memory state p, target memory state q, and target memory state r, respectively, where the memory states p, q, and r, are any of various memory states into which memory cells can be programmed under a given storage scheme. FIG. 8B shows example biasing conditions for the block 800 to verify the first selected memory cell MC1(S) for memory state p. FIG. 8C shows example biasing conditions for the block 800 to verify the third selected memory cell MC3(S) for memory state r.

The verify sub-stage to verify the first selected memory cell MC1(S) for memory state p is referred to as the first verify sub-stage, and the verify stage to verify the third selected memory cell MC2(S) for memory stage r is referred to as the second verify sub-stage. The first verify sub-stage may or not be the initial verify sub-stage performed directly after the program stage, depending on the verify order. That is, the program controller 622 may or may not directly transition from the program stage to the first verify sub-stage, depending on the verify order. Where the program controller 622 does not directly transition to the first verify sub-stage, the program circuit 600 may perform one or more other verify sub-stages before performing the first verify sub-stage. Additionally, the second verify sub-stage is generally referred to as being performed or occurring after the first verify sub-stage. However, the program controller 622 may or may not directly transition from the first verify sub-stage to the second verify sub-stage, depending on the verify order. Where the program controller 622 does not directly transition to the second verify sub-stage, the program circuit 600 may perform one or more other verify sub-stages after the first verify sub-stage before performing the second verify sub-stage. FIG. 9 shows example voltage waveforms of the verify voltages generated on the control lines of the block 800 for verifying the first and third selected memory cells MC1(S), MC3(S) during the first and second verify sub-stages.

With reference to FIGS. 8B and 9, during the first verify sub-stage, the selected first word line WLL1(S) may generate a selected word line voltage at a verify level in the form of a verify gate voltage pulse, or just verify voltage pulse or verify pulse. For example, the control gate line supply circuit 614 may supply the selected word line voltage $V_{WLS}$ in the form of a verify pulse, and in response, the selected first word line WLL1(S) may generate a verify pulse. As used herein, a verify gate voltage pulse (or verify voltage pulse or verify pulse) is a voltage that is generated, supplied, output, or applied to verify selected memory cells. In general, during a given verify sub-stage, the selected word line generates a verify pulse at a given verify pulse level Vv that corresponds to the memory state associated with the given verify sub-stage. The given verify pulse level may be a predetermined level aligned with a lower tail of a model or target threshold distribution curve. Example verify pulse levels Vv include those shown and previously described with reference to FIGS. 5A-5D. FIGS. 8B and 9 show the selected word line WLL1(S) generating the verify pulse at a pth verify pulse level Vvp associated with verifying selected memory cells having target memory state p.

For a given program-verify loop that includes a plurality of verify sub-stages, the control gate line voltage supply circuit 606 applies a sequence or series of verify pulses at a sequence or series of verify pulse levels Vv according to a verify order, during or over the course of the plurality of verify sub-stages. In response, the selected word line may sequentially generate a plurality of verify pulses, each during one of the multiple verify sub-stages, and each at a respective verify pulse level Vv corresponding to the verify sub-stage in which the verify pulse is being generated. In particular example configurations, the selected word line may generate the sequence of verify pulses by transitioning the selected word line voltage from one verify pulse level to a next verify pulse level as the program circuit 600 transitions from one verify sub-stage to the next. For performance of at least some verify stages, the selected word line may transition from one verify pulse level to the next without decreasing the selected word line voltage down to an initial or low level (e.g., 0 V) in between verify pulses. Another way to characterize the generation of the verify pulses during a program-verify loop is that during a program-verify loop that includes a plurality of verify sub-stages, the selected word line generates a verify pulse at a plurality of verify pulse levels, each corresponding to one of the plurality of verify sub-stages. For some example configurations, a range of the various verify pulse levels may extend from a lowest verify pulse level of 0.8 V to a highest verify pulse level of 6 V, although other verify pulse levels or range of verify pulse levels may be possible.

As previously described, the program circuit 600 verifies selected memory cells during verify stages, including during verify sub-stages, by determining the program statuses of the selected memory cells. In the verify stages, including in the verify sub-stages, the program circuit 600, through use of the sense circuits 620, performs sense operations to verify the selected memory cells by sensing their program statuses—i.e., by sensing whether and when the selected memory cells are sufficiently programmed. Otherwise stated, the program circuit 600 executes or performs verify stages, including verify sub-stages, by performing sense operations to sense or otherwise determine program statuses of selected memory cells.

In general, as used herein, a sense operation is a memory operation performed to determine a response of a memory cell that is biased according to predetermined bias conditions. A bias with which the memory cell is biased during a sense operation may be any of various types of bias, including any number of biases or any type of bias, such as a voltage, a current, or any of various signals such as direct current (DC) signals or alternating current (AC) wired or wireless signals that can affect a behavior or trigger a response of the memory cell. A status of a memory cell is generally a condition or a state of the memory cell. The status may be one of a plurality of possible predetermined conditions or states in which the memory cell can be. A response of the memory cell when subjected to the bias conveys or communicates the status of the memory cell.

In further detail, a status of a memory cell may be any of various types of statuses. A status type may pertain or be specific to the memory operation for which a sense operation is performed. As previously described, one type of status is a program status, which can include sufficiently programmed, insufficiently programmed, or over-programmed. During a verify stage, or particularly during a verify sub-stage, a sense circuit performs a sense operation to determine the program status of a memory cell—i.e., to determine if the memory cell is sufficiently programmed or insufficiently programmed. Another status type is a read status, which is the memory state of a memory cell and/or a status of whether a memory cell has a threshold voltage above or below a read pulse level of a read pulse applied to a selected word line. For some example configurations, a sense circuit may perform a sense operation during a read stage of a read operation to sense the memory state of a memory cell, and in turn the data value of the data that the memory cell is storing.

A response of the memory cell produced during a sense operation may be any of various measurable properties of an electrical signal, such as a DC or AC voltage or current, or an electromagnetic wave, that the memory cell can generate, conduct, induce, emit, radiate, or otherwise cause to be created in response to being biased during the sense operation. Example measurable properties may include a magnitude, an amount, a level, a frequency, a slope, a duty cycle, a pulse width, a waveform type (sinusoidal, square, sawtooth, e.g.), a rate of change (e.g., a rate of decay or a rate of increase), a modulation, or a signal-to-noise ratio, as non-limiting examples. The type of the response and the value of the response that is measured or sensed may depend on a storage parameter of the memory cell and the level, value, or state of the storage parameter, which in turn indicates the status of the memory cell.

At least for NAND technology, a response of a memory cell is a current that the memory cell draws or causes to be drawn through a bit line. During a sense operation, a memory cell is biased with a predetermined set of voltages to induce the memory cell to draw a current through a bit line. An amount of current that the memory cell draws or causes to draw depends on a threshold voltage level of the memory cell, and in turn, indicates a status, such as a program status or a read status of the memory cell.

A sense circuit is a circuit that senses a response of a memory cell while the memory cell is being biased during a sense operation. A sense circuit can sense the response by sensing or detecting a presence or absence of the response, and/or by measuring an amount, level, value, or magnitude of the response. The function of sensing a status of a memory cell performed by the sense circuits 620 in FIG. 6 have circuit structures that connect to the bit lines BL coupled to the memory cells by enabling or forming current paths that allow currents to flow through them to the bit lines. Other structural configurations for performing the function of current sensing may be possible. For example, other example sense circuits may be connected to the word lines instead of the bit lines, and determine the statuses of the memory cells based on current flow drawn through the word lines. Other example sense circuits may sense a voltage on a word line or a bit line without necessarily having that voltage be dependent on current drawn through the selected memory cells. For such configurations, the sense circuit performs voltage sensing rather than current sensing to determine statuses of the selected memory cells.

Turning back to the first verify sub-stage in FIG. 8B, the sense circuits 620 perform sense operations to sense current drawn through selected bit lines coupled to verify-enabled memory cells having target memory state p, while the selected word line WLL1(S) generates a verify pulse at the pth verify pulse level Vvp. For verify-enabled cells that are insufficiently programmed—e.g., have a threshold voltage that is below the range of threshold voltage levels associated with memory state p, the verify pulse at the pth verify pulse level Vvp will be higher than the threshold voltages of the insufficiently programmed memory cells, causing those verify-enabled memory cells to conduct or draw current through the selected bit lines to which they are coupled. Otherwise stated, during a verify sub-stage, verify-enabled memory cells draw current through the selected bit lines to which they are coupled when they are insufficiently programmed. On the other hand, for verify-enabled cells that are sufficiently programmed—e.g., have a threshold voltage that is in the range of threshold voltage levels associated with memory state p, the verify pulse at the pth verify pulse level Vvp will be below or lower than the threshold voltages of the sufficiently programmed memory cells, preventing those verify-enabled memory cells from conducting or drawing current through the selected bit lines to which they are coupled. Otherwise stated, during a verify sub-stage, verify-enabled memory cells draw no or an insignificant amount of current through the selected bit lines to which they are coupled when they are sufficiently programmed.

In practical implementations for at least some example configurations, verify-enabled memory cells may draw varying amounts of current, and in some embodiments, may be characterized as fully conducting or partially conducting depending on how close their threshold voltages are to the verify pulse level. Different program circuits 600 and their respective sense circuits may handle sense operations and identify program statuses in various ways according to different responses of verify-enabled memory cells.

In the focused example in FIG. 8B, of the three selected memory cells MC(S), only the first selected memory cell MC1(S) has the target memory state p, and so only the first selected memory cell of the three is a verify-enabled memory cell V-E MC1(S) in the first verify stage. The other two selected memory cells MC2(S), MC3(S) are verify-inhibited memory cells V-I MC2(S), V-I MC3(S). Accordingly, during the first verify sub-stage, the first bit line BL1 is a selected bit line BL1(S), and the second and third bit lines BL2, BL3 are unselected bit lines BL2(U), BL3(U).

For the first verify sub-stage, the control lines of the block 800 are biased so that a sense circuit 620 coupled to the selected bit line BL1(S) can sense whether the first selected memory cell MC1(S) draws current through the selected first bit line BL1(S) in response to its control gate being biased with the verify pulse at the pth verify pulse level Vvp. Herein, during verify stages, the verify levels at which the control lines are biased are also or alternatively referred to as sense levels, in the context that sense operations are performed to verify the memory cells.

In further detail, the selected first bit line BL1(S) is configured to generate a selected bit line voltage $V_{BL1(S)}$ at a verify or sense selected bit line level VSSB (or VBLC). The unselected second and third bit lines BL2(U), BL3(U) are configured to generate unselected bit line voltages $V_{BL2(U)}$, $V_{BL3(U)}$ (collectively labeled in FIG. 9 as unselected bit line voltage $V_{BL(U)}$ at a verify or sense unselected bit line level VSUB. During verify stages (or during sense operations), the sources of the memory cells are not cut off from the source line, and so for at least some embodiments, the sense bit line levels are measured, indicated, designed for, or referenced, with reference to the source line voltage $V_{SL}$. In particular configurations, the sense selected bit line level VSSB is a positive voltage above a sense source line level VSSL, such as in a range of about 0.2 V to 0.8 V above the sense source line level VSSL. The sense unselected bit line level VUSB is the same or about the same as the sense source line level VSSL, so that there is a zero voltage difference between the source and drain ends of channels including verify-inhibited memory cells, which in turn may prevent current flow through the unselected bit lines and verify-inhibited memory cells, thereby reducing power consumption during the first verify sub-stage.

The sense source line level VSSL may alternatively be referred to as a cell source level VCELSRC. In some example configurations, the sense source line level VSSL is at the ground reference voltage level 0 V. In other example configurations, the sense source line level VSSL is a positive voltage above 0 V, such as 1 V for example. One benefit of the source line SL generating its source line voltage $V_{SL}$ at a positive voltage (e.g., 1 V) is to sense for a negative threshold voltage of memory cells by creating a negative voltage difference between the source line voltage and a selected word line voltage. Creating a bias setting that allows for sensing negative threshold voltages by setting the sense line voltage $V_{SL}$ to a higher level than a selected bit line voltage may be easier from a design implementation, rather than trying to configure the voltage supply circuit 604 to generate a negative voltage below the ground reference voltage.

In addition, during the first verify sub-stage, the unselected word line WLL2(U) may generate an unselected word line voltage $V_{WLL2(U)}$ at a verify or sense unselected word line level VSUW. In some example configurations, the unselected word line voltage generated by unselected word lines may be referred to as a read voltage or a voltage generated at a read voltage level VREAD. In addition or alternatively, for at least some example configurations, the sense unselected word line level VSUW (or VREAD) may be in a range of about 7-9 V, such as 8 V for example, although other voltage levels may be possible.

Also, similar to the program stage in FIG. 8A, the selected bit line BL1(S) and the selected word line WLL1(S) are also coupled to the unselected first memory cell MC1(U) of the unselected word line cell group WLCG2(U) during the first verify sub-stage, as indicated in FIG. 8B. If the unselected first memory cell MC1(U) is verify-enabled during first verify sub-stage, it could draw current through the selected bit line BL1(S), which could lead to the sense circuit coupled to the selected bit line BL1(S) identifying an incorrect program status of the selected first memory cell MC1(S) when performing the sense operation during the first verify stage. Similar to the program stage, the first and second SGD lines SGD1, SGD2 are configured as selected and unselected SGD lines, respectively, in order to verify-enable the selected memory cells coupled to the selected word lines and selected bit lines, and verify-inhibit the unselected memory cells coupled to selected word lines and selected bit lines.

With respect to FIG. 8B, the first SGD line SGD1 generates a selected SGD line voltage $V_{SGD1(S)}$ at a verify or sense selected SGD level VSSSGD level (which may also or alternatively be referred to as a select gate level VSG), which at least for some example configurations may be in a range of about 5-8 V. An SGD transistor that has its control gate biased with a selected SGD line voltage at the sense selected SGD level VSSSGD and its drain terminal biased with a selected bit line voltage at the sense selected bit line level VSSB (or VBLC) may be enabled or turned on to allow a memory cell to which it is coupled draw current during a verify stage if the memory cell is insufficiently programmed. In addition, the second SGD line SGD2 generates an unselected SGD line voltage $V_{SGD2(U)}$ at a verify or sense unselected SGD level VSUSGD level, which at least for some example configurations may be at or close to 0 V. An SGD transistor that has its control gate biased with an unselected SGD line voltage at the sense unselected SGD level VSUSGD despite having its drain terminal biased with a selected bit line voltage at the sense selected bit line level VSSB (or VBLC) may be inhibited or turned off to prevent or inhibit an unselected memory cell to which it is coupled draw current during a verify stage.

In addition, at least for some example configurations, the SGS line SGSL may generate the SGS line voltage $V_{SGSL}$ at a sense SGS level VSSGS, which may also be the same level as the sense selected SGD level VSSSGD. Otherwise stated, the selected SGD line SGD1 and the SGS line SGSL may generate their voltages at the same select gate level VSG during the first verify stage.

The program controller 622 may control the voltage supply circuit 604 at the verify or sense levels as shown in FIG. 8B during the first verify sub-stage. During this time period, a sense circuit 620 coupled to the selected first bit line BL1(S) may perform a sense operation to sense for current drawn through the selected first bit line BL1(S). Based on the sensing, the sense circuit 620 may generate a sense result signal that indicates the program status of the verify-enabled memory cell V-E MC1(S) or otherwise keeps track or a record of the program status of the verify-enabled memory cell V-E MC1(S). The sense circuit 620 may output the sense result signal to the program controller 622 or otherwise allow the program controller 622 to determine the program status of the verify-enabled memory cell V-E MC1(S) so that the program controller 620 can determine whether to end the program operation, or at least determine whether to program-enable or program-inhibit the selected first memory cell MC1(S) for a next program loop.

At the end of the first verify sub-stage, the program controller 622 may transition to a next verify sub-stage. At some point during the program-verify loop, the program controller 622 may transition to the second verify sub-stage, either directly after or after performing one or more verify sub-stages after the first verify sub-stage. FIG. 8C shows example biasing conditions for the block 800 to verify the third selected memory cell MC3(S) for memory state r. FIG. 9 shows example voltage waveforms of the verify voltages generated on the control lines of the block 800 for verifying the selected third memory cells MC3(S) during the second verify sub-stage.

For performance of the second verify sub-stage, the block 800 may be biased similarly as in the first verify sub-stage. One difference is that the selected word line WLL1(S) may generate a verify pulse at an rth verify pulse level associated with memory state r, instead of at the pth verify pulse level associated with memory state p. Also, since the selected third memory cell MC3(S) has the target memory state r, the selected third memory cell is a verify-enabled memory cell V-E MC3(S), while the selected first and second memory cells are verify-inhibited memory cells V-I MC1(S), V-I MC2(S). Accordingly, the first and second bit lines BL1, BL2 are configured as unselected bit lines BL1(U), BL2(U) for the second verify stage and generate unselected bit line voltages $V_{BL1(U)}$, $V_{BL2(U)}$ (collectively labeled in FIG. 9 as $V_{BL(U)}$) at the sense unselected bit line level VSUB, while the third bit line BL3 is configured as a selected bit line BL3(S) for the second verify sub-stage and generates a selected bit line voltage $V_{BL3(S)}$ at the sense selected bit line level VSSB. The first and second SGD lines SGD1, SGD2 may continue to be selected and unselected SGD lines SGD1(S), SGD2(U), respectively so that the third SGD transistor SGDT3 coupled to the selected first SGD line SGD1(S) is an enabled SGD transistor SGDT3(E), and the third SGD transistor SGDT3 coupled to the unselected second SGD line SGD2(U) is an inhibited SGD transistor SGD3(I).

The program controller 622 may control the voltage supply circuit 604 to bias the control lines of the block 800 at their respective verify levels until the program controller 622 determines that a predetermined period of time for performing the second verify sub-stage has expired or ended. During the predetermined time period, the program controller 622 may control the sense circuits 620 to sense the program statuses of the verify-enabled memory cells. For example, with reference to FIG. 8C, the program controller 622 may control a sense circuit coupled to the selected third bit line BL3(S) to sense a status of the verify-enabled memory cell V-E MC3(S). At the end of the second program sub-stage, the program controller 622 may transition to a next verify sub-stage, or if the second verify stage is the last verify sub-stage of the program-verify loop, then program controller 622 may either end the program operation if all of the selected memory cells of the selected word line group WLCG1(S) are sufficiently programmed, or transition to a next program-verify loop within the program operation.

As previously described, the program circuit 600 may perform a verify stage according to verify order that identifies the memory states to verify and the order in which to perform verify sub-stages associated with the memory states during the verify stage. To perform the verify sub-stages according to a verify order, the control gate line voltage supply circuit 606 may supply or apply a series or sequence of verify pulses at series or sequence of verify pulse levels Vv to the selected word line according to the verify order. As part of transitioning between verify sub-stages, the control gate line voltage supply circuit 606 may supply a next verify pulse at a next verify pulse level to the selected word line according to the verify order. Accordingly, to transition from a current verify sub-stage to a next verify sub-stage, the control gate line supply circuit 606 transitions from supply a current verify pulse at a current verify pulse level to a next verify pulse at a next verify pulse level. The control gate line supply circuit 606 may transition from the current verify pulse to the next verify pulse by directly transitioning from the current verify pulse level to the next verify pulse level. That is, the control gate line supply circuit 606 does not transition a level of the current verify pulse to an initial or low voltage level (such as the 0 V, e.g.) before transitioning to supplying the next verify pulse. Accordingly, as the control circuit 600 performs and transitions through verify sub-stages of a verify stage according to a verify order, the control gate line voltage supply circuit 606 sequentially applies the sequence of verify pulses according to the verify order by directly transitioning to next verify pulse levels as defined or determined by the verify order. In addition, throughout the duration of the verify stage over the plurality of verify sub-stages, the control gate line voltage supply circuit 606 may maintain the other control gate line voltages at their respective verify levels.

Figure 10:
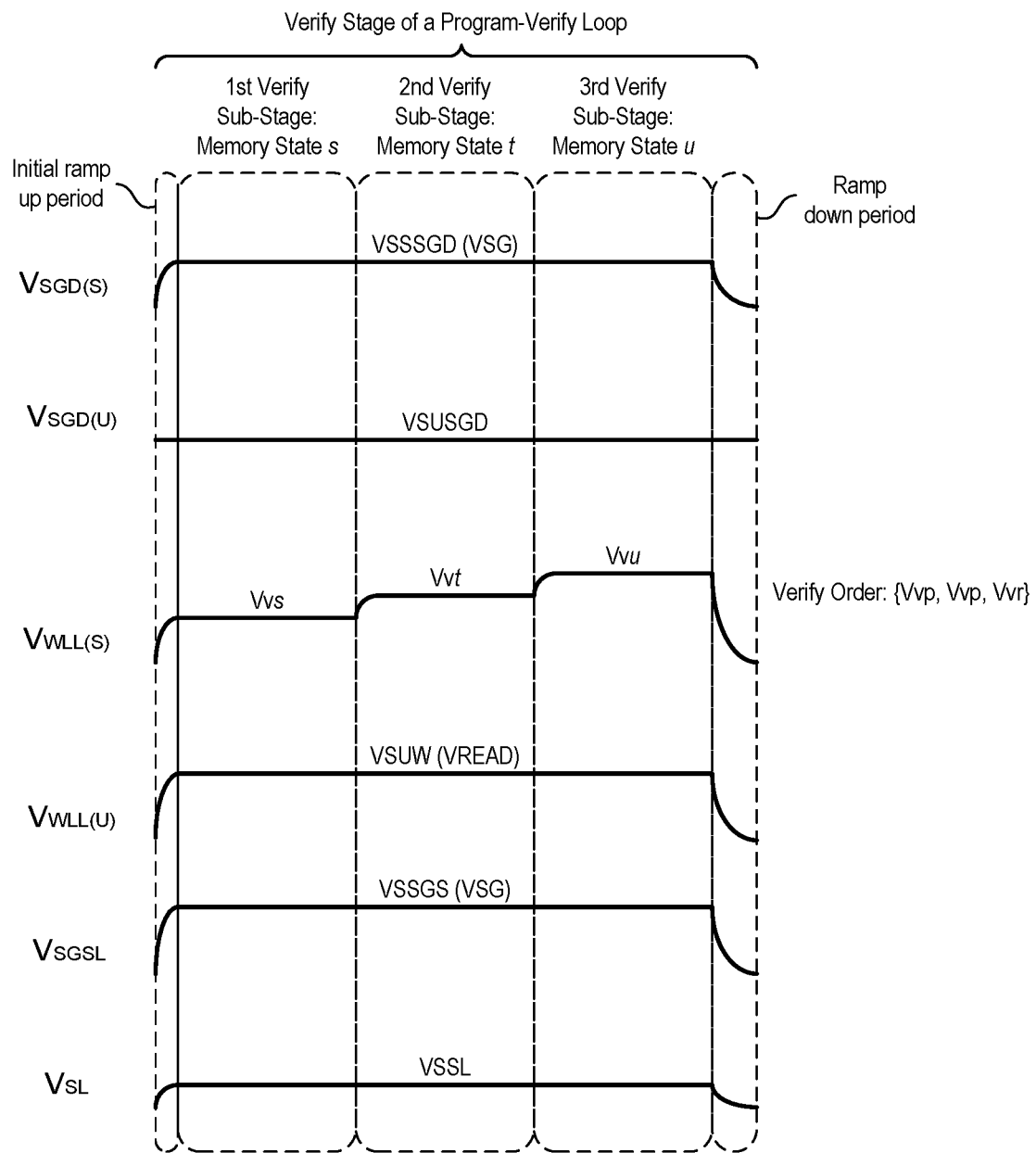
FIG. 10 is a timing diagram of voltage waveforms of control gate and source line voltages generated during consecutive verify sub-stages of a verify stage.

FIG. 10 shows a timing diagram of example waveforms generated on the control gate lines of the block 602 during an example verify stage of a program-verify loop of a program operation. In the example verify stage, the program controller 622 has determined to verify selected memory cells having memory state s, memory state t, and memory state u as their target memory states. Memory states s, t, and u may represent any of various memory states into which memory cells can be programmed. In addition, more or fewer than three memory states may be possible for other example verify stages.

In addition, the program controller 622 has determined a verify order of memory state s, memory state t, and memory state u. For particular configurations, the program controller 622 may determine the verify order according to sequentially increasing threshold voltage ranges. For example, with reference to FIG. 10, memory state t is associated with a higher threshold voltage range than memory state s, and memory state u is associated with a higher threshold range than memory states s and t. Accordingly, to perform the verify stage, the program controller 622 sets the verify order to be memory state s, then memory state t, and then memory state u.

To perform the verify stage, the program circuit 600 sequentially performs the verify sub-stages for memory states s, t, and u in the verify order. That is, to perform the verify stage according to the verify order, the program controller 622 first performs a first verify sub-stage for memory state s, then a second verify sub-stage for memory state t, and then a third verify sub-stage for memory state u.

The verify stage may include an initial ramp up time period during which the voltage supply circuit 604 ramps up voltages on at least some of the control gate lines from an initial voltage level (e.g., 0 V) to initial verify levels. As shown in FIG. 10, except for the selected word line voltage $V_{WLL(S)}$, the voltage supply circuit 604 maintains the verify or sense control gate line levels and the verify or sense source line level constant over the duration of the verify stage—i.e., over the consecutive verify sub-stages.

With respect to the selected word line voltage $V_{WLL(S)}$, the voltage supply circuit 604, such as with the control gate line voltage supply circuit 606, may sequentially apply the sequence of verify pulses at corresponding verify pulse levels according to the verify sub-stages being performed and the verify order in which the verify sub-stages are performed for the verify stage. For example with respect to FIG. 10, the voltage supply circuit 604 may apply a first verify pulse to a selected word line WLL(S) at the sth verify pulse level Vvs during the first verify sub-stage for memory state s, then supply a second verify pulse to the selected word line WLL(S) at the tth verify pulse level Vvt during the second verify sub-stage, and then supply a third verify pulse to the selected word line WLL(S) at the uth verify pulse level Vvu during the third verify sub-stage. At least in this context, the program circuit 600 sequentially transitions through the verify sub-stages by transitioning from applying a current verify pulse to applying a next verify pulse to the selected word line WLL(S) according to the verify order.

Also, at least for some example verify stages, such as the one shown in FIG. 10, the control gate line supply circuit 606 applies consecutive or a sequence of verify pulses over consecutive verify stages to the selected word line WLL(S) by directly transitioning a selected word line voltage $V_{WLL(S)}$ generated on the selected word line WLL(S) from a current verify pulse level to the next verify pulse level. For two consecutive verify sub-stages including a current verify sub-stage associated with a first memory state and a next verify sub-stage associated with a second memory state, the control gate line voltage supply circuit 606 directly transitions the selected word line voltage $V_{WLL(S)}$ by generating the selected word line voltage $V_{WLL(S)}$ at a first verify pulse level associated with the first memory state, and then directly transitioning the selected word line voltage $V_{WLL(S)}$ from the first verify pulse level to a second verify pulse level associated with the second memory state when the verify stage transitions from the current verify sub-stage to the next verify sub-stage—i.e., when the current verify sub-stage ends and the next verify sub-stage begins.

For example, as shown in FIG. 10, the control gate line voltage supply circuit 604 generates the selected word line voltage $V_{WLL(S)}$ at the sth verify pulse level Vvs during the first verify sub-stage. Then, when the first verify sub-stage ends and the second verify sub-stage begins, the control gate line voltage supply circuit 606 directly transitions from generating the selected word line voltage $V_{WLL(S)}$ at the sth verify pulse level Vvs to generating the selected word line voltage $V_{WLL(S)}$ at tth verify pulse level Vvt. Similarly, when the second verify sub-stage ends and the third verify sub-stage begins, the control gate line voltage supply circuit 606 directly transitions from generating the selected word line voltage $W_{WLL(S)}$ at the tth verify pulse level Vvt to generating the selected word line voltage $V_{WLL(S)}$ at the uth verify pulse level Vvu. In this context, the control gate line voltage supply circuit 606 may be considered to be sequentially stepping through the verify pulses or the verify pulse levels according to the verify order in order to perform the verify stage.

In addition, although not shown in the timing diagram of FIG. 10, during the verify sub-stages, the bit line voltage supply circuit 608 may apply selected and unselected bit line voltages to the selected and unselected bit lines, as previously described. For example with respect to FIG. 10, during the first verify sub-stage, the bit line voltage supply circuit 608 may apply a selected bit line voltage to those bit lines coupled to selected memory cells having memory state s as their target memory states in order to verify-enable those selected memory cells, and may apply an unselected bit line voltage to those bit lines coupled to selected memory cells having target memory states other than memory state s in order to verify-inhibit those selected memory cells during the first verify sub-stage. When the verify stage transitions from the first verify sub-stage to the second verify sub-stage, the bit line voltages supply circuit 608 may change or transition its bit line biasing so that it applies the selected bit line voltage to those bit lines coupled to selected memory cells having memory state t as their target memory states in order to verify-enabled those selected memory cells, and may apply the unselected bit line voltage to those bit lines coupled to selected memory cells having target memory states other than memory state t in order to verify-inhibit those selected memory cells during the second verify sub-stage. The bit line voltage supply circuit 608 may similarly change its bit line biasing when transitioning to the third verify sub-stage for memory state u.

Also, as previously described, the program controller 622 may control the sense blocks 620 during each verify sub-stage in order to verify the program statuses of the verify-enabled memory cells. For example, during the first verify sub-stage, the program controller 622 may control the sense blocks 620 coupled to the selected bit lines to sense the program statuses of verify-enabled memory cells having memory state s as their target memory states. Then, during the second verify sub-stage, the program controller 622 may control the sense blocks 620 coupled to the selected bit lines to sense the program statuses of verify-enabled memory cells having memory state t as their target memory states. Similarly, during the third verify sub-stage, the program controller 622 may control the sense blocks 620 coupled to the selected bit lines to sense the program statuses of the verify-enabled memory cells having memory state u as their target memory states. At the end of the verify stage, the program controller 622 will have obtained, or at least have had the sense blocks 620 sense, the program statuses of the various selected memory cells having memory states s, t, and u during the three verify sub-stages.

At, or immediately following, the end of the last verify sub-stage, the verify stage may include a ramp down period to conclude the verify stage. During the ramp down period, the voltage supply circuit 604 may ramp down or decrease the verify voltages on the control lines (including the control gate and source lines as shown in FIG. 10) back to initial levels.

For at least some example configurations, the program circuit 600 is configured to perform program-verify loops with delay periods. As used herein, a delay period is a period of time in between two stages of a program-verify loop, such as between a program stage and a verify stage. A delay period extends from an end of a first stage to a start of a second stage, where the first and second stages are part of the same or different program-verify loops. The program controller 622 may insert the delay period into a program-verify loop by waiting, such as for a predetermined time period, before supplying or applying the voltages of a next stage to the control lines of the block. The amount of time may be from a time that the program controller 622 could first apply the voltages of the next stage to the block to a time that the program controller 622 does apply the voltages of the next stage to the block.

For example, at the end of a program stage of a program-verify loop, the program controller 622 may have an earliest time that it can apply the verify voltages of a next verify stage to the block. However, instead of applying the verify voltages at the earliest time, the program controller 622 waits for a period of time before applying the verify voltages to perform the next verify stage. By waiting, the program controller 622 inserts a delay period in between the program stage and the verify stage of the program-verify loop.

As another example, at the end of a verify stage, if there are still selected memory cells that are insufficiently programmed, the program controller 622 initiates a next program-verify loop by applying voltages at program levels to perform a program stage of the next program-verify loop. The program controller 622 may have an earliest time that it can apply the program voltages to perform the program stage of the next program-verify loop. However, instead of applying the program voltages at the earliest time, the program controller 622 waits for a period of time before applying the program voltages for performance of the program stage. By waiting, the program controller 622 inserts a delay period in between the verify stage of one program-verify loop, and a program stage of a next program-verify loop.

The following embodiments describe program operations where the program controller 622 inserts delay periods in between one or more program stages and one or more verify stages to program a selected location, such as a selected word line cell group, of a block. In one embodiment, the program controller 622 may insert delay periods in between a program stage and a verify stage of one program-verify loop, and/or between a verify stage of one program-verify loop and a program stage of a next program-verify loop. However, rather than stay idle, the program controller 622 moves to another location within the block and programs or verifies at least one memory cell at the other location. In one embodiment, after programming or verifying the memory cell(s) of the other location, the program controller 622 may determine that the delay period has ended, and perform the program or verify stage it delayed.

In particular example configurations, the program circuit 600 is configured to perform program operations with interleaved program-verify loops. As used herein, an interleaved program verify loop is a program loop configured to interleave a program stage or a verify stage for a first set of memory cells of one block between a program stage and a verify stage for a second set of memory cells of the block. The different sets of memory cells may be different word line cell groups of a same block. A program circuit that programs a block with interleaved program-verify loops may not transition to a next interleaved program-verify loop until performing the program and verify stages for each of the program operations. In some embodiments, a program circuit programming data into a block according to interleaved program-verify loops combines a plurality of program-verify loops, each to program different sets of memory cells of the block.

For some example embodiments, the program circuit 600 performs an interleaved program-verify loop by interleaving a program stage for programming a first set of memory cells in between a set of program and verify stages for programming and verifying a second set of memory cells. By interleaving a program stage in between a set of program and verify stages, the program circuit 600 breaks up, or pushes apart, the set of program and verify stages, which inserts a delay of the verify stage. However, rather than stay idle during this delay period, the program circuit 600 performs the interleaved program stage, effectively overlapping the delay period that the program circuit 600 inserted.

Additionally, for some example embodiments, the program circuit 600 performs an interleaved program-verify loop by interleaving a verify stage for verifying a first set of memory cells in between a set of program and verify stages for programming and verifying a second set of memory cells. By interleaving a verify stage in between a set of program and verify stages, the program circuit 600 breaks up, or pushes apart, the set of program and verify stages, which inserts a delay of the verify stage. However, rather than stay idle during this delay period, the program circuit 600 performs the interleaved verify stage, effectively overlapping the delay period that the program circuit 600 inserted.

For at least some example interleaved program-verify loops, an effect or result of the interleaving is a series or sequence of program stages followed by a series or sequence of verify stages. That is, when performing an interleaved program-verify loop, the program circuit 600 first performs all of the program stages of the interleaved program-verify loop, and then performs all of the verify stages of the interleaved program-verify loop.

Figure 11:
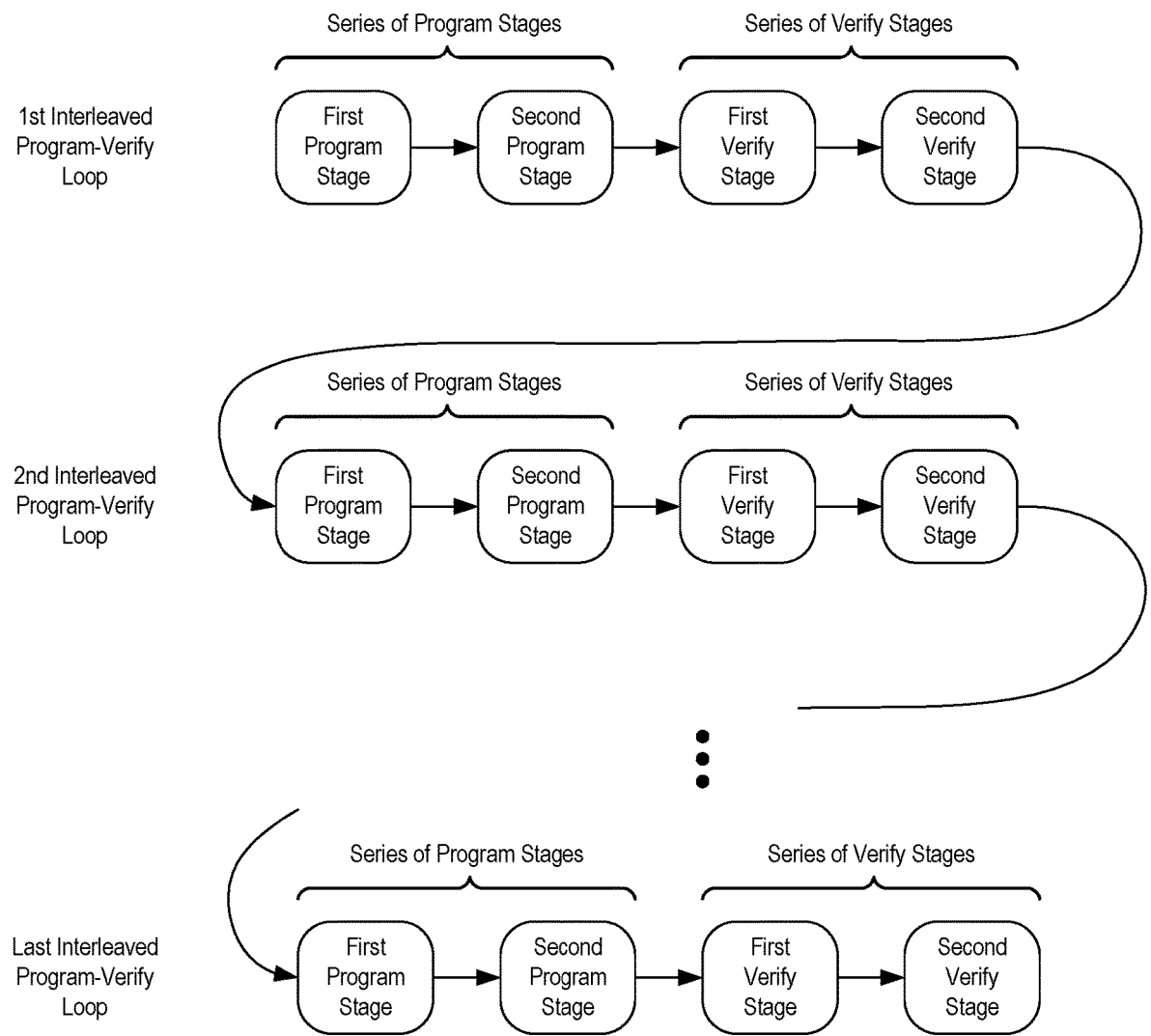
FIG. 11 is a schematic diagram of a program operation performed with interleaved program-verify loops.

FIG. 11 is a schematic diagram of an example program operation performed with interleaved program-verify loops. The program operation performed with interleaved program-verify loops in FIG. 11 is similar to the program operation performed with program-verify loops of FIG. 7B, in that the program operation begins with a first interleaved program-verify loop, and ends with a last interleaved program-verify loop. At the end of an interleaved program-verify loop, if the different sets of selected memory cells still include insufficiently programmed memory cells, then the program circuit 600 performs another or a next interleaved program-verify loop. The program circuit 600 continues to perform another or next interleaved program-verify loop until all of the selected memory cells of the different sets are sufficiently programmed.

However, the interleaved program-verify loops of FIG. 11 differ from the program-verify loops in FIG. 7B at least in that the interleaved program-verify loops each include multiple program stages and multiple verify stages for programming and verifying different sets of memory cells of a block. As previously described, each set of memory cells may be a word line cell group of the block. The different sets of memory cells may be coupled to the same word line or coupled to different word lines of the block.

Accordingly, an interleaved program-verify loop interleaves at least two program-verify loops, where each program-verify loop programs and verifies a different set of memory cells of the block. For the example interleaved program-verify loops in FIG. 11, each interleaved-program verify loop includes two program-verify loops, including a first program-verify loop that comprises a first program stage and a first verify stage, and a second program-verify loop that comprises a second program stage and a second verify stage. Within an interleaved program-verify loop, the program circuit 600 performs the first program and verify stages to program and verify a first set of memory cells, and the second program and verify stages to program and verify the second set of memory cells. Additionally, within an interleaved program-verify loop, the program circuit 600 interleaves the two program-verify loops by interleaving the second program stage between the first program stage and the first verify stage, and by interleaving the first verify stage between the second program stage and the second verify stage.

Additionally, the program circuit 600 may perform interleaved program-verify loops, or interleave two or more program-verify loops, according sequences. A sequence for performing an interleaved program-verify loop, or for interleaving two or more program-verify loops, identifies the program and verify stages that are interleaved, and an order in which to perform the program and verify stages. The program controller 622 may determine a sequence for an interleaved program-verify loop, or for interleaving two or more program-verify loops, and may apply the program pulses and the verify pulses according to the sequence.

In further detail, the example interleaved program-verify loops in FIG. 11 each include two sets of program and verify stages for programming and verifying two different sets of memory cells, such as two different word line cell groups. The two different sets include a first set of first program and verify stages and a second set of second program and verify stages. The program circuit 600 may perform the first set of program and verify stages to program a first set of selected memory cells of a block (e.g., the block 602), and may perform the second set of program and verify stages to program a second set of selected memory cells of the block. As previously described, the first and second sets of selected memory cells may be located in or coupled to different word lines of the block, or may be located in the same word line but part of different sub-blocks—i.e., part of different NAND strings coupled to different SGD lines. For example, the different sets of selected memory cells may include different word line cell groups.

For a given interleaved program-verify loop, the program circuit 600 interleaves or inserts a second program stage to program the second set of selected memory cells between a first program stage to program the first set of selected memory cells and a first verify stage to verify the first set of selected memory cells. After performing the first program stage, the program circuit 600 performs the second program stage to program the second set of selected memory cells before performing the first verify stage to verify the first set of selected memory cells. After performing the second program stage, the program circuit 600 performs the first verify stage. Also, for the given interleaved program-verify loop, the program circuit 600 interleaves or inserts the first verify stage between the second program stage and a second verify stage. That is, after performing the second program stage, the program circuit 600 performs the first verify stage to verify the first set of selected memory cells before performing the second verify stage to verify the second set of selected memory cells. Those of skill in the art recognize that the first verify stage and/or the second verify stage may include verify sub-stages, in certain embodiments.

As a result of the interleaving, the program circuit 600, through control of the program controller 622, consecutively programs the two sets of selected memory cells. A consecutive programming of two sets of selected memory cells includes applying or supplying one program pulse directly after another program pulse to program both sets of selected memory cells. The program circuit 600, through control of the program controller 622, consecutively programs the two sets of selected memory cells by performing a first program stage of the first set of program and verify stages, and performing a second program stage of the second set of program and verify stages, where the first and second program stages form a series or sequence of program stages of each interleaved program-verify loop.

In addition, through the interleaving, the program circuit 600, through control of the program controller 622, consecutively verifies the two sets of selected memory cells. A consecutive verify of two sets of selected memory cells includes applying or supplying one sequence of verify pulses directly after another sequence of verify pulses to verify both sets of selected memory cells. The program circuit 600, through control of the program controller 622, consecutively verifies the two sets of selected memory cells by performing a first verify stage of the first set of program and verify stages, and performing a second verify stage of the second set of program and verify stages, where the first and second verify stages form a series or sequence of verify stages of each interleaved program-verify loop.

For each of the interleaved program-verify loops, the program circuit 600 may perform the first verify stage according to a first verify order associated with verifying the first set of selected memory cells, and may perform the second verify stage according to a second verify order associated with verifying the second set of selected memory cells. After performing a last verify sub-stage of the second verify stage, the program circuit 600 may transition to a next interleaved program-verify loop, assuming that the sets of selected memory cells still include insufficiently programmed memory cells.

Also, for at least some example configurations, during the interleaved program-verify loops, the program circuit 600 may not interleave program-verify loops for sets of selected memory cells that are sufficiently programmed. At the end of a given interleaved program-verify loop, if all of the selected memory cells of a set are sufficiently programmed, then the program circuit 600 will perform subsequent loops without factoring in program stages and verify stages for the set that is sufficiently programmed. For example, in the program operation in FIG. 11, at the end of a given interleaved program-verify loop, if all of the selected memory cells of one of the sets are sufficiently programmed while the other set still includes insufficiently programmed memory cells, then the program circuit 600 may perform subsequent loops as regular program-verify loops as illustrated in FIG. 7B in order to continue to program the set that still includes insufficiently programmed memory cells.

In the example program operation in FIG. 11, for each interleaved program-verify loop, the program circuit 600 performs the series of verify stages in the same order as it performs the series of program stages. The program circuit 600 performs the first program stage to program the first set of selected memory cells, and then performs the second program stage to program the second set of selected memory cells. Similarly, the program circuit performs the first verify stage to verify the first set of selected memory cells, and then performs the second verify stage to verify the second set of selected memory cells. For other configurations, the program circuit 600 performs the series of program stages and the series of verify stages in different orders, such as in orders that are reversed from each other. For example, in a given interleaved program verify loop, after performing a second program loop, the program circuit 600 may stay with the second set of selected memory cells and perform the second verify stage immediately after performing the second program stage. After performing the second verify stage, the program circuit 600 may transition performing the first verify stage to verify the first set of selected memory cells. In this context, the program circuit 600 interleaves or inserts an entire set of second program and verify stages in between the first program stage and the first verify stage in order to perform the interleaved program-verify loop.

Also, the example program operation in FIG. 11 is shown as interleaving only two sets of program verify stages for programming two different sets of selected memory cells of a block. Other example programming operations may similarly interleave three or more sets of program and verify stages for programming three different sets of selected memory cells of a block. Such other example programming operations may include interleaved program-verify loops that each include a series of three or more program stages followed by a series of three or more verify stages to program and verify the three or more different sets of selected memory cells of a block. Alternatively, the program circuit 600 may perform interleaved program-verify loops to program and verify three or more different sets of selected memory cells by interleaving or inserting at least one verify stage into the series of program stages such that the program circuit 600 performs at least one verify stage before programming all of the program stages of a given interleaved program-verify loop. Various ways of interleaving program stages and verify stages to form interleaved program-verify loops for two or more different sets of selected memory cells of a block may be possible.

In addition, the program controller 622 is configured to control program operations performed with interleaved program-verify loops in the same or a similar way as it controls performance or program operations performed with program-verify loops, as previously described with reference to FIGS. 7B-10. When performing interleaved program-verify loops, the program controller 622 determines a sequence for interleaving two or more program-verify loops for programming two or more different sets of memory cells. For example, the program controller 622 determines the program and verify stages to perform in an interleaved program-verify loop, and an order in which the program circuit 600 performs the stages. Additionally, the program controller 622 determines and controls when program and verify stages are performed within the interleaved program-verify loops according to the determined sequences. For example, the program controller 622 is configured to determine or identify times at which program stages are to begin and end, and times at which verify stages begin and end. In turn, the program controller 622 is configured to determine or identify a delay period, including an amount of the delay period, in between a program stage and a verify stage to program and verify a first set of memory cells. In addition, the program controller 622 is configured to determine or identify a time or time period during which to interleave or insert a program stage to program a second set of memory cells in between the program and verify stages to program and verify the first set of memory cells. The program controller 622 may be configured to overlap the performance of the interleaved or inserted program stage with the delay period. Similarly, the program controller 622 is configured to determine or identify a time or time period during which to interleave or insert a verify stage to verify the first set of memory cells in between the program and verify stages to program and verify the second set of memory cells. The program controller 622 may be configured to overlap the performance of the interleaved or inserted verify stage with the delay period.

Additionally, the program controller 622 may control the consecutive or sequential programming of different sets of memory cells, such as different word line cell groups, and control the consecutive or sequential verifying of the different sets of memory cells. For example, the program controller 622 may perform a next program stage sequentially or directly after a current program stage, such as through application of a second program pulse to program a second set of memory cells after application of a first program pulse to program a first set of memory cells. Additionally, the program controller 622 may perform a next verify stage sequentially or directly after a current verify stage, such as through application of a second sequence of verify pulses to verify a second set of memory cells after application of a first sequence of verify pulses to verify a first set of memory cells.

In addition, the program controller 622 is configured to determine or identify which sets of memory cells, such as which word line cell groups, to configure as selected memory cells for program operations with interleaved program-verify loops. For example, the program controller 622 is configured to determine or identify the word lines to configure as selected or unselected word lines during program operations performed with interleaved program-verify loops, and which word line cell groups of the selected word line(s) to configure as selected memory cells for a given program operation with interleaved program-verify loops.

In addition, for at least some example configurations, the program controller 622 may include an interleave control circuit 630. As used herein, an interleave control circuit is a component or module of the program controller that controls program operations with interleaved program-verify loops. An interleave control circuit determines sequences of the interleaved program-verify loops, including the sequences for interleaving two or more program-verify loops, and/or for performing the verify and program stages of the two or more program-verify loops. Additionally, an interleave control circuit may control the timing for when interleaved program-verify loops are performed, when they transition from one interleaved program-verify loop to a next program-verify loop, as well as the timing for when the program stages and the verify stages of individual interleaved program-verify loops are performed. For example, the interleave control circuit 630 may determine or identify a time or time period in between a program stage and a verify stage for a first set of memory cells, such as a time or time period after the program stage ends, and a time or time period before the verify stage begins. In addition or alternatively, the interleave program control circuit 630 may determine delay periods, including amounts of delay periods, in between program stages and verify stages of interleaved program-verify loops. In general, the interleave control circuit 630 has the same functionality and control of interleaved program-verify loops as the program controller 622 does. Accordingly, actions performed to control interleaved program-verify loops may be interchangeably described or referred to as being performed by the program controller 622 or the interleave control circuit 626.

Additionally, the interleave control circuit 630 may be configured to operate in sync with the program control circuit 624 and the verify control circuit 626 to perform interleaved program-verify loops. For example, in response to the interleave control circuit 630 determining or identifying a time, time period, or delay period between a program stage and a verify stage to program and verify a first set of memory cells, the program control circuit 624 may perform a program stage, such as by applying or supply a program pulse, to program a second set of memory cells in response to the identified time, time period, or delay period. Similarly, in response to the interleave control circuit 630 determining or identifying a time, time period, or delay period between a program stage and a verify stage to program and verify a second set of memory cells, the verify control circuit 626 may perform a verify stage, such as by applying or supplying a sequence of verify pulses, to verify the first set of memory cells in response to the identified time, time period, or delay period.

Also, as a component or module of the program controller 622, the interleave control circuit 630 may have any of the various hardware and/or combination of hardware and firmware (or hardware and software) configurations that the program controller 622 can have in order to carry out interleaved program-verify loops of program operations. For some example configurations, the interleave control circuit 630 may include a separate, discrete set of circuitry from the program control circuit 624 and/or the verify control circuit 626. For other example configurations, the interleave control circuit 630 may include the same hardware circuitry, such as the same processor for example, but execute different firmware, such as different sets of computer code or instructions, in order to carry out its functions, operations, or actions. Various configurations or combinations of configurations of the interleave control circuit 630, with or without the program control circuit 624 and/or the verify control circuit 626, may be possible.

Figure 16:
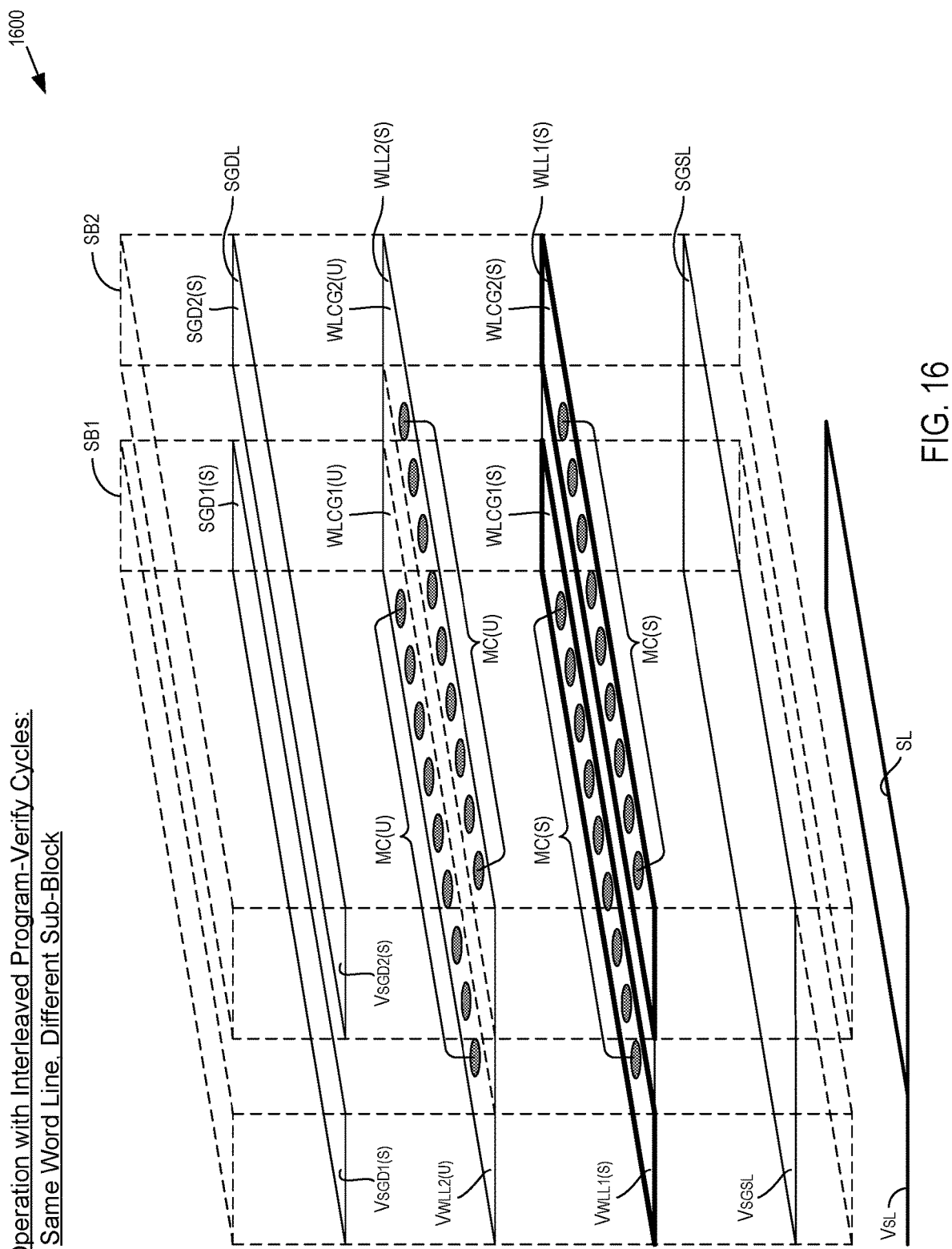
FIG. 16 is an exploded view of a portion of a block biased with program and verify voltages during a program operation with interleaved program-verify loops, where selected memory cells of the program operation are coupled to the same word line.
Figure 17:
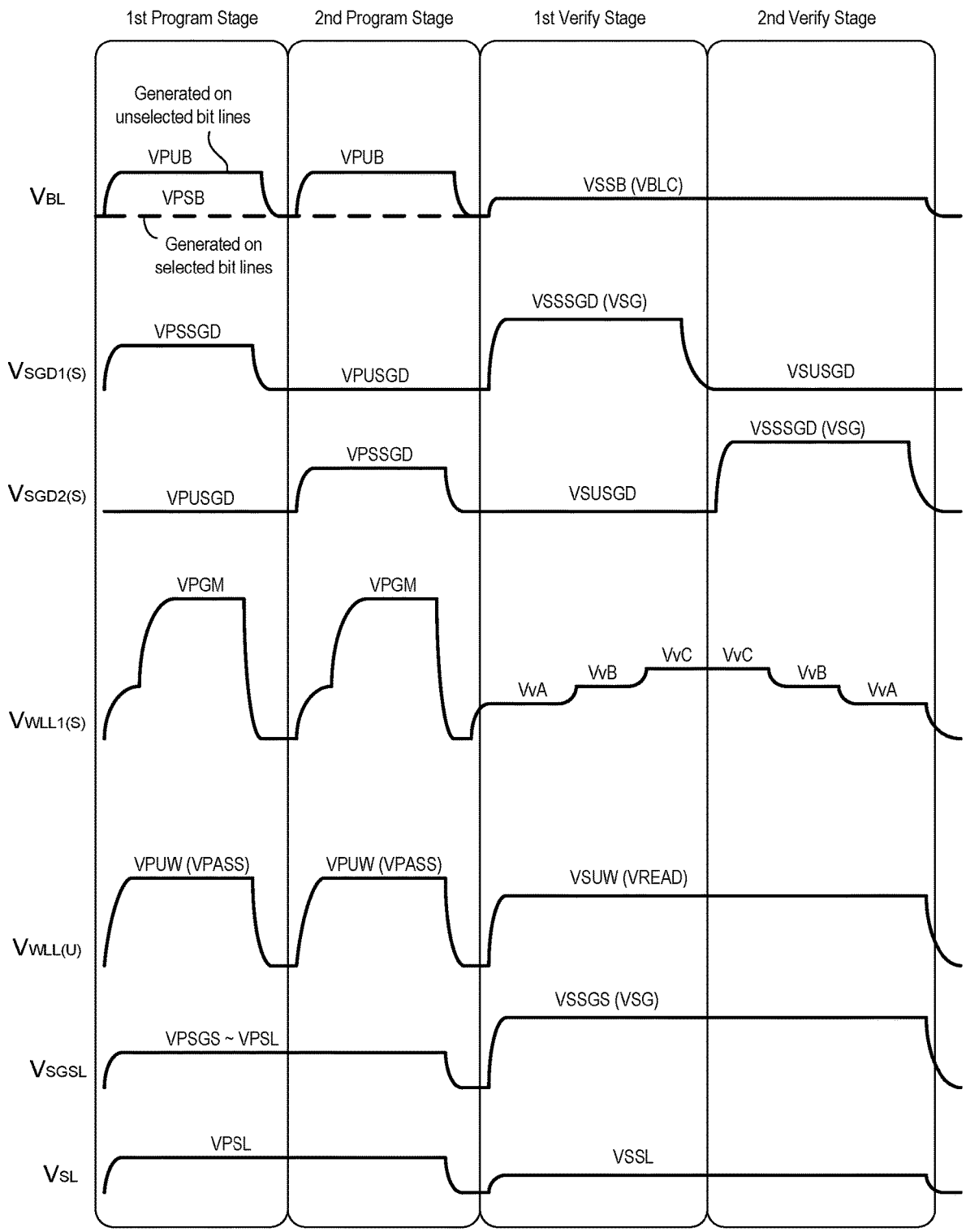
FIG. 17 is a timing diagram of voltage waveforms of program and verify voltages applied to control lines of the block of FIG. 16 during an interleaved program-verify loop.
Figure 18:
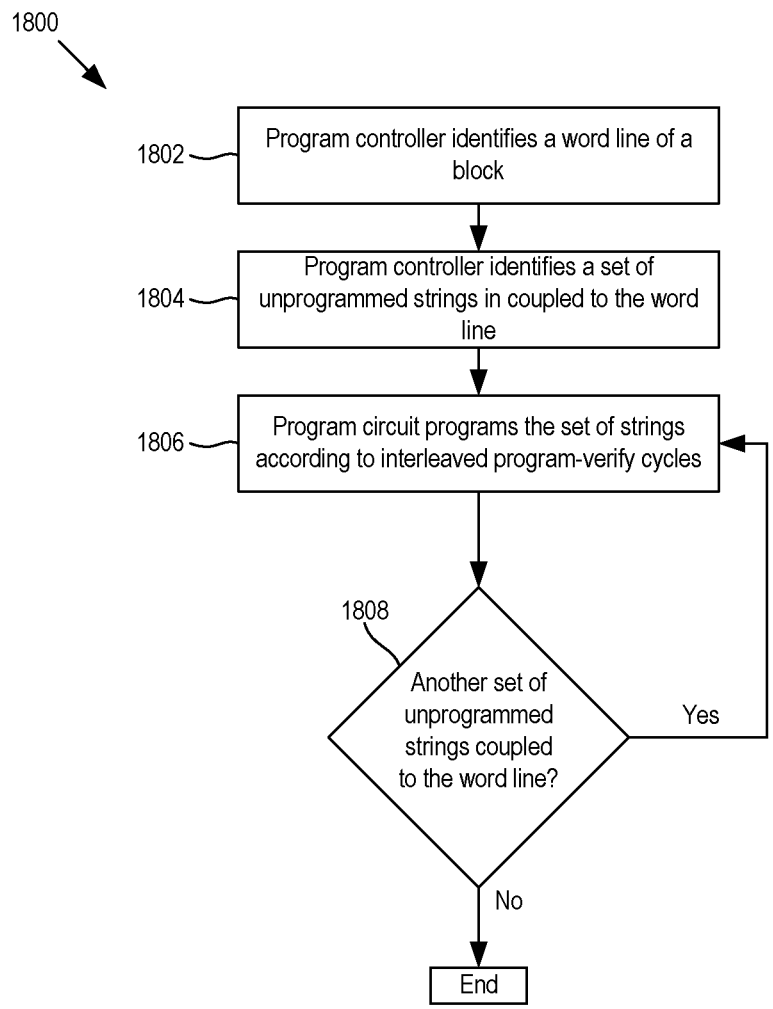
FIG. 18 is a flow chart of an example method of programming memory cells coupled to a word line according to interleaved program-verify loops.

The program circuit 600 may be configured to perform interleaved program-verify loops to program a block in different ways depending on where the different sets of selected memory cells are located in the block. The following description describes two different types of interleaved program-verify loops. A first type of interleaved program-verify loop, described with reference to FIGS. 12-15, is performed to program different sets of memory cells located in or coupled to different word lines but in the same sub-block of a block in order to program data into the block. A second type of interleaved program-verify loop, described with reference to FIGS. 16-18, is performed to program different sets of memory cells located in or coupled to the same word line but part of different sub-blocks of a block in order to program data into the block.

Figure 12:
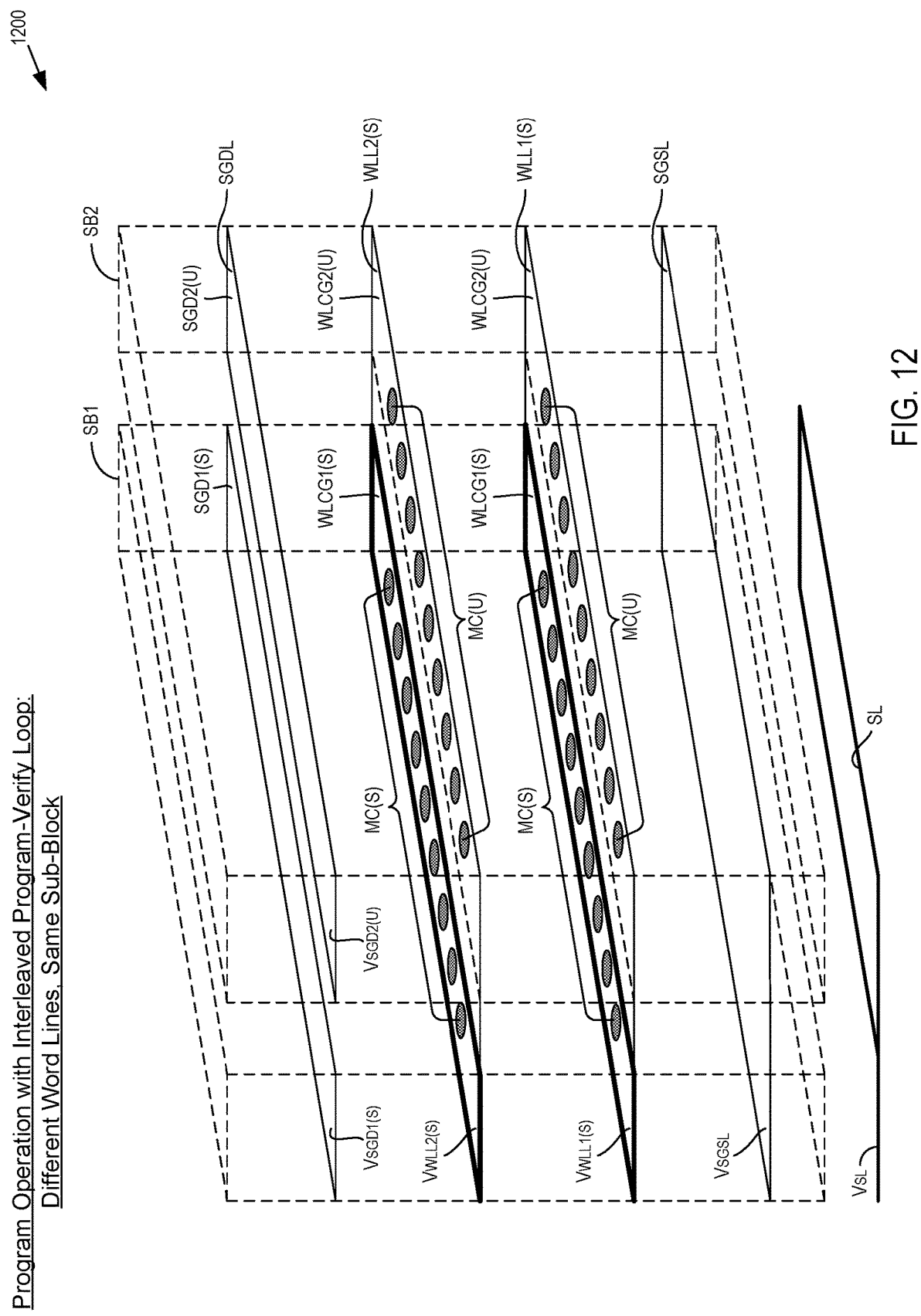
FIG. 12 is an exploded view of a portion of a block biased with program and verify voltages during a program operation with interleaved program-verify loops, where selected memory cells of the program operation are coupled to different word lines.

Referring to FIGS. 12-15 and the first type of interleaved program-verify loop, FIG. 12 shows an exploded perspective view of at least a portion of a block 1200, which may be representative of at least a portion a block of the memory cell structure 142 of FIG. 2B, at least a portion of one of the blocks BLK in FIG. 3A, 3B, or 4A, have the physical construction or structure of the block 410 in FIGS. 4B, 4C, have the circuit configuration of the block 480 in FIG. 4D, be representative of at least a portion of the block 602 of FIG. 6, and/or be configured to be coupled to and/or biased by the program circuit 600 of FIG. 6.

Similar to the construction of the block 800 in FIGS. 8A-8C, the block 1200 is shown as including an SGD layer SGDL that includes two SGD lines, including a first SGD line SGD1 and a second SGD line SGD2. The block 1200 is also shown as including a SGS line (or layer) SGSL and a source line SL. For simplicity, SGD transistors SGDT coupled to the SGD lines SGD1, SGD2 and SGS transistors SGST coupled to the SGS line are not shown.

The block 1200 is shown as including two word lines (or word line layers), including a first word line WLL1 and a second word line WLL2. Each of the word lines WLL1, WLL2 is shown as including two word line cell groups, including a first word line cell group WLCG1 and a second word line cell group WLCG2. The first word line cell groups WLCG1 coupled to each of the word lines WLL1, WLL2 form a first sub-block SB1 with the first SGD line SGD1— i.e., the memory cells MC that are part of the first word line cell groups WLCG1 are part of NAND strings including SGD transistors that have control gates coupled to and/or that are configured to be biased by the first SGD line SGD1. Similarly, the second word line cell groups WLCG2 coupled to each of the word lines WLL1, WLL2 form a second sub-block SB2 with the second SGD line SGD2—i.e., the memory cells MC that are part of the second word line cell groups WLCG2 are part of NAND strings including SGD transistors that have control gates coupled to and/or that are configured to be biased by the second SGD line SGD2.

The example program operation described with reference to FIGS. 12-13 programs the first word line cell groups WLCG1 coupled to the first and second word lines WLL1, WLL2. Accordingly, for the program operation described with reference to FIGS. 12-13, the first word line cell groups WLCG1 coupled to the first and second word lines WLL1, WLL2 are selected word line cell groups WLCG1(S) of the program operation, and the second word line cell groups WLCG2 coupled to the first and second word lines WLL1, WLL2 are unselected word line groups WLCG2(U) of the program operation. FIG. 12 the memory cells MC of first word line cell groups WLCG1(S) as selected memory cells MC(S), and the memory cells MC of the second word line cell groups WLCG2(S) as unselected memory cells MC(U).

In addition, since both the first and second word lines WLL1, WLL2 are coupled to selected memory cells MC(S), each of the first and second word lines WLL1, WLL2 are referred to as selected word lines WLL1(S), WLL2(S), each configured to generate a respective selected word line voltage $V_{WLL1(S)}$, $V_{WLL2(S)}$. In addition, since the first SGD line SGD1 program-enables and verify-enables the selected memory cells MC(S) during the interleaved program-verify loops of the program operation, the first SGD line SGD1 is a selected SGD line SGD1(S) of the program operation configured to generate a selected SGD line voltage $V_{SGD1(S)}$. Also, since the second SGD line SGD2 program-inhibits and verify-inhibits the unselected memory cells MC(U) during the interleaved program-verify loops of the program operation, the second SGD line SGD2 is an unselected SGD line SGD2(U) of the program operation configured to generate an unselected SGD line voltage $V_{SGD2(U)}$. Additionally, FIG. 12 shows the SGD line SGDL and the source line SL configured to generate respective SGD line and source line voltages $V_{SGDL}$, $V_{SL}$.

Figure 13:
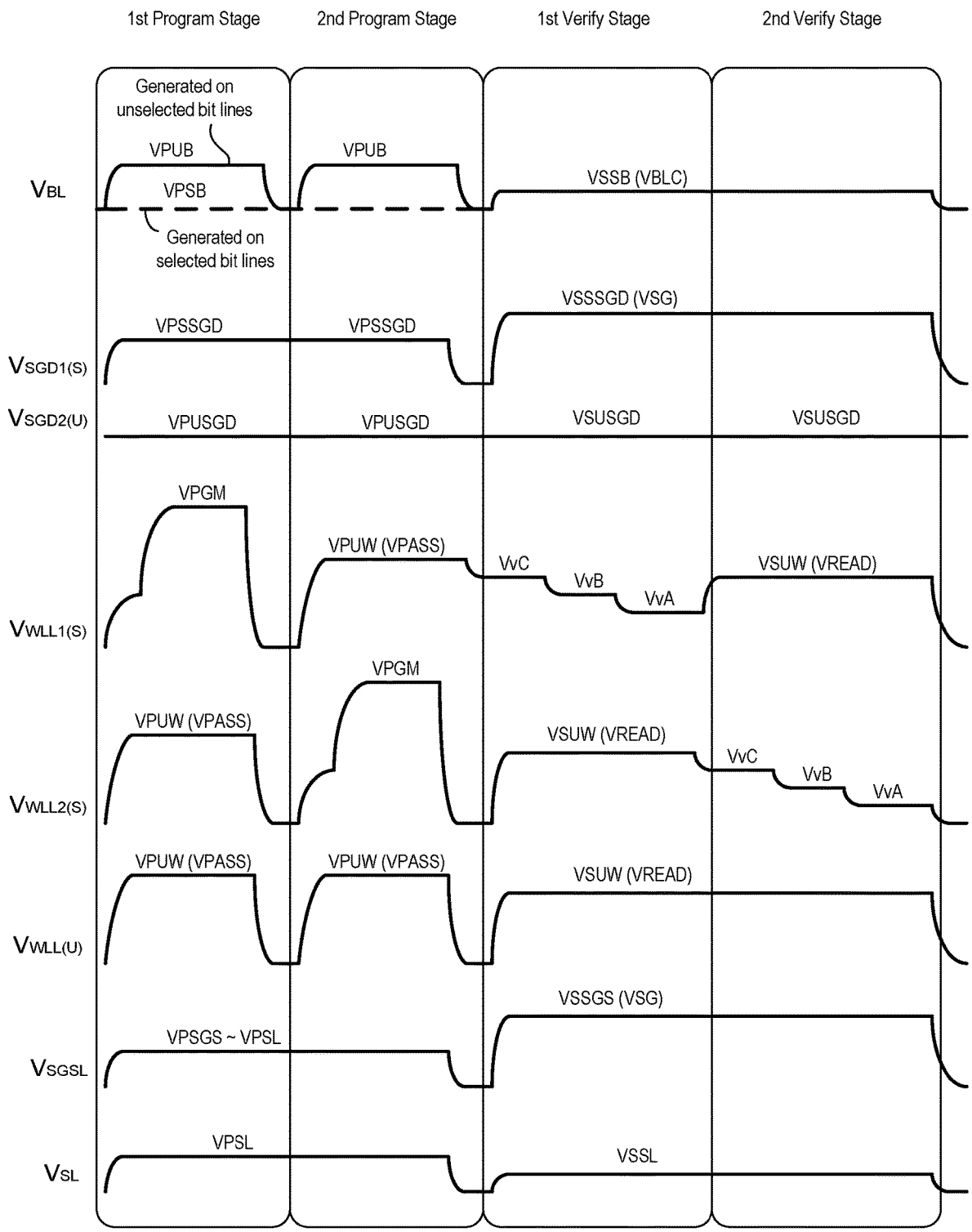
FIG. 13 is a timing diagram of voltage waveforms of program and verify voltages applied to control lines of the block of FIG. 12 during an interleaved program-verify loop.

FIG. 13 is a timing diagram of voltage waveforms of the program and verify voltages applied to or generated on the control gate lines and the source line SL of the block 1200 during an interleaved program-verify loop to program the selected memory cells MC(S) coupled to the selected first and second word lines WLL1(S), WLL2(S). The interleaved program-verify loop in FIG. 13 is shown as including two program stages, including a first program stage to program selected memory cells MC(S) coupled to the selected first word line WLL1(S), and a second program stage to program selected memory cells MC(S) coupled to the selected second word line WLL2(S). The first and second program stages may form a series or pair of program stages. In addition, the interleaved program-verify loop in FIG. 13 includes two verify stages, including a first verify stage to verify the selected memory cells MC(S) coupled to the selected first word line WLL1(S), and a second verify stage to verify selected memory cells MC(S) coupled to the selected second word line WLL2(S). The first and second verify stages may form a series or pair of verify stages.

In order to program the two sets of selected memory cells MC(S) coupled to the different selected word lines WLL1(S), WLL2(S), the program circuit 600 may alternatingly configure the selected word lines WLL1(S), WLL2(S) as selected and unselected word lines. That is, to program the selected memory cells MC(S) coupled to the first word line WLL1(S) first, and then program the selected memory cells MC(S) coupled to the second word line WLL2(S) second, the program circuit 600 may configure the selected first word line WLL1(S) as a selected word line and configure the selected second word line WLL2(S) as an unselected word line during the first program stage. Then, during the second program stage, the program circuit 600 may configure the selected second word line WLL2(S) as a selected word line and the selected first word line WLL1(S) as an unselected word line.

Accordingly, as shown in FIG. 13, during the first program stage, the control gate line voltage supply circuit 606 applies a program pulse to the selected first word line WLL1(S), while applying an unselected voltage at the program unselected word line level VPUW (or pass level VPASS) to the selected second word line WLL2(S) to inhibit programming on the selected second word line. In response, the selected first word line WLL1(S) generates a program pulse by ramping up its word line voltage $V_{WLL1(S)}$ to the program pulse level VPGM, and the selected second word line WLL2(S) ramps up its word line voltage $V_{WLL2(S)}$ to program unselected word line level VPUW during the first program stage. Then, at or toward the end of the first program stage, the selected first and second word lines WLL1(S), WLL2(S) may ramp down their respective voltages $V_{WLL1(S)}$, $V_{WLL2(S)}$ to initial levels to exit the first program stage and enter the second program stage.

During the second program stage, the control gate line voltage supply circuit 606 reverses the selected and unselected voltages it applies to the selected first and second word lines WLL1(S), WLL2(S), and applies a program pulse to the selected second word line WLL2(S), while applying an unselected word line voltage at the program unselected word line level VPUW to the selected first word line WLL1(S) to inhibit programming on the selected first word line. In response, the selected second word line WLL2(S) generates a program pulse by ramping up its word line voltage $V_{WLL2(S)}$ to the program pulse level VPGM, and the selected first word line WLL1(S) ramps up its word line voltage $V_{WLL1(S)}$ to program unselected word line level VPUW during the second program stage.

In addition, as shown in FIG. 13, the unselected word lines of the block 1200 (not shown in FIG. 12) generate respective unselected word line voltages $V_{WLL(U)}$ by ramping up their respective unselected word line voltage $V_{WLL(U)}$ from initial levels to the program unselected word line level VPUW at the beginning of each of the first and second program stages, and then ramping down their respective unselected word line voltage $V_{WLL(U)}$ from the program unselected word line level VPUW to initial levels at or toward the end of each of the first and second program stages. The other control gate lines and the source line SL may be configured to initially ramp up their voltages to respective program levels at the start of the first program stage, and then maintain their voltages at the respective program levels over the course of the first and second program stages—i.e., without ramping down and then ramping back up to transition from the first program stage to the second program stage. In particular, the selected first SGD line SGD1(S) maintains its voltage $V_{SGD1(S)}$ at the program selected SGD level VPSSGD, the unselected second SGD line SGD2(U) maintains its voltage $V_{SGD2(U)}$ at the program unselected SGD level VPUSGD, the SGS line SGSL maintains its voltage $V_{SGSL}$ at the program SGS level VPSGS, and the source line SL maintains its voltage $V_{SL}$ at the program source line level VPSL over the course of the first and second program stages. In other example configurations, the selected first SGD line SGD1(S) may ramp down its voltage $V_{SGD1(S)}$ at the end of the first program stage, and then ramp the voltage $V_{SGD1(S)}$ back up to the program selected SGD level VPSSGD during the second program stage, similar to the selected and unselected voltages $V_{WLL1(S)}$, $V_{WLL2(S)}$, $V_{WLL(U)}$ during the first and second program stages.

Also, the bit line voltage supply circuit 608 may apply program selected and unselected bit line voltages to selected and unselected bit lines in order to program-enable and program-inhibit the various selected memory cells during the first and second stages based on their respective program statuses. FIG. 13 shows two voltage waveforms generated over the two program stages, including a first voltage waveform (represented by a dotted line) showing the selected bit line voltage at the program selected bit line level VPSB applied to the selected bit lines, and a second voltage waveform (represented by a solid line) showing the unselected bit line voltage at the program unselected bit line level VPUB applied to the unselected bit lines. In particular example configurations, as shown in FIG. 13, the bit line voltage supply circuit 608 may ramp down the unselected bit line voltage $V_{BL(U)}$ from the program unselected bit line level VPUB to an initial level at or toward the end of the first program stage, and then ramp back up to the program unselected bit line level VPUB at the start of the second program stage. In other example configurations, the bit line voltage supply circuit 608 may maintain the unselected bit line voltage $V_{BL(U)}$ at the program unselected bit line level VPUB—i.e., without ramping down and then back up—over the course or duration of the first and second program stages.

As shown in FIG. 13, at or toward the end of the second program stage, the program circuit 600 may enter or transition into the first verify stage to verify selected memory cells coupled to the selected first word line WLL1(S). The program circuit 600 may do so by transitioning the control gate line and source line voltages to verify or sense levels.

In the example interleaved program-verify loop shown in FIG. 13, in order to verify the two sets of selected memory cells MC(S) coupled to the different selected word lines WLL1(S), WLL2(S), the program circuit 600 may alternatingly configure the selected word lines WLL1(S), WLL2(S) as selected and unselected word lines. That is, to verify the selected memory cells MC(S) coupled to the first word line WLL1(S) first, and then verify the selected memory cells MC(S) coupled to the second word line WLL2(S) second, the program circuit 600 may configure the selected first word line WLL1(S) as a selected word line and configure the selected second word line WLL2(S) as an unselected word line during the first verify stage. Then, during the second verify stage, the program circuit 600 may configure the selected second word line WLL2(S) as a selected word line and the selected first word line WLL1(S) as an unselected word line.

Accordingly, as shown in FIG. 13, during the first verify stage, the control gate line voltage supply circuit 606 applies a series or sequence of verify pulses to the selected first word line WLL1(S), while applying an unselected voltage at the sense unselected word line level VSUW (or read level VREAD) to the selected second word line WLL2(S). In response, the selected first word line WLL1(S) generates a sequence of verify pulses by generating its word line voltage $V_{WLL1(S)}$ at a sequence of verify pulse voltage levels Vv according to a verify order associated with the first verify stage, while the selected second word line WLL2(S) generates its word line voltage $V_{WLL2(S)}$ at a sense unselected word line level VSUW during the first verify stage.

During the second verify stage, the control gate line voltage supply circuit 606 reverses the selected and unselected voltages it applies to the selected first and second word lines WLL1(S), WLL2(S), and applies a sequence of verify pulses to the selected second word line WLL2(S), while applying an unselected word line voltage at the sense unselected word line level VSUW to the selected first word line WLL1(S). In response, the selected second word line WLL2(S) generates a sequence of verify pulses by generating its word line voltage $V_{WLL2(S)}$ at a sequence of verify pulse voltage levels Vv according to a verify order associated with the second verify stage, while the selected first word line WLL1(S) generates its word line voltage $V_{WLL1(S)}$ at the sense unselected word line level VSUW during the second verify stage.

As shown in FIG. 13, in order to perform the first and second verify stages, the control gate line voltage supply circuit 606 applies the verify pulses to the selected word lines WLL1(S), WLL2(S) in descending verify orders. As used herein, a descending verify order is a verify order that identifies progressively lower memory states. As previously described, a first memory state is lower than a second memory state where the first memory state is associated with a lower threshold voltage range than the threshold voltage range with which the second memory state is associated. To perform a verify stage according to a descending verify order, each next verify sub-stage that the program circuit 600 is to perform next in the verify stage is associated with a lower memory state and/or lower threshold voltage range than the memory state and/or threshold voltage range associated with the current verify sub-stage the program circuit 600 is currently performing.

With respect to FIG. 13, the example interleaved program-verify loop is performed to verify memory cells programmed to store two bits-per-cell—i.e., each selected memory cell may have the erase state, memory state A, memory state B, or memory state C as its target memory state. According to a two bits-per-cell storage scheme, memory states A and B are lower memory states than memory state C, and memory state A is a lower memory state than memory state B. Accordingly, the program circuit 600 may perform each of the first and second verify stages according to descending verify orders by performing a first verify stage for memory state C, then performing a second verify stage for memory state B, and then performing a third verify stage for memory state A.

Accordingly, to perform the first and second verify stages according to descending verify orders, the control gate line voltage supply circuit 606 applies the sequence of verify pules according to the descending verify order so that the selected first word line generates its selected word line voltage at sequentially decreasing verify pulse levels. Under the two bits-per-cell storage scheme illustrated in FIG. 13, the control gate line voltage supply circuit 606 supplies the verify pulses so the selected first word line WLL1(S) so that the selected first word line WLL1(S) generates its selected word line voltage $V_{WLL2(S)}$ at sequentially decreasing verify pulse levels VvC, VvB, and VvA during each of the corresponding three verify sub-stages for memory states C, B, and A of the first verify stage. Then, during the second verify stage, the control gate line voltage supply circuit 606 supplies the verify pulses so the selected second word line WLL2(S) so that the selected second word line WLL2(S) generates its selected word line voltage $V_{WLL2(S)}$ at the sequentially decreasing verify pulse levels VvC, VvB, and VvA during each of the corresponding three verify sub-stages for memory states C, B, and A of the second verify stage.

Performing the first verify stage according to a descending verify order may be more efficient than performing it according to an ascending verify order because the word line voltage $V_{WLL1(S)}$ of the selected first word line WLL1(S) is already at the program unselected word line level VPUW (or VPASS) at the end of the second program stage. As such, the control gate line voltage supply circuit 606, and in turn the selected first word line level WLL1(S) can transition the selected word line voltage $V_{WLL1(S)}$ on the selected first word line WLL1(S) from the program unselected word line level VPUW to the highest verify pulse level—in this example the verify pulse level VvC associated with memory state C—faster than it can transition the selected word line voltage $V_{WLL1(S)}$ from the program unselected word line level VPUW back down to an initial level (e.g., the ground reference voltage level of 0 V), and then back up to the verify pulse level VvA associated with memory state A, or directly to any of the other verify pulse levels lower than the highest verify pulse level—e.g., verify pulse level VvC for two bits-per-cell storage schemes.

Similarly, performing the second verify stage according to a descending verify order may be more efficient than performing it according to an ascending verify order because the word line voltage $V_{WLL2(S)}$ of the selected second word line WLL2(S) is already at the verify or sense unselected word line level VSUW (or VREAD) at the end of the first verify stage. As such, the control gate line voltage supply circuit 606, and in turn the selected second word line level WLL2(S) can transition the selected word line voltage $V_{WLL2(S)}$ on the selected second word line WLL2(S) from the sense unselected word line level VSUW to the highest verify pulse level—in this example the verify pulse level VvC associated with memory state C—faster than it can transition the selected word line voltage $V_{WLL2(S)}$ from the sense unselected word line level VSUW back down to an initial level (e.g., the ground reference voltage level of 0 V), and then back up to the verify pulse level VvA associated with memory state A, or directly to any of the other verify pulse levels lower than the highest verify pulse level—e.g., verify pulse level VvC for two bits-per-cell storage schemes. However, in other example embodiments, the program circuit 600 may perform the second verify order according to an ascending verify order, in which the control gate line voltage supply circuit 606 applies the sequence of verify pules according to the ascending verify order.

In addition, except for the selected first and second word lines WLL1(S), WLL2(S), the other control gate lines and the source line SL may be configured to initially ramp up their voltages to respective verify or sense levels at the start of the first verify stage, and then maintain their voltages at their respective verify or sense levels over the course of the first and second verify stages—i.e., without ramping down and then ramping back up to transition from the first verify stage to the second verify stage. In particular, the selected first SGD line SGD1(S) maintains its voltage $V_{SGD1(S)}$ at the sense selected SGD level VSSSGD (or the select gate level VSG), the unselected second SGD line SGD2(U) maintains its voltage $V_{SGD2(U)}$ at the sense unselected SGD level VSUSGD, the unselected word lines of the block (not shown in FIG. 12) maintain their respective unselected word line voltages $V_{WLL(U)}$ at the verify or sense unselected word line level VSUW (or VPASS), the SGS line SGSL maintains its voltage $V_{SGSL}$ at the sense SGS level VSSGS, and the source line SL maintains its voltage $V_{SL}$ at the sense source line level VPSL over the course of the first and second verify stages.

Also, for some example configurations, as shown in FIG. 13, the bit line voltage supply circuit 608 may apply the selected bit line voltages at the verify or sense selected bit line level VSSB (or VBLC) to all of the bit lines coupled to selected memory cells of the block. To illustrate in FIG. 13, the two voltage waveforms depicting the selected and unselected bit line voltages merge at the start of the first verify stage into a single voltage waveform at the sense selected bit line level VSSB. Accordingly, at the start of the first verify stage, the bit line voltage supply circuit 608 ramps up the selected bit line voltage from an initial level to the sense selected bit line level VSSB, and applies the selected bit line voltage at the sense selected bit line level VSSB to the bit lines BL. The bit line voltage supply circuit 608 maintains the selected bit line voltage at the sense selected bit line level VSSB over the course or duration of the first and second verify stages, i.e., without ramping the bit line voltage down and then back up when transitioning between the first and second verify stages.

At the end of the second verify stage, the voltage supply circuit 604 may ramp down the control gate line and supply line voltages from their verify or sense levels to initial levels. The program circuit 600 may then transition to a next interleaved program-verify loop, assuming that there are still insufficiently programmed memory cells that need to be programmed.

Figure 14:
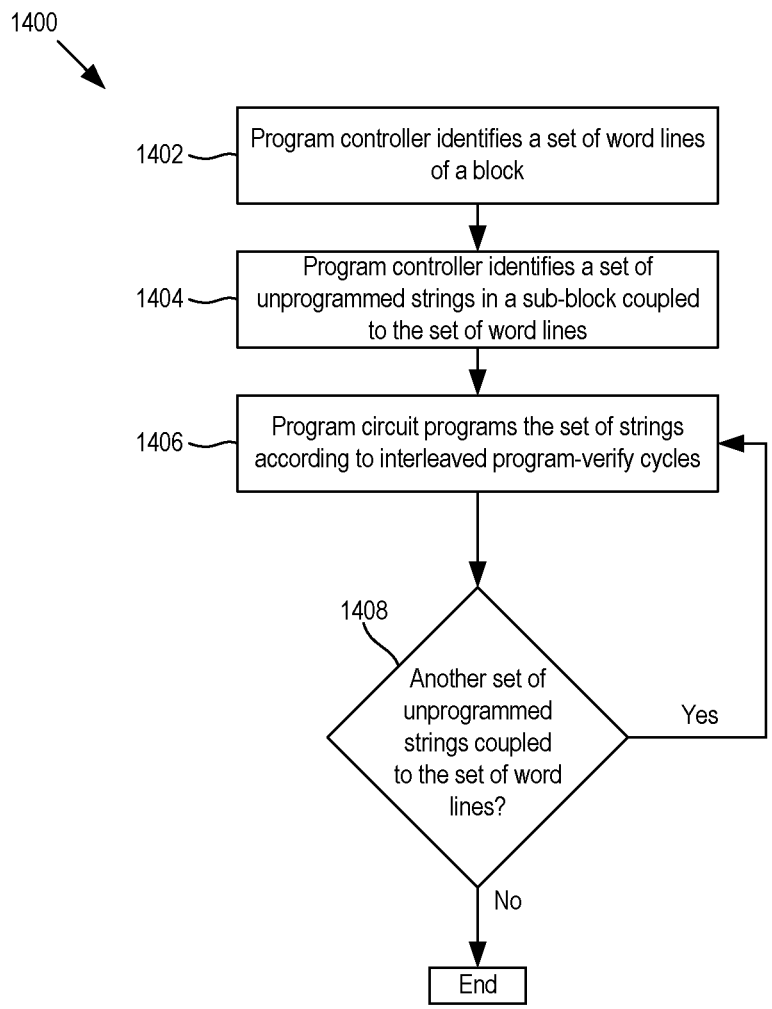
FIG. 14 is a flow chart of an example method of programming memory cells coupled to a set of word lines according to interleaved program-verify loops.

FIG. 14 shows a flow chart of an example method 1400 of programming memory cells coupled to a set of word lines according to interleaved program-verify loops. At block 1402, the program controller 622 may identify a set of word lines of a block in which to program data. The set of word lines may include at least two word lines. The program controller 622 may identify the word lines in the set as selected word lines for a plurality of program operations with interleaved program-verify loops, similar to the first and second word lines WLL1(S), WLL2(S) being selected word lines for the program operation described with reference to FIGS. 12 and 13.

At block 1404, the program controller 622 may identify a set of unprogrammed word line cell groups to program in a program operation. The set of unprogrammed word line cell groups may be part of a same sub-block, with each word line cell group of the set located in or coupled to a different one of the selected word lines. An unprogrammed word line cell group is a word line cell group that has all of its memory cells in the erase state. The program controller 622 may identify those word line cell groups that it identified in block 1404 has selected word line cell groups of the program operation.

At block 1406, the program circuit 600 may perform the program operation to program the set of selected word line cell groups by performing interleaved program-verify loops, in accordance with the interleaved program-verify loops described with reference to FIGS. 12-13. After the program circuit 600 has sufficiently programmed the memory cells of the set of selected word line cell groups at block 1406, the program controller 622 may determine whether there are any other sets of unprogrammed word line cell groups coupled to the set of word lines. Another set of unprogrammed word line cell groups may be part of a different sub-block of the block. If the program controller 622 determines that there is another set of unprogrammed word line cell groups coupled to the set of word lines, then the method 1400 may proceed back to block 1406, where the program circuit 600 performs another program operation to program the set of unprogrammed word line cell groups that the program controller 622 identified at block 1406. Alternatively, if the program controller 622 does not determine that there is another set of unprogrammed word line cell groups coupled to the set of word lines, then the program method 1400 may end.

Figure 15:
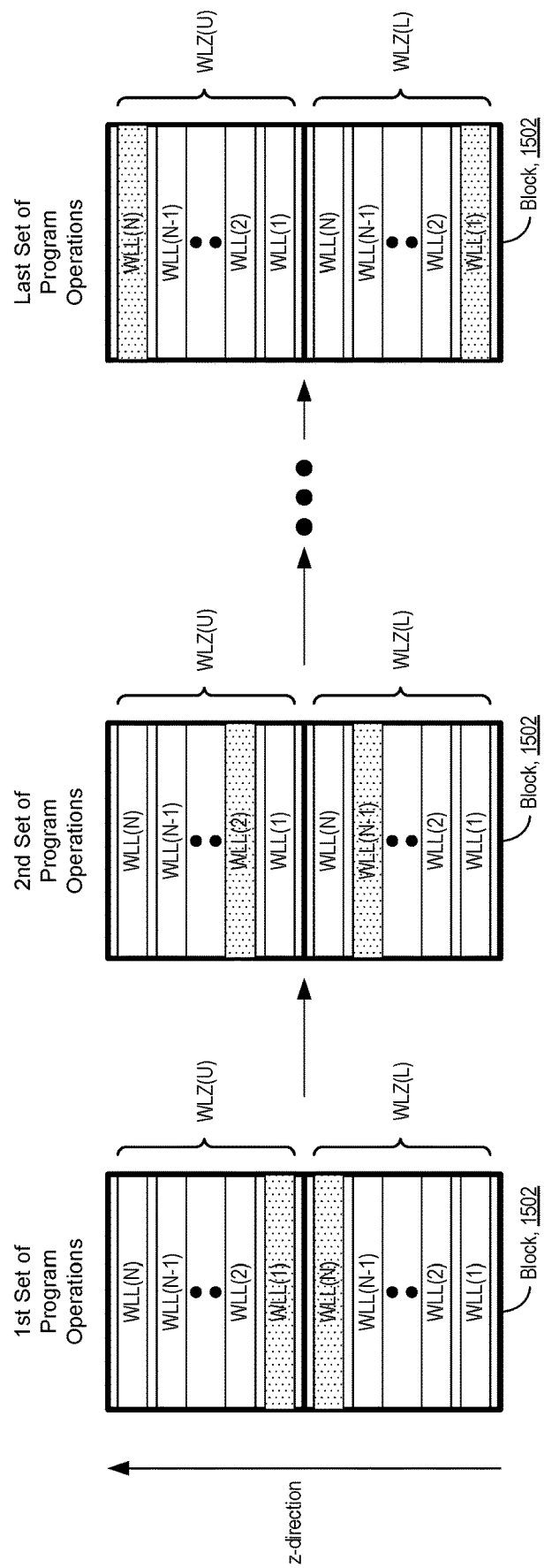
FIG. 15 is a schematic diagram of a block being programmed with interleaved program-verify loops.

FIG. 15 shows a schematic diagram of programming a block 1502 by performing program operations with interleaved program-verify loops in accordance with the interleaved program-verify loops described with reference to FIGS. 12-14. The block 1502 may be representative of at least a portion a block of the memory cell structure 142 of FIG. 2B, at least a portion of one of the blocks BLK in FIG. 3A, 3B, or 4A, have the physical construction or structure of the block 410 in FIGS. 4B, 4C, have the circuit configuration of the block 480 in FIG. 4D, be representative of at least a portion of the block 602 of FIG. 6, and/or be configured to be coupled to and/or biased by the program circuit 600 of FIG. 6.

To program the block 1502, the program circuit 600 may separate, divide, or arrange the word lines of the block 1502 into word line zones WLZ. As used herein, a word line zone is a plurality, a group, or a collection of word lines of a block. The program circuit 600 may separate the word lines into the word line zones WLZ based on height. As used herein, higher word lines of a block are word lines that are farther away from the substrate in the z-direction, and lower word lines of a block are word lines that are closer to the substrate in the z-direction. The program circuit 600 may configure the word line zones WLZ so that there is no overlap in height of the word lines between the word line zones WLZ. That is, all of the word lines of one word line zone are higher than all of the word lines of another word line zone, or all of the word lines of one word line zone are lower than all of the word lines of another word line zone.

In the example configuration shown in FIG. 15, the program circuit 600 separates the block 1502 into two word line zones, including an upper word line zone WLZ(U) and a lower word line zone WLZ(L). All of the word lines of the upper word line zone WLZ(U) are higher than all of the word lines of the lower word line zone WLZ(U). Other configurations that include more than two word line zones WLZ may be possible.

In addition, in the example configuration shown in FIG. 15, the program circuit 600 arranges the word line zones WLZ so that each of the word line zones has the same N-number of word lines, extending from a first word line WL(1) to an Nth word line WL(N). Accordingly, the block 1502 as a whole includes 2*N word lines.

Within or for each word line zone WLZ, the first word line WLL(1) is the lowest word line of the word line zone (the word line of the word line zone that is closest to the substrate), and the Nth word line WLL(N) is the highest word line of the word line zone (the word line of the word line zone that is farthest from the substrate). Viewing the block 1502 as a whole, the first word line WLL(1) of the lower word line zone WLZ(L) is the lowest word line of the block 1502, and the Nth word line WLL(N) of the upper word line zone WLZ(U) is the highest word line of the block 1502.

To program data into the block 1502, the program circuit 600 is configured to program the data according to a sequence of sets of program operations. The program circuit 600 is configured to perform each set of program operations for one of a plurality of sets of word lines. The word lines of a given word line set are located in or part of different word line zones WLZ. Accordingly, for the two word line zone configuration in FIG. 15, the program circuit 600 is configured to perform a set or program operations for a set of word lines that includes a word line in the upper word line zone WLZ(U) and a word line in the lower word line zone WLZ(L).

In particular example configurations, the program circuit 600 is configured to perform a set of program operations to program a set of word lines according to the method 1400 described with reference to FIG. 14. The program controller 622 identifies a set of word lines of the block 1502 that includes a word line in the upper word line zone WLZ(U) and a word line in the lower word line zones WLZ(L), and performs the program operations with interleaved program-verify loops, in accordance with the interleaved program-verify loops described with reference to FIGS. 12-14. After the program circuit 600 finishes performing a set of program operations to program memory cells of a set of word lines of the block 1502, the program controller 622 identifies a next set of word lines of the block 1502, and programs data into memory cells coupled to the next set of word lines by performing a next set of program operations with interleaved program-verify loops. The program circuit 600 may proceed in this manner until all of the memory cells of the block 1502 coupled to the different sets of word lines are sufficiently programmed.

In particular example configurations, such as the one shown in FIG. 15, the program controller 622 is configured to identify a next set of word lines for performance of a next set of program operations with interleaved program-verify loops by identifying or selecting a next higher word line in the upper word line zone WLZ(U) and a next lower word line in the lower word line zone WLZ(L). To start the sequence of sets of program operations, the program circuit 600 may perform a first or initial set of program operations to program memory cells coupled to a first word line set that includes the lowest word line WLL(1) of the upper word line zone WLZ(U) and the highest word line WLL(N) of the lower word line zone WLZ(L). After programming the memory cells coupled to the first word line set with interleaved program-verify loops, the program controller 622 may identify a next higher word line in the upper word line zone WLZ(U) and a next lower word line in the lower word line zone WLZ(L) for performance of a next or second set of program operations, which is the second word line WLL(2) in the upper word line zone WLZ(U) and the (N−1)th word line in the lower word line zone WLZ(L). The program controller 622 may identify the word lines of next word line sets in this manner though a last set of program operations, for which it identifies the highest word line WLL(N) of the upper word line zone WLZ(U) and the lowest word line WLL(1) of the lower word line zone WLZ(L) as the last set of word lines.

Referring to FIGS. 16-18 and the second type of interleaved program-verify loop, FIG. 16 shows an exploded perspective view of at least a portion of a block 1600, which may be representative of at least a portion a block of the memory cell structure 142 of FIG. 2B, at least a portion of one of the blocks BLK in FIG. 3A, 3B, or 4A, have the physical construction or structure of the block 410 in FIGS. 4B, 4C, have the circuit configuration of the block 480 in FIG. 4D, be representative of at least a portion of the block 602 of FIG. 6 and/or be configured to be coupled to and/or biased by the program circuit 600 of FIG. 6. In addition, the block 1600 is shown as having the same configuration as the block 1200 of FIG. 12, including two SGD lines SGD1, SGD2, two word lines (or word line layers) WLL1, WLL2, an SGD line (or SGD layer) SGDL, and a source line SL.

The example program operation described with reference to FIGS. 16 and 17 programs the first and second word line cell groups WLCG1, WLCG2 coupled to the first word line WLL1. Accordingly, for the program operation described with reference to FIGS. 16 and 17, the first and second word line cell groups WLCG1, WLCG2 coupled to the first word lines WLL1 are selected word line cell groups WLCG1(S), WLCG2(S) of the program operation, and the first and second word line cell groups WLCG1, WLCG2 coupled to the second word line WLL2 are unselected word line groups WLCG1(U), WLCG2(U) of the program operation. FIG. 16 shows the memory cells MC coupled to the first word line WLL1 as selected memory cells MC(S), and the memory cells MC coupled to the second word line WLL2 as unselected memory cells MC(U).

In addition, in contrast to the program operation described with reference to FIGS. 12 and 13, since only the first word line WLL1 is coupled to selected memory cells MC(S), the first word line WLL1 is a selected word line WLL1(S) configured to generate a selected word line voltage $V_{WLL1(S)}$, and the second word line WLL2 is coupled to only unselected memory cells MC(U), and is therefore an unselected word line WLL2(U) configured to generate an unselected word line voltage $V_{WLL2(U)}$.

In addition, since both the first and second SGD lines SGD1, SGD2 program-enable and verify-enable selected memory cells MC(S) during the interleaved program-verify loops of the program operation, the first and second SGD lines SGD1, SGD2 are both selected SGD lines SGD1(S), SGD2(S) of the program operation, each configured to generate a respective selected SGD line voltage $V_{SGD1(S)}$, $V_{SGD2(S)}$. Additionally, FIG. 16 shows the SGD line SGDL and the source line SL configured to generate respective SGD line and source line voltages $V_{SGDL}$, $V_{SL}$.

FIG. 17 is a timing diagram of voltage waveforms of the program voltages applied to or generated on the control gate lines and the source line SL of the block 1600 during an interleaved program-verify loop to program the selected memory cells MC(S) of the selected first and second word line cell groups WLCG1(S), WLCG2(S) coupled to the selected first word line WLL1(S). The interleaved program-verify loop in FIG. 17 is shown as including two program stages, including a first program stage to program selected memory cells MC(S) of the selected first word line cell group WLCG1(S), and a second program stage to program selected memory cells MC(S) of the selected second word line cell group WLCG2(S). The first and second program stages may form a series or pair of program stages. In addition, the interleaved program-verify loop in FIG. 17 includes two verify stages, including a first verify stage to verify the selected memory cells MC(S) of the selected first word line cell group WLCG1(S), and a second verify stage to verify selected memory cells MC(S) of the selected second word line cell group WLCG2(S). The first and second verify stages may form a series of pair of verify stages.

In order to program the two sets of selected memory cells MC(S) of the different selected word line cell groups WLCG1(S), WLCG2(S), the program circuit 600 may alternatingly configure the selected SGD lines SGD1(S), SGD2(S) as selected and unselected SGD lines in order to alternatingly enable and inhibit the selected memory cells of the word line cell groups WLCG1(S), WLCG2(S). That is, to program the selected memory cells MC(S) of the first word line cell group WLCG1(S) first, and then program the selected memory cells MC(S) of the second word line cell group WLCG2(S) second, the program circuit 600 may configure the selected first SGD line SGD1(S) as a selected SGD line to program-enable the selected memory cells MC(S) of the selected first word line cell group WLCG1(S), and configure the selected second SGD line SGD2(S) as an unselected SGD line to program-inhibit the selected memory cells MC(S) of the selected second word line cell group WLCG2(S) during the first program stage. Then, during the second program stage, the program circuit 600 may configure the selected second SGD line SGD2(S) as a selected SGD line to program-enable the selected memory cells MC(S) of the selected second word line cell group WLCG2(S), and configure the selected first SGD line WLL1(S) as an unselected SGD line in order to program-inhibit the selected memory cells MC(S) of the selected first word line cell group WLCG2(S).

Accordingly, as shown in FIG. 17, during the first program stage, the control gate line voltage supply circuit 606 applies a program pulse to the selected first word line WLL1(S), while applying a selected SGD voltage at the program selected SGD level VPSSGD to the selected first SGD line SGD1 and applying an unselected SGD voltage at the program unselected SGD level VPUSGD to the selected second SGD line SGD2. In response, during the first program stage, the selected first word line WLL1(S) generates a program pulse by ramping up its word line voltage $V_{WLL1(S)}$ to the program pulse level VPGM, the selected first SGD line SGD1(S) generates its selected SGD line voltage $V_{SGD1(S)}$ at the program selected SGD level VPSSGD, and the selected second SGD line SGD2(S) generates its selected SGD line voltage $V_{SGD2(S)}$ at the program unselected SGD level VPUSGD. In turn, the selected memory cells MC(S) of the selected first word line cell group WLCG1(S) (at least those coupled to selected bit lines) will respond to the program pulse by increasing their threshold voltages, while the selected memory cells MC(S) of the selected second word line cell group WLCG2(S) (particularly those coupled to selected bit lines) are prevented from responding to the program pulse. At or toward the end of the first program stage, the selected first word line WLL1(S) may ramp down its voltage $V_{WLL1(S)}$ to an initial level to exit the first program stage and enter the second program stage.

During the second program stage, the control gate line voltage supply circuit 606 applies another or a second program pulse to the selected first word line WLL1(S), and reverses the selected and unselected voltages it applies to the selected first and second SGD lines SGD1(S), SGD2(S), applying a selected SGD line voltage at the program selected SGD level VPSSGD to the selected second SGD line SGD2(S), while applying an unselected SGD line voltage at the program unselected SGD level VPUSGD to the selected first SGD line WLL1(S). In response, during the second program stage, the selected word line WLL1(S) generates a program pulse by again ramping up its word line voltage $V_{WLL1(S)}$ to the program pulse level VPGM, the selected second SGD line SGD2(S) generates its selected SGD line voltage $V_{SGD2(S)}$ at the program selected SGD level VPSSGD, and the selected first SGD line SGD1(S) generates its selected SGD line voltage $V_{SGD1(S)}$ at the program unselected SGD level VPUSGD. In turn, the selected memory cells MC(S) of the selected second word line cell group WLCG2(S) (at least those coupled to selected bit lines) will respond to the program pulse by increasing their threshold voltages, while the selected memory cells MC(S) of the selected first word line cell group WLCG1(S) (particularly those coupled to selected bit lines) are prevented from responding to the program pulse.

In addition, as shown in FIG. 17, the unselected word lines of the block 1200, including the unselected second word line WLL2(U) generate respective unselected word line voltages $V_{WLL(U)}$ by ramping up their respective unselected word line voltage $V_{WLL(U)}$ from initial levels to the program unselected word line level VPUW (or VPASS) at the beginning of each of the first and second program stages, and then ramping down their respective unselected word line voltage $V_{WLL(U)}$ from the program unselected word line level VPUW (or VPASS) to initial levels at or toward the end of each of the first and second program stages. Also, the SGS line and the source line SL may be configured to initially ramp up their voltages to respective program levels at the start of the first program stage, and then maintain their voltages at the respective program levels over the course of the first and second program stages—i.e., without ramping down and then ramping back up to transition from the first program stage to the second program stage. In particular, the SGS line SGSL maintains its voltage $V_{SGSL}$ at the program SGS level VPSGS, and the source line SL maintains its voltage $V_{SL}$ at the program source line level VPSL over the course of the first and second program stages.

Also, the bit line voltage supply circuit 608 may apply program selected and unselected bit line voltages to selected and unselected bit lines in order to program-enable and program-inhibit the various selected memory cells during the first and second stages based on their respective program statuses. FIG. 17 shows two voltage waveforms generated over the two program stages, including a first voltage waveform (represented by a dotted line) showing the selected bit line voltage at the program selected bit line level VPSB applied to the selected bit lines, and a second voltage waveform (represented by a solid line) showing the unselected bit line voltage at the program unselected bit line level VPUB applied to the unselected bit lines. In particular example configurations, as shown in FIG. 17, the bit line voltage supply circuit 608 may ramp down the unselected bit line voltage $V_{BL(U)}$ from the program unselected bit line level VPUB to an initial level at or toward the end of the first program stage, and then ramp back up to the program unselected bit line level VPUB at the start of the second program stage. In other example configurations, the bit line voltage supply circuit 608 may maintain the unselected bit line voltage $V_{BL(U)}$ at the program unselected bit line level VPUB—i.e., without ramping down and then back up—over the course or duration of the first and second program stages.

As shown in FIG. 17, at or toward the end of the second program stage, the program circuit 600 may enter or transition into the first verify stage to verify selected memory cells of the selected first word cell group WLCG1(S). The program circuit 600 may do so by transitioning the control gate line and source line voltages to verify or sense levels.

In the example interleaved program-verify loop shown in FIG. 17, in order to verify the two sets of selected memory cells MC(S) of the different selected word line cell groups WLCG1(S), WLCG2(S) coupled to the first word line WLL1(S), the program circuit 600 may alternatingly configure the selected SGD lines SGD1(S), SGD2(S) as selected and unselected SGD lines. That is, to verify the selected memory cells MC(S) of the first word line cell group WLCG1(S) first, and then verify the selected memory cells MC(S) of the second word line cell group WLCG2(S) second, the program circuit 600 may configure the selected first SGD line SGD1(S) as a selected SGD line and configure the selected second SGD line SGD2(S) as an unselected SGD line during the first verify stage. Then, during the second verify stage, the program circuit 600 may configure the selected second SGD line SGD2(S) as a selected SGD line and the selected first SGD line SGD1(S) as an unselected SGD line.

Accordingly, as shown in FIG. 17, during the first verify stage, the control gate line voltage supply circuit 606 applies a series or sequence of verify pulses to the selected first word line WLL1(S), while applying a selected SGD voltage at the verify or sense selected SGD level VPSSGD to the selected first SGD line SGD1 and while applying an unselected SGD voltage at the verify or sense unselected SGD level VPUSGD to the selected second SGD line SGD2. In response, during the first verify stage, the selected first word line WLL1(S) generates a sequence of verify pulses by generating its word line voltage $V_{WLL1(S)}$ at a sequence of verify pulse voltage levels Vv according to a verify order associated with the first verify stage. While the selected first word line WLL1(S) is generating the sequence of verify pulses, the selected first SGD line SGD1(S) generates its SGD line voltage $V_{SGD1(S)}$ at the program selected SGD level VPSSGD (or select gate level VSG), and the selected second SGD line SGD2(S) generates its SGD line voltage $V_{SGD2(S)}$ at the verify or sense unselected SGD level VPUSGD. In turn, the selected memory cells MC(S) of the selected first word line cell group WLCG1(S) (at least those coupled to selected bit lines) are verify-enabled and the program circuit 600 senses their program statuses, while the selected memory cells MC(S) of the selected second word line cell group WLCG2(S) (particularly those coupled to selected bit lines) are verify-inhibited and prevented from having their program statuses verified.

During the second verify stage, the control gate line voltage supply circuit 606 reverses the selected and unselected voltages it applies to the selected first and second SGD lines SGD1(S), SGD2(S). Accordingly, during the second verify stage, the control gate line voltage supply circuit 606 applies another series or sequence of verify pulses to the selected first word line WLL1(S), while applying a selected SGD voltage at the verify or sense selected SGD level VPSSGD to the selected second SGD line SGD2 and while applying an unselected SGD voltage at the verify or sense unselected SGD level VPUSGD to the selected first SGD line SGD1. In response, during the second verify stage, the selected first word line WLL1(S) generates another sequence of verify pulses by generating its word line voltage $V_{WLL1(S)}$ at a sequence of verify pulse voltage levels Vv according to a verify order associated with the second verify stage. While the selected first word line WLL1(S) is generating the sequence of verify pulses, the selected second SGD line SGD2(S) generates its SGD line voltage $V_{SGD2(S)}$ at the program selected SGD level VPSSGD (or select gate level VSG), and the selected first SGD line SGD1(S) generates its SGD line voltage $V_{SGD1(S)}$ at the verify or sense unselected SGD level VPUSGD. In turn, the selected memory cells MC(S) of the selected second word line cell group WLCG2(S) (at least those coupled to selected bit lines) are verify-enabled and the program circuit 600 senses their program statuses, while the selected memory cells MC(S) of the selected first word line cell group WLCG1(S) (particularly those coupled to selected bit lines) are verify-inhibited and prevented from having their program statuses verified.

As shown in FIG. 17, in order to perform the first and second verify stages, the control gate line voltage supply circuit 606 applies the verify pulses to the selected word lines WLL1(S), WLL2(S) in consecutive ascending and descending verify orders. As used herein, an ascending verify order is a verify order that identifies increasingly higher memory states. As previously described, a first memory state is higher than a second memory state where the first memory state is associated with a higher threshold voltage range than the threshold voltage range with which the second memory state is associated. To perform a verify stage according to an ascending verify order, each next verify sub-stage that the program circuit 600 is to perform next in the verify stage is associated with a higher memory state and/or lower threshold voltage range than the memory state and/or threshold voltage range associated with the current verify sub-stage the program circuit 600 is currently performing.

In addition, an ascending verify order and a descending verify order are reverse verify orders of each other. As used herein, reverse verify orders are verify orders that identify orders of memory states in opposite directions. An ascending verify order identifies a progression of verify sub-stages associated with progressively higher memory states and/or associated threshold voltage ranges, whereas a descending verify order identifies a progression of verify sub-stages associated with progressively lower memory states and/or associated threshold voltage ranges. Since the progressively higher and the progressively lower memory states correspond to opposite high and low directions of memory states, ascending and descending verify orders are reverse verify orders. A verify control circuit that consecutively performs verify stages in reverse verify orders can execute the consecutive verify stages by first performing a verify stage according to an ascending verify order followed by a second verify stage according to a descending verify order, or by first performing a verify stage according to a descending verify order followed by a second verify stage according to an ascending verify order.

Similar to the example interleaved program-verify loop described with reference to FIG. 13, the example interleaved program-verify loop depicted in FIG. 17 is performed to verify memory cells programmed to store two bits-per-cell—i.e., each selected memory cell may have the erase state, memory state A, memory state B, or memory state C as its target memory state. Accordingly, the program circuit 600 may perform a verify stage according to an ascending verify order under a two bits-per-cell storage scheme by performing a first verify sub-stage for memory state A, then performing a second verify sub-stage for memory state B, and then performing a third verify sub-stage for memory state C.

Accordingly, to perform the first and second verify stages according to consecutive ascending and descending verify orders, the control gate line voltage supply circuit 606 applies the sequence of verify pulses according to an ascending verify order so that the selected first word line WLL1(S) generates its selected word line voltage $V_{WLL1(S)}$ at sequentially increasing verify pulse levels during the first verify stage. Then, during the second verify stage, the control gate line voltage supply circuit 606 applies the sequence of verify pulses according to a descending verify order so that the selected first word line WLL1(S) generates its selected word line voltage $V_{WLL1(S)}$ at sequentially decreasing verify pulse levels. However, in other example embodiments, the program circuit 600 may perform the second verify order according to an ascending verify order, in which the control gate line voltage supply circuit 606 applies the sequence of verify pules according to the ascending verify order.

Under the two bits-per-cell storage scheme illustrated in FIG. 17, the control gate line voltage supply circuit 606 supplies the verify pulses to the selected first word line WLL1(S) so that the selected first word line WLL1(S) generates its selected word line voltage $V_{WLL1(S)}$ at sequentially increasing verify pulse levels VvA, VvB, and VvC during each of the corresponding three verify sub-stages for memory states A, B, and C of the first verify stage. Then, during the second verify stage, the control gate line voltage supply circuit 606 supplies the verify pulses to the selected first word line WLL1(S) so that the selected first word line WLL1(S) generates its selected word line voltage $V_{WLL1(S)}$ at sequentially decreasing verify pulse levels VvC, VvB, and VvA during each of the corresponding three verify sub-stages for memory states C, B, and A of the second verify stage.

Performing the first and second verify stages according to consecutive ascending and descending verify orders may be more efficient than performing it according to consecutive ascending verify orders because the word line voltage $V_{WLL1(S)}$ of the selected first word line WLL1(S) is already at an initial voltage level (e.g., the ground reference voltage level 0 V) at the start of the first verify stage. As such, the control gate line voltage supply circuit 606, and in turn the selected first word line level WLL1(S), can transition the selected word line voltage $V_{WLL1(S)}$ on the selected first word line WLL1(S) from the initial level to the lowest verify pulse level—in this example the verify pulse level VvA associated with memory state A—faster than it can transition the selected word line voltage $V_{WLL1(S)}$ from the initial level age level of 0 V) to any of the other verify pulse levels higher than the lowest verify pulse level—e.g., verify pulse levels VvB or VvC for two bits-per-cell storage schemes.

Similarly, performing the second verify stage according to a descending verify order may be more efficient than performing it according to an ascending verify order because the word line voltage $V_{WLL1(S)}$ of the selected first word line WLL1(S) is already at the verify pulse level VvC associated with memory state C at the end of the first verify stage. As such, the control gate line voltage supply circuit 606, and in turn the selected first word line level WLL1(S) can keep the selected word line voltage $V_{WLL1(S)}$ on the selected first word line WLL1(S) at the verify pulse level VvC associated with memory state C to start the second verify stage, and so can start the initial verify sub-stage of the second verify stage faster than if the control gate line voltage supply circuit 606 transitioned the selected word line voltage $V_{WLL1(S)}$ to a different verify pulse level—e.g., verify pulse levels VvA or VvB for two bits-per-cell storage schemes.

In addition, except for the selected word line WLL1(S) and the selected first and second SGD lines SGD1(S), SGD2(S), the other control gate lines and the source line SL may be configured to initially ramp up their voltages to respective verify or sense levels at the start of the first verify stage, and then maintain their voltages at their respective verify or sense levels over the course of the first and second verify stages—i.e., without ramping down and then ramping back up to transition from the first verify stage to the second verify stage. In particular, the unselected word lines of the block (including the second word line WLL2(U) in FIG. 16) maintain their respective unselected word line voltages $V_{WLL(U)}$ at the verify or sense unselected word line level VSUW (or VREAD), the SGS line SGSL maintains its voltage $V_{SGSL}$ at the sense SGS level VSSGS, and the source line SL maintains its voltage $V_{SL}$ at the sense source line level VPSL over the course of the first and second verify stages.

Also, for some example configurations, as shown in FIG. 17, the bit line voltage supply circuit 608 may apply the selected bit line voltages at the verify or sense selected bit line level VSSB (or VBLC) to all of the bit lines coupled to selected memory cells of the block. To illustrate in FIG. 17, the two voltage waveforms depicting the selected and unselected bit line voltages merge at the start of the first verify stage into a single voltage waveform at the sense selected bit line level VSSB. Accordingly, at the start of the first verify stage, the bit line voltage supply circuit 608 ramps up the selected bit line voltage from an initial level to the sense selected bit line level VSSB, and applies the selected bit line voltage at the sense selected bit line level VSSB to the bit lines BL. The bit line voltage supply circuit 608 maintains the selected bit line voltage at the sense selected bit line level VSSB over the course or duration of the first and second verify stages, i.e., without ramping the bit line voltage down and then back up when transitioning between the first and second verify stages.

At the end of the second verify stage, the voltage supply circuit 604 may ramp down the control gate line and supply line voltages from their verify or sense levels to initial levels. The program circuit 600 may then transition to a next interleaved program-verify loop, assuming that there are still insufficiently programmed memory cells that need to be programmed.

FIG. 18 shows a flow chart of an example method 1800 of programming memory cells coupled to a word line according to interleaved program-verify loops. At block 1802, the program controller 622 may identify a word line of a block in which to program data. The program controller 622 may identify the word lines as selected word line for a program operation with interleaved program-verify loops, similar to the first word line WLL1(S) being a selected word line for the program operation described with reference to FIGS. 16 and 17.

At block 1804, the program controller 622 may identify a set of unprogrammed word line cell groups to program in a program operation. The set of unprogrammed word line cell groups may be coupled to the word line that the program controller 622 identified at block 1802. The program controller 622 may identify those word line cell groups that it identifies in block 1804 has selected word line cell groups of the program operation.

At block 1806, the program circuit 600 may perform the program operation to program the set of selected word line cell groups by performing interleaved program-verify loops, in accordance with the interleaved program-verify loops described with reference to FIGS. 16 and 17. After the program circuit 600 has sufficiently programmed the memory cells of the set of selected word line cell groups at block 1806, the program controller 622 may determine whether there are any other sets of unprogrammed word line cell groups coupled to the selected word line. Another set of unprogrammed word line cell groups may be part of different sub-blocks of the block. If the program controller 622 determines that there is another set of unprogrammed word line cell groups coupled to the selected word line, then the method 1800 may proceed back to block 1806, where the program circuit 600 performs another program operation to program the set of unprogrammed word line cell groups that the program controller 622 identified at block 1806. Alternatively, if the program controller 622 does not determine that there is another set of unprogrammed word line cell groups coupled to the set of word lines, then the program method 1800 may end.

The program circuit 600 may program a block according to the interleaved program-verify loops described with reference to FIGS. 16-18 in any of various ways. For at least some example configurations, the program circuit 600 programs memory cells one word line at a time. That is, where the program circuit 600 is programming word line cell groups coupled to a first word line of a block, the program circuit 600 does not program word line cell groups coupled to a different word line until it has programmed all of the word line cell groups of the first word line. To illustrate, suppose each word line is coupled to four word line cell groups, and further suppose that the program circuit 600 performs a program operation on two word line cell groups. Accordingly, the program circuit 600 performs two program operations with interleaved program-verify loops to program the four word line cell groups coupled to a word line. The program circuit 600 does not transition from programming memory cells coupled to a current word line to programming memory cells coupled to a next word line until it has performed two program operations with interleaved program-verify loops to program the four word line cell groups coupled to the current word line.

In addition, the program circuit 600 may program a block according to the interleaved program-verify loops described with reference to FIGS. 16-18, and further in accordance with a word line sequence or order that identifies a sequence or order in which to program memory cells of the block. In particular example configurations, the word line order incrementally increases in word line height, starting from the lowest word line of the block and ending with the highest word line of the block.

Regardless of whether the interleaved program-verify loop of FIGS. 12-14 (memory cell sets on separate word lines but in a common sub-block), or the embodiment of FIGS. 16-18 (memory cell sets on the same word line but in different sub-blocks), a delay may be achieved between program stages and verify stages of each memory cell set, without introducing a delay in the overall execution of the program-verify loops of the combined memory cell sets. At the conclusion of the second verify stage, in either embodiment, the interleaved program-verify loop performed to program and verify the two sets of memory cells will have introduced a delay between the first program stage and the first verify stage for the first set of memory cells with the intervening second program stage of the second set of memory cells. A delay between the second program stage and second verify stage for the second set of memory cells will have also been achieved by the intervening first verify stage on the first set of memory cells. The delays between program stages and verify stages, and by extension between verify stages of a prior program-verify loop and a subsequent program stage of a next program-verify loop, for the different sets of memory cells may provide for improved short term data retention (STDR), for example by potentially tightening up the threshold voltage distribution for the different memory states in the cells and lowering bit error rates, along with potentially improving the charge distribution between the Erase state Er and the adjacent first program state (e.g. memory state A).

A means for determining a sequence for interleaving two program-verify loops, in various embodiments, may include the control logic circuit 154, the program circuit 600, the program controller 622, the interleave control circuit 630, or the like. Other embodiments may include similar or equivalent means for determining a sequence for interleaving two program-verify loops.

A means for applying a first program pulse to a first memory cell of a block according to a sequence, in various embodiments, may include the power control circuit 160 through control by the control logic circuit 154, the program circuit 600, the program controller 622, the program control circuit 624, the control gate line voltage supply circuit 606 through control by the program controller 622 and/or the program control circuit 624, or the like. Other embodiments may include similar or equivalent means for applying a first program pulse to a first memory cell of a block according to a sequence.

A means for applying a second program pulse to a second memory cell of the block after application of the first program pulse and before application of the verify pulse, in various embodiments, may include the power control circuit 160 through control by the control logic circuit 154, the program circuit 600, the program controller 622, the program control circuit 624, the control gate line voltage supply circuit 606 through control by the program controller 622 and/or the program control circuit 624, or the like.

A means for applying a verify pulse to the first memory cell after application of the second program pulse, in various embodiments, may include the power control circuit 160 through control by the control logic circuit 154, the program circuit 600, the program controller 622, the program control circuit 624, the control gate line voltage supply circuit 606 through control by the program controller 622 and/or the program control circuit 624, or the like.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:
1. A system comprising:
a block comprising a plurality of word lines configured to bias a plurality of memory cells; and
a program controller, to perform an interleaved program-verify loop, configured to control a voltage supply circuit to:

consecutively supply a first program pulse to program a first set of memory cells of the block and supply a second program pulse to a second set of memory cells of the block; and consecutively supply a first sequence of verify pulses in one of an ascending verify order and a descending verify order to the first set of memory cells, and a second sequence of verify pulses in one of an ascending verify order and a descending verify order to the second set of memory cells.

2. The system of claim 1, wherein the first set of memory cells and the second set of memory cells are each coupled to different word lines of the block, and the program controller is configured to control the voltage supply circuit to supply the first sequence of verify pulses according to the descending verify order.

3. The system of claim 2, wherein the program controller is further configured to:

separate the block into an upper word line zone and a lower word line zone; and select a next higher word line in the upper word line zone and a next lower word line in the lower word line zone to perform a next set of program operations with interleaved program-verify loops.

4. The system of claim 1, wherein the first set of memory cells and the second set of memory cells are coupled to a same word line of the block, and the program controller is configured to control the voltage supply circuit to supply the first sequence of verify pulses according to the ascending verify order.

5. The system of claim 4, wherein to program the block, the program controller is configured to program all word line cell groups coupled to one word line according to interleaved program-verify loops before programming word line cell groups coupled to another word line according to interleaved program-verify loops.

6. A method comprising:

applying, with a program control circuit, a first program pulse to program a first set of memory cells of a block;

determining, with an interleave control circuit, a first delay period in which to delay applying a first sequence of verify pulses to verify the first set of memory cells;

during the first delay period, applying, with the program control circuit, a second program pulse to program a second set of memory cells of the block;

determining, with the interleave control circuit, a second delay period in which to delay applying a second sequence of verify pulses to verify the second set of memory cells; and during the second delay period, applying, with a verify control circuit, the first sequence of verify pulses to verify the first set of memory cells.

7. The method of claim 6, further comprising applying, with the verify control circuit, the second sequence of verify pulses to verify the second set of memory cells after applying the first sequence of verify pulses.

8. The method of claim 6, wherein the first set of memory cells and the second set of memory cells are coupled to different word lines of the block.

9. The method of claim 8, wherein the first sequence of verify pulses applied to verify the first set of memory cells, and the second sequence of verify pulses applied to verify the second set of memory cells, both include sequentially decreasing verify pulse levels.

10. The method of claim 8, further comprising maintaining a constant drain select gate line voltage on a selected drain select gate line during the applying the first sequence of verify pulses and the applying the second sequence of verify pulses.

11. The method of claim 6, wherein the first set of memory cells and the second set of memory cells are coupled to a same word line in the block.

12. The method of claim 11, wherein the first sequence of verify pulses applied to verify the first set of memory cells include sequentially increasing verify pulse levels, and the second sequence of verify pulses applied to verify the second set of memory cells include sequentially decreasing verify pulse levels.

13. The method of claim 6, wherein:

the applying the first program pulse to program the first set of memory cells of the block, and the applying the second program pulse to program the second set of memory cells of the block, are performed consecutively with the program control circuit; and the applying the first sequence of verify pulses to verify the first set of memory cells, and the applying the second sequence of verify pulses to verify the second set of memory cells, are performed consecutively with the verify control circuit.

* * * * *